(12) United States Patent
Kando et al.

(10) Patent No.: US 9,748,923 B2
(45) Date of Patent: Aug. 29, 2017

(54) ELASTIC WAVE DEVICE AND MANUFACTURING METHOD FOR SAME

(71) Applicant: Murata Manufacturing Co., Ltd., Nagaokakyo-shi, Kyoto-fu (JP)

(72) Inventors: Hajime Kando, Nagaokakyo (JP); Syunsuke Kido, Nagaokakyo (JP); Keiji Okada, Nagaokakyo (JP); Munehisa Watanabe, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 932 days.

(21) Appl. No.: 13/900,743

(22) Filed: May 23, 2013

(65) Prior Publication Data

US 2014/0152145 A1    Jun. 5, 2014

Related U.S. Application Data

(63) Continuation of application No. PCT/JP2011/077335, filed on Nov. 28, 2011.

(30) Foreign Application Priority Data

Nov. 30, 2010    (JP) ................................ 2010-266538

(51) Int. Cl.
*H03H 9/02*    (2006.01)
*H03H 9/25*    (2006.01)
(Continued)

(52) U.S. Cl.
CPC ............... *H03H 9/25* (2013.01); *H03H 3/02* (2013.01); *H03H 9/02228* (2013.01);
(Continued)

(58) Field of Classification Search
CPC ........... H03H 9/02535; H03H 9/02543; H03H 9/02559
(Continued)

(56) References Cited

U.S. PATENT DOCUMENTS

| 7,737,603 B2 * | 6/2010 | Kando | ................. H03H 9/0222 310/313 A |
| 2007/0052324 A1 * | 3/2007 | Chen | ........................ H03H 3/08 310/313 R |

(Continued)

FOREIGN PATENT DOCUMENTS

| JP | 2002-368576 A | 12/2002 |
| JP | 2010-56736 A | 3/2010 |

(Continued)

OTHER PUBLICATIONS

Official Communication issued in International Patent Application No. PCT/JP2011/077335, mailed on Jan. 24, 2012.

(Continued)

*Primary Examiner* — Derek Rosenau
(74) *Attorney, Agent, or Firm* — Keating & Bennett, LLP

(57) ABSTRACT

An elastic wave device includes a support layer with a through-hole or a recess opened at an upper surface thereof, a piezoelectric thin film arranged on the support layer to extend above the recess or the through-hole of the support layer, and an IDT electrode defined on at least one of upper and lower surfaces of the piezoelectric thin film in a region of the piezoelectric thin film, the region extending above the recess, or the through-hole. A secondary mode of a plate wave, which contains a U1 component as a main component, is utilized. The piezoelectric thin film is made of $LiTaO_3$, and Euler angles ($\varphi$, $\theta$, $\psi$) of the $LiTaO_3$ fall within specific ranges.

19 Claims, 56 Drawing Sheets

(51) Int. Cl.
 H03H 3/02 (2006.01)
 H03H 3/08 (2006.01)
(52) U.S. Cl.
 CPC .... H03H 9/02559 (2013.01); H03H 9/02574 (2013.01); H03H 9/02834 (2013.01); H03H 3/08 (2013.01); Y10T 29/42 (2015.01)
(58) Field of Classification Search
 USPC ...... 310/313 R, 313 A, 313 B, 313 C, 313 D
 See application file for complete search history.

(56) References Cited

U.S. PATENT DOCUMENTS

| | | | | |
|---|---|---|---|---|
| 2009/0189483 | A1* | 7/2009 | Kadota | H03H 3/08 310/313 B |
| 2010/0038991 | A1* | 2/2010 | Shih | H03H 9/02574 310/313 B |
| 2010/0052472 | A1 | 3/2010 | Nishino et al. | |
| 2010/0237742 | A1* | 9/2010 | Tanaka | H03H 9/14538 310/313 D |
| 2011/0037344 | A1* | 2/2011 | Yamane | H03H 9/0222 310/313 C |
| 2011/0266918 | A1 | 11/2011 | Iwamoto et al. | |

FOREIGN PATENT DOCUMENTS

| | | |
|---|---|---|
| JP | 2010-220204 A | 9/2010 |
| WO | 2010/082571 A1 | 7/2010 |

OTHER PUBLICATIONS

Mizutani et al.,"Analysis of Lamb Wave Propagation Characteristics in Rotated Y-Cut X-Propagation LiNbO3 Plates", vol. J68-A, No. 5, pp. 496-503, May 1985.

* cited by examiner

ELASTIC WAVE DEVICE AND MANUFACTURING METHOD FOR SAME

BACKGROUND OF THE INVENTION

1. Field of the Invention

The present invention relates to an elastic wave device including a piezoelectric thin film, and to a manufacturing method for the elastic wave device. More particularly, the present invention relates to an elastic wave device using a higher-order mode of a plate wave called a Lamb wave, and to a manufacturing method for the elastic wave device.

2. Description of the Related Art

Recently, an elastic wave device using a piezoelectric thin film has been proposed with the development of, e.g., communication apparatuses operating at higher frequencies. For realizing operation at a higher frequency, it is required to increase the acoustic velocity of an elastic wave in a piezoelectric substrate. From that point of view, attention is focused on an elastic wave device using a plate wave with a high acoustic velocity.

The term "plate wave" means an elastic wave propagating through a medium sandwiched between two free boundary surfaces. As described in Mizutani, Toda: "Analysis of Lamb-wave Propagation Characteristics in Rotated Y Cut X-SAW-Propagation $LiNbO_3$ Flat Plate", The IEICE Transactions A, J68-A, 5, pp. 496-503(1985-05), which is hereinafter referred to as "Mizutani", an SH (Shear Horizontal) wave and a Lamb wave are known as examples of the plate wave. As further described in Mizutani, the SH wave is a wave containing mainly a U2 component, while the Lamb wave contains mainly U1 and U3 components. A piezoelectric single crystal is an anisotropic crystal. Therefore, the plate wave propagating in the piezoelectric single crystal contains the U1 and U3 components to some extent although it is the SH wave. Similarly, although the Lamb wave contains mainly the U1 or U3 component, it contains the U2 component as well to some extent.

When the plate wave is oscillated, the U1, U2 and U3 components propagate in any mode. In addition, higher-order modes in which displacement of the main component has a plurality of nodes in the direction of thickness also propagate. Assuming that the lowest-order mode without including nodes is a basic mode, the higher-order modes can be discriminated as a secondary mode, a tertiary mode, etc. in ascending order.

On the other hand, Japanese Unexamined Patent Application Publication No. 2002-368576, discloses an elastic wave device using a piezoelectric thin film and utilizing a Lamb wave. In an embodiment described in Japanese Unexamined Patent Application Publication No. 2002-368576, the piezoelectric thin film is made of $LiTaO_3$, and Euler angles of the $LiTaO_3$ are (0°, 126°±20°, 0°). In the embodiment of Japanese Unexamined Patent Application Publication No. 2002-368576, the acoustic velocity of the propagating plate wave is about 3300 m/sec to 4100 m/sec.

As mentioned above, the higher acoustic velocity of the elastic wave is strongly demanded from the viewpoint of realizing the operation at a higher frequency. In the elastic wave device, described in Japanese Unexamined Patent Application Publication No. 2002-368576, utilizing the plate wave, the acoustic velocity is about 3300 m/sec to 4100 m/sec, and it is not sufficiently high. Therefore, when constructing an elastic wave device used in a high-frequency band, i.e., in a band of about 4 GHz, an electrode finger width of an IDT (interdigital transducer) electrode has to be set to about 0.2μm. This causes the problem that a very high level of processing accuracy is required to form the IDT electrode. Another problem is that, because the electrode finger width is very narrow, wiring resistance may deteriorate, or an electric power handling capability may decrease.

SUMMARY OF THE INVENTION

Preferred embodiments of the present invention provide an elastic wave device, which utilizes a plate wave, exhibits a higher acoustic velocity, and undergoes a smaller influence in response to spurious interference caused by modes other than those used.

The elastic wave device according to a preferred embodiment of the present invention includes a support layer including a through-hole or a recess opened at an upper surface thereof, a piezoelectric thin film arranged on the support layer to be partly positioned above the recess or the through-hole of the support layer, and an IDT electrode defined on at least one of upper and lower surfaces of the piezoelectric thin film in a region of the piezoelectric thin film, the region extending above the recess or the through-hole. The elastic wave device of a preferred embodiment of the present invention utilizes a secondary mode of a plate wave, which contains a U1 component as a main component of displacement. In a preferred embodiment of the present invention, the piezoelectric thin film is made of $LiTaO_3$, and Euler angles (φ, θ, ψ) of the $LiTaO_3$ fall within specific ranges, where φ is in a range of about 0° to about 30° and θ is in a range of about 0° to about 55° or a range of about 140° to about 180°; when θ is in a range of about 0° to about 55°, ψ is in a range of about 180° to about 110°, a range of about 100° to about 50°, or a range of about 40° to about 0°; and when θ is in a range of about 140° to about 180°, ψ is in a range of about 180° to about 20°, or a range of about 10° to about 0°.

In one particular preferred embodiment of an elastic wave device according to the present invention, the IDT electrode is made of Al or an alloy containing Al as a main component, and assuming a film thickness of the IDT electrode to be H, H≥0.08λ is satisfied. In the formula, λ is a wavelength of the secondary mode of the plate wave, which is utilized here. When the IDT electrode is made of Al or an alloy containing Al as a main component, electrical resistance of the electrode can be reduced. Accordingly, resonance characteristics and filter characteristics of the elastic wave device can be improved. Furthermore, when the film thickness H is about 0.08λ or less, the electromechanical coupling coefficient $k^2$ of the utilized secondary mode can be further increased to about 6% or more, for example.

In another particular preferred embodiment of an elastic wave device according to the present invention, the elastic wave device further includes a dielectric film laminated on at least one of the upper and lower surfaces of the piezoelectric thin film. A coefficient of linear expansion of the dielectric film is smaller than a coefficient of linear expansion of $LiTaO_3$. In this case, temperature characteristics of the elastic wave device can be improved.

In particular, the dielectric film is preferably made of silicon oxide. In this case, an absolute value of the temperature coefficient of resonant frequency TCF can be reduced. Hence the temperature characteristics can be more effectively improved.

In still another particular preferred embodiment of an elastic wave device according to the present invention, the IDT electrode is defined on the upper surface of the piezoelectric thin film, and the dielectric film is defined on the lower surface of the piezoelectric thin film. Furthermore, the dielectric film is arranged such that stress in a tensile direction is applied to the piezoelectric thin film made of LiTaO$_3$. In this case, since the dielectric film applies the stress in the tensile direction to the piezoelectric thin film, the piezoelectric thin film is brought into a convex shape on the side where the IDT electrode is formed. As a result, propagation properties of the secondary mode of the plate wave are less apt to be impaired.

In still another particular preferred embodiment of an elastic wave device according to the present invention, electrical resistance between the paired IDT electrodes is equal to or more than about 50 times terminal impedance of an electric circuit to which the elastic wave device is connected, and equal to or less than about 1 MΩ. In this case, degradation of electric characteristics, such as resonance characteristics and filter characteristics, can be significantly reduced or prevented. Moreover, pyroelectric breakdown can be effectively reduced or prevented.

In still another particular preferred embodiment of an elastic wave device according to the present invention, a thickness of the piezoelectric thin film is in a range of equal to or more than about 50 nm and equal to or less than about 0.3λ, for example. By setting the thickness of the piezoelectric thin film to be equal to or more than about 50 nm, the piezoelectric thin film can be stably formed. When the thickness of the piezoelectric thin film is equal to or less than about 0.3λ, the acoustic velocity of the secondary mode of the plate wave, which contains the U1 component as the main component of displacement, can be sufficiently increased.

In the elastic wave device according to a preferred embodiment of the present invention, a plurality of elastic wave devices, each according to a preferred embodiment of the present invention, may be combined with each other. Preferably, a propagation azimuth ψ in at least one of the plural elastic wave devices is made different from a propagation azimuth ψ in at least one of the remaining plural elastic wave devices. In this case, the electromechanical coupling coefficient k$^2$ in at least one elastic wave element can be independently set. Therefore, the degree of freedom in design of the entire elastic wave device, including the plural elastic wave devices combined with each other, can be increased.

A manufacturing method for the elastic wave device, according to a preferred embodiment of the present invention, includes the steps of injecting ions into a LiTaO$_3$ substrate from a surface thereof, thus forming an ion-injected portion on one surface side of the LiTaO$_3$ substrate, forming a sacrificial layer in a portion of the surface of the LiTaO$_3$ substrate on the ion-injected side, forming, as a support layer, an insulator to cover the surface of the LiTaO$_3$ substrate on the ion-injected side and the sacrificial layer, separating the LiTaO$_3$ substrate at the ion-injected portion by heating, thus forming a structure of a piezoelectric thin film separated from the LiTaO$_3$ substrate, causing the sacrificial layer to disappear, thus forming a recess in the support layer at a position under the piezoelectric thin film, and forming an IDT electrode on at least one of upper and lower surfaces of the piezoelectric thin film.

With the elastic wave device according to a preferred embodiment of the present invention, in the elastic wave device having the structure where a space defined by the recess or the through-hole is located under the piezoelectric thin film, since the Euler angles of the piezoelectric thin film made of LiTaO$_3$ fall within the above-described particular ranges, the secondary mode of the plate wave, which contains the U1 component as the main component of displacement, is allowed to propagate efficiently. The propagation velocity of the secondary mode of the plate wave, which contains the U1 component as the main component of displacement, is high, i.e., about 7000 m/sec or more. It is hence possible to easily realize an elastic wave device having a smaller size and operating at a higher frequency than in the related-art elastic wave device.

Furthermore, since a power flow angle PFA of the secondary mode as a main mode is small, electrode design of the elastic wave device can be facilitated. In addition, since the electromechanical coupling coefficients k$^2$ of other propagation modes becoming spurious interference with respect to the main mode can be reduced, the spurious interference is less apt to occur on the resonance characteristic or the filter characteristics.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7I is a schematic elevational cross-sectional view of the elastic wave device according to a modification of a preferred embodiment of the present invention.

DETAILED DESCRIPTION OF THE PREFERRED EMBODIMENTS

The present invention will be clarified by explaining concrete preferred embodiments of the present invention below with reference to the drawings.

Figure 1A:
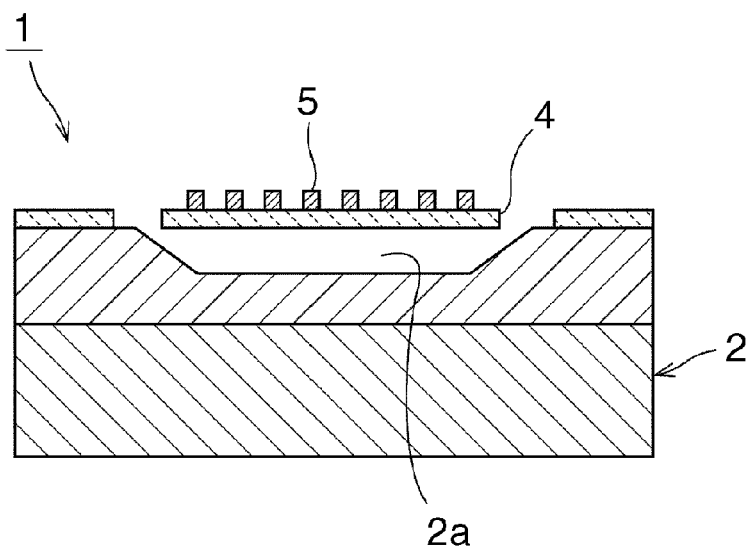
FIG. 1A is an elevational cross-sectional view of a principal portion of an elastic wave device according to a first preferred embodiment of the present invention.
Figure 1B:
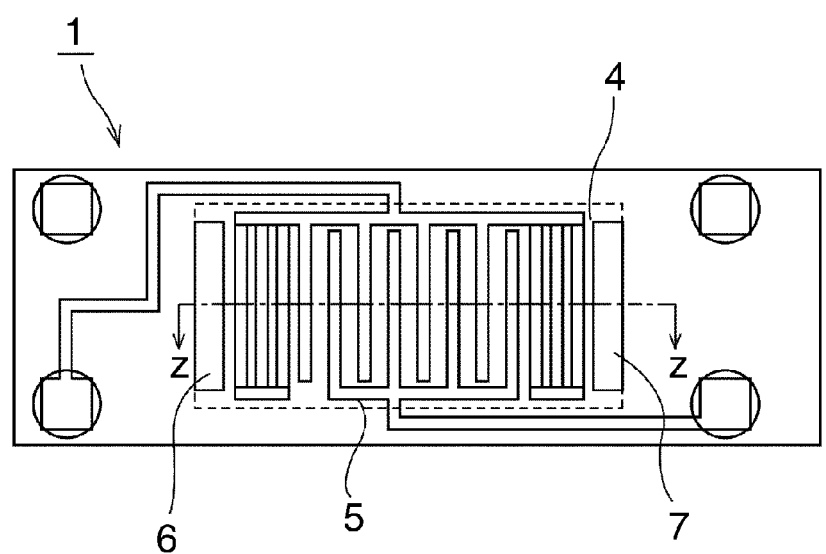
FIG. 1B is a schematic plan view thereof.

FIG. 1A is a schematic elevational cross-sectional view of a principal portion of an elastic wave device according to a first preferred embodiment of the present invention, the view illustrating a cross-section taken along a line Z-Z in FIG. 1B, and FIG. 1B is a plan view thereof.

An elastic wave device 1 includes a support layer 2. The support layer 2 includes a recess 2a opened upwards. A piezoelectric thin film 4 is laminated such that a portion of the piezoelectric thin film 4 is positioned above the recess 2a. In this preferred embodiment, the piezoelectric thin film 4 preferably is made of LiTaO$_3$. An IDT electrode 5 is provided on the piezoelectric thin film 4.

In this preferred embodiment, an elastic wave resonator including the IDT electrode 5 on the piezoelectric thin film 4 is provided as illustrated in FIG. 1B. The recess 2a has a shape depicted by a dotted line in FIG. 1B when seen in a plan view. Openings 6 and 7, illustrated in FIG. 1B, are preferably defined by partly cutting out the piezoelectric thin film 4 as illustrated in FIG. 1A. Accordingly, a space defined by the recess 2a is arranged under a portion of the piezoelectric thin film 4, the portion being sandwiched between the openings 6 and 7. Thus, the elastic wave device 1 according to a preferred embodiment of the present invention is an elastic wave device of the type having the space under the piezoelectric thin film 4.

The support layer 2 can preferably be made of an appropriate dielectric, such as, for example, silicon oxide, aluminum nitride, or alumina, or of a high-resistance Si wafer. $LiTaO_3$ has a negative temperature coefficient of resonant frequency TCF.

The IDT electrode 5 can preferably be made using an appropriate metal, such as, for example, Al, Cu, Ag, Pt, Ti, Fe, Mo, Ta, W, Cr or Ni, or an alloy thereof. In this preferred embodiment, the IDT electrode 5 is preferably made of Al, for example. It is desired that the IDT electrode 5 is preferably made of Al or an alloy containing mainly Al. Using such a material can reduce electrode resistance of the IDT electrode 5 and can improve electrical characteristics of the elastic wave device 1. In addition, as described later, a film thickness of the IDT electrode 5 made of Al is desirably set to be about 0.08λ or less, for example. By so setting, the electromechanical coupling coefficient $k^2$ of the secondary mode of a plate wave can preferably be increased to about 6% or more, for example.

In the elastic wave device 1 of this preferred embodiment, the piezoelectric thin film 4 preferably is made of $LiTaO_3$ having Euler angles within particular ranges. With such a feature, the secondary mode of the plate wave, which contains mainly a U1 component, can be excited efficiently, and an influence of spurious interference caused by other modes can be suppressed. These points will be described in detail below.

Figure 4:
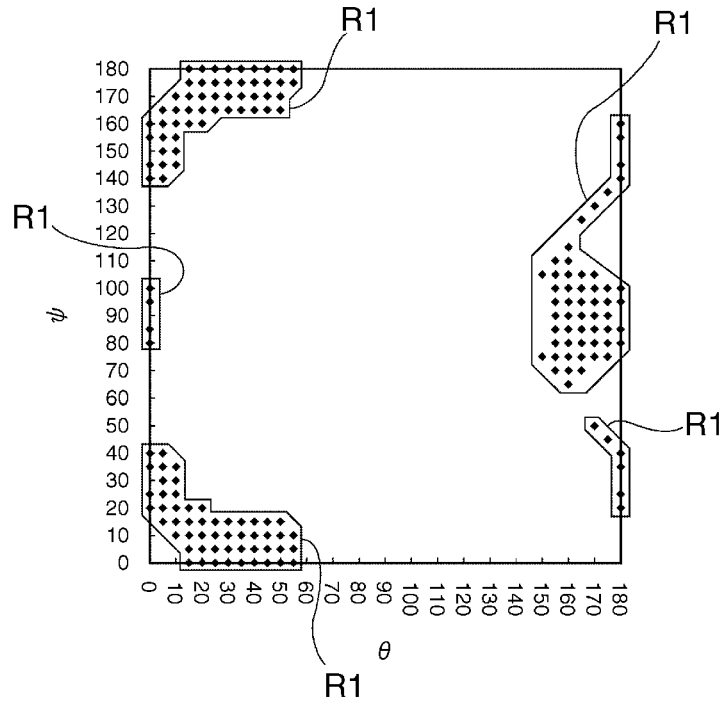
FIG. 4 is a plot depicting regions where the electromechanical coupling coefficients k$^2$ of other modes becoming the spurious interference are about 2% or less and an absolute value of the power flow angle of the utilized secondary mode of the plate wave is about 2° or less when a LiTaO$_3$ thin film having Euler angles (0° to 2.5°, θ, ψ) is used.
Figure 5:
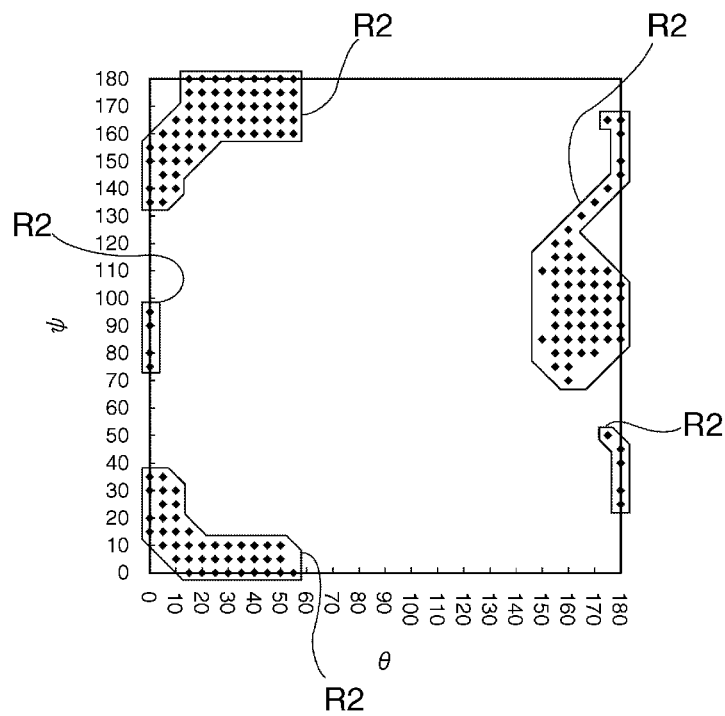
FIG. 5 is a plot depicting regions where the electromechanical coupling coefficients k$^2$ of other modes becoming the spurious interference are about 2% or less and an absolute value of the power flow angle of the utilized secondary mode of the plate wave is about 2° or less when a LiTaO$_3$ thin film having Euler angles (more than 2.5° and equal to or less than 7.5°, θ, ψ) is used.
Figure 6:
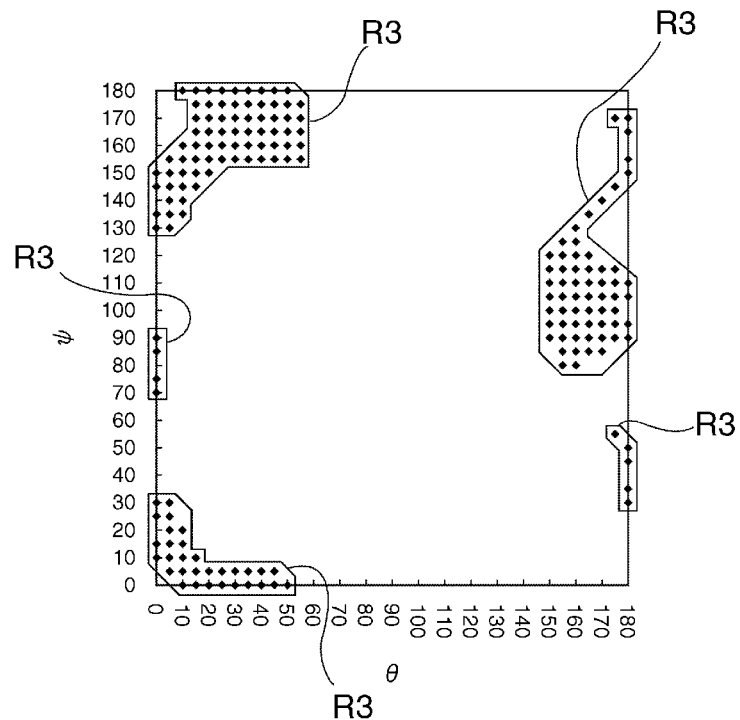
FIG. 6 is a plot depicting regions where the electromechanical coupling coefficients k$^2$ of other modes becoming the spurious interference are about 2% or less and an absolute value of the power flow angle of the utilized secondary mode of the plate wave is about 2° or less when a LiTaO$_3$ thin film having Euler angles (more than 7.5° and equal to or less than 12.5°, θ, ψ) is used.
Figure 7:
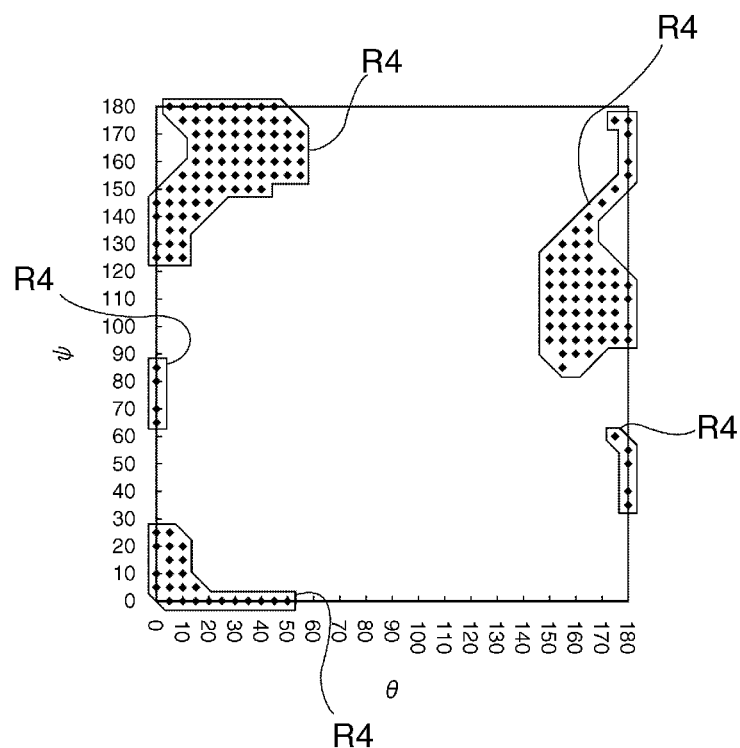
FIG. 7 is a plot depicting regions where the electromechanical coupling coefficients k$^2$ of other modes becoming the spurious interference are about 2% or less and an absolute value of the power flow angle of the utilized secondary mode of the plate wave is about 2° or less when a LiTaO$_3$ thin film having Euler angles (more than 12.5° and equal to or less than 17.5°, θ, ψ) is used.
Figure 8:
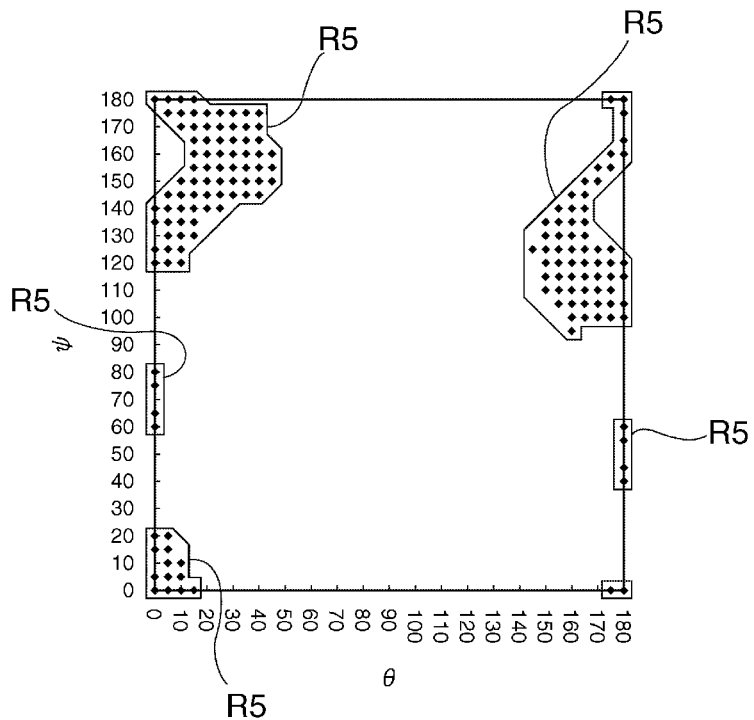
FIG. 8 is a plot depicting regions where the electromechanical coupling coefficients k$^2$ of other modes becoming the spurious interference are about 2% or less and an absolute value of the power flow angle of the utilized secondary mode of the plate wave is about 2° or less when a LiTaO$_3$ thin film having Euler angles (more than 17.5° and equal to or less than 22.5°, θ, ψ) is used.
Figure 9:
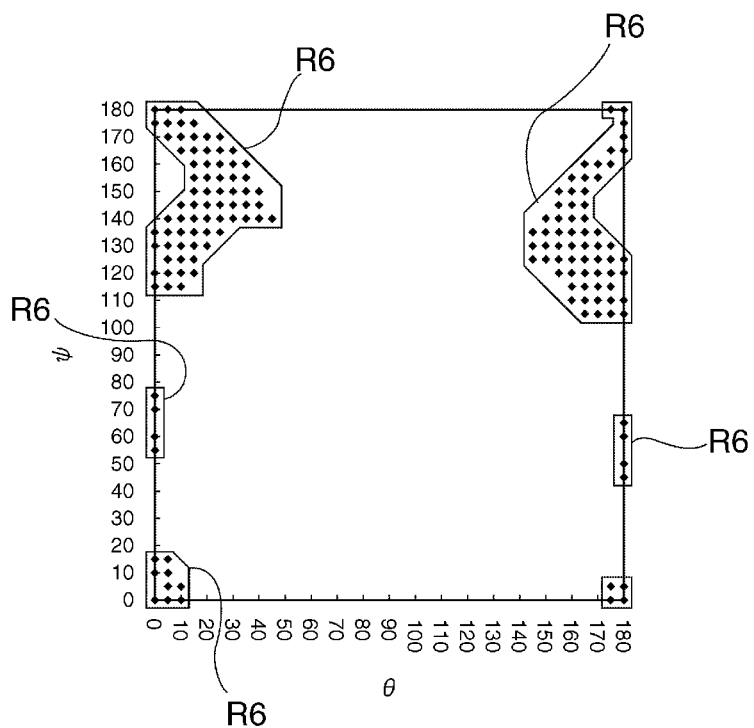
FIG. 9 is a plot depicting regions where the electromechanical coupling coefficients k$^2$ of other modes becoming the spurious interference are about 2% or less and an absolute value of the power flow angle of the utilized secondary mode of the plate wave is about 2° or less when a LiTaO$_3$ thin film having Euler angles (more than 22.5° and equal to or less than 27.5°, θ, ψ) is used.
Figure 10:
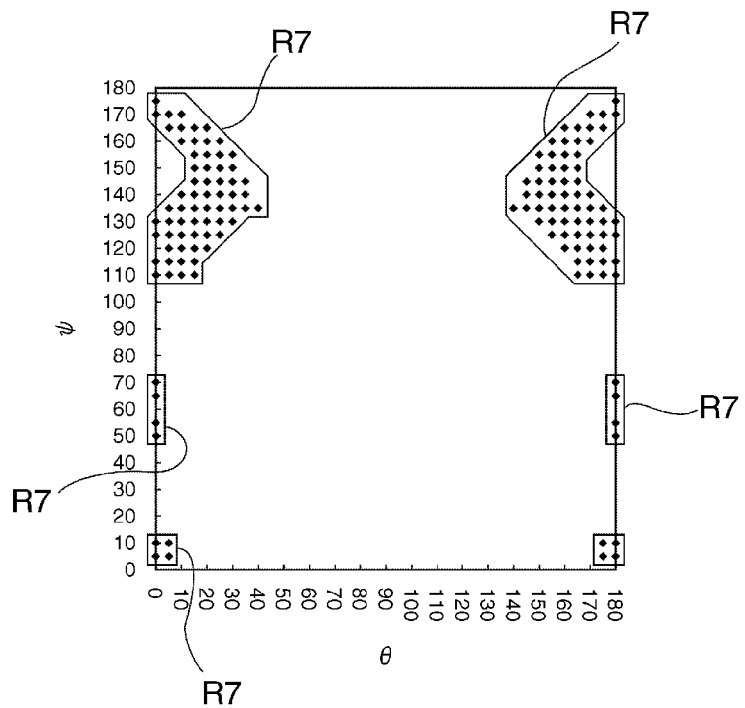
FIG. 10 is a plot depicting regions where the electromechanical coupling coefficients k$^2$ of other modes becoming the spurious interference are about 2% or less and an absolute value of the power flow angle of the utilized secondary mode of the plate wave is about 2° or less when a LiTaO$_3$ thin film having Euler angles (more than 27.5° and equal to or less than 30°, θ, ψ) is used.
Figure 11:
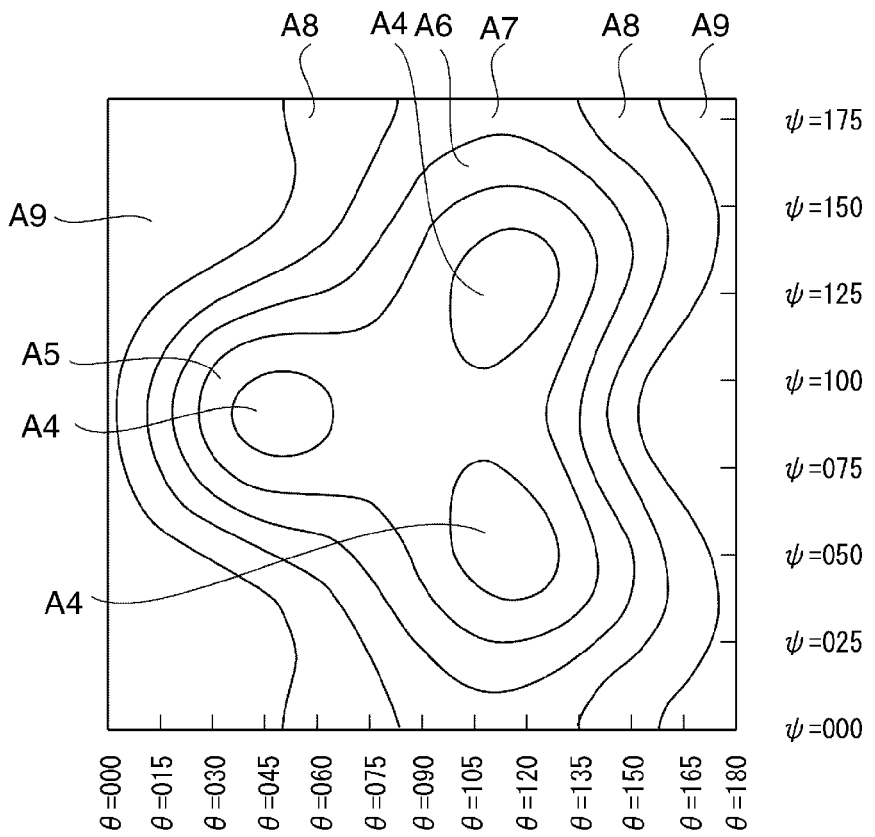
FIG. 11 is a plot depicting the relationship between the acoustic velocity of the U3-1 mode and each of θ and ψ when LiTaO$_3$ having Euler angles (0°, θ, ψ) is used.
Figure 12:
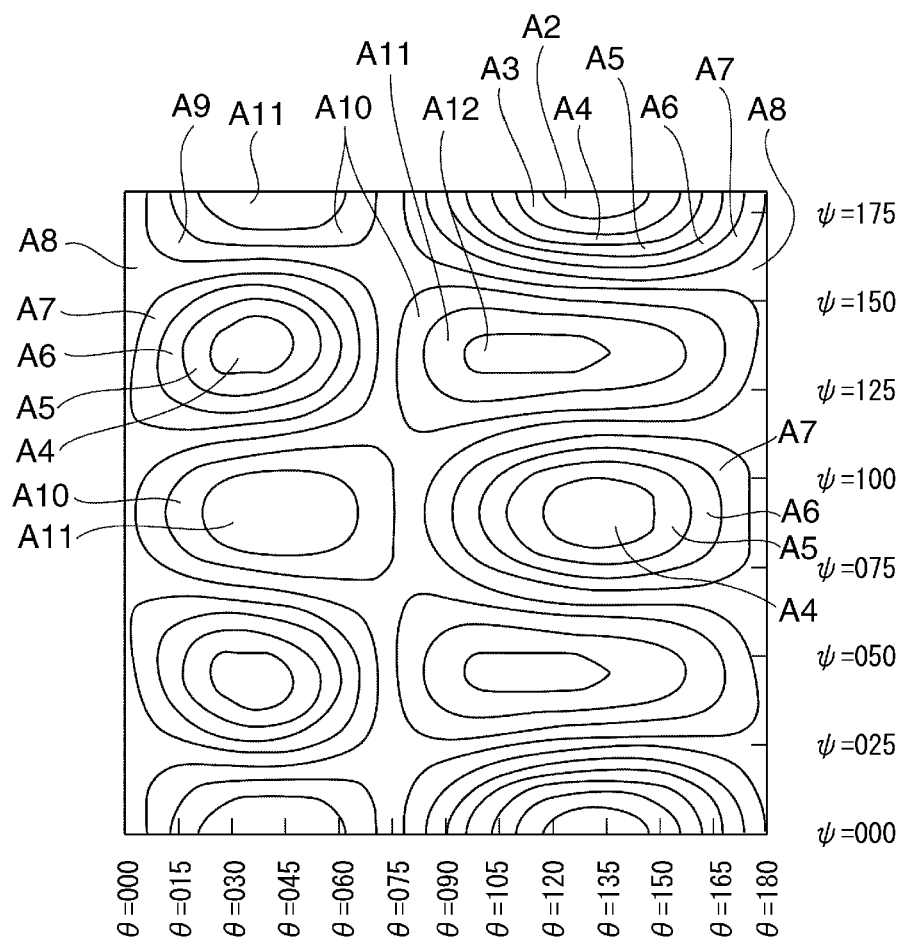
FIG. 12 is a plot depicting the relationship between the acoustic velocity of the U2-1 mode and each of θ and ψ when LiTaO$_3$ having Euler angles (0°, θ, ψ) is used.
Figure 13:
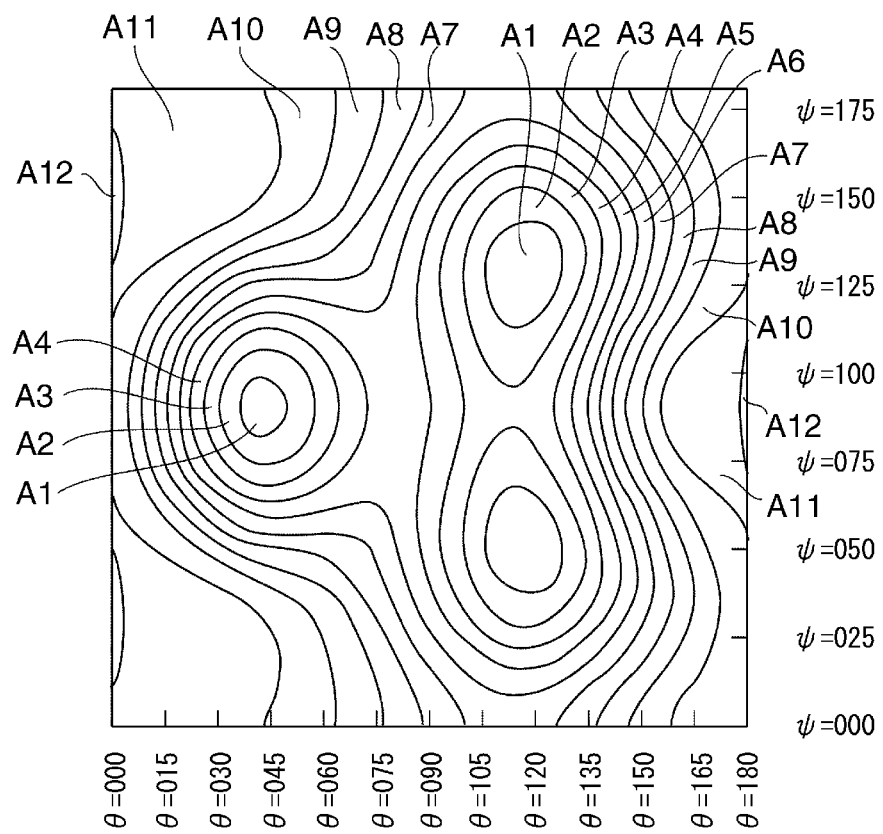
FIG. 13 is a plot depicting the relationship between the acoustic velocity of the U1-1 mode and each of θ and w when LiTaO$_3$ having Euler angles (0°, θ, ψ) is used.
Figure 14:
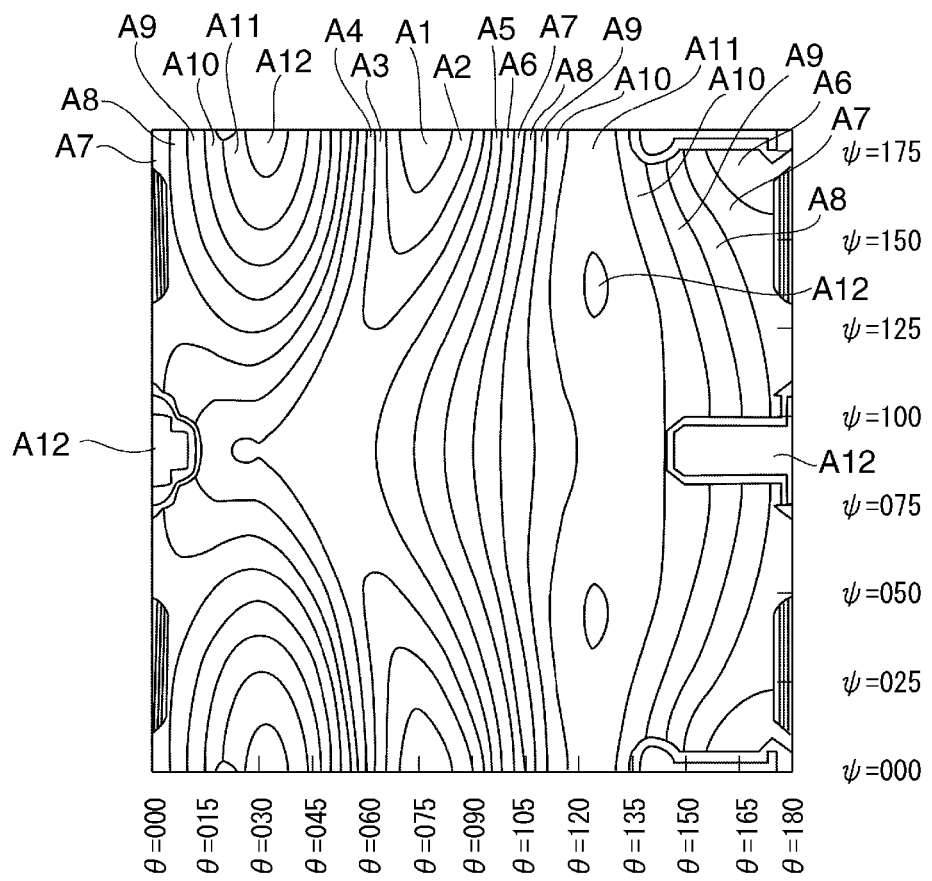
FIG. 14 is a plot depicting the relationship between the acoustic velocity of the U2-2 mode and each of θ and ψ when LiTaO$_3$ having Euler angles (0°, θ, ψ) is used.

In the elastic wave device 1 of this preferred embodiment, Euler angles ($\phi$, $\theta$, $\psi$) of $LiTaO_3$ preferably fall within ranges represented by regions R1 to R7 surrounded by solid lines in FIGS. 4 to 10. R1 is described as a representative example. In FIG. 4, plural portions are surrounded by solid lines, and the region R1 corresponds to those plural portions surrounded by solid lines. Stated in another way, although the plural portions surrounded by solid lines are dispersed, the region R1 corresponds to a total of those plural portions. The above description also corresponds to the regions R2 to R7 in a similar manner.

When Euler angles ($\phi$, $\theta$, $\psi$) fall within the regions R1 to R7, an absolute value of the power flow angle PFA of the utilized mode, i.e., the secondary mode of the plate wave, which contains mainly the U1 component, can be held at about 2° or less, and the electromechanical coupling coefficients $k^2$ of other modes becoming the spurious interference can be held at about 2% or less, for example. This point will be further described below with reference to FIGS. 11 to 42, taking the region R1 as a representative example. The results plotted in FIGS. 11 to 42 indicate the relationships of $\phi$, $\theta$, and $\psi$ in $LiTaO_3$ having Euler angles ($\phi$, $\theta$, $\psi$) with respect to the acoustic velocity, TCF, the power flow angle PFA, and the electromechanical coupling coefficient $k^2$ for each of various modes when a thickness of the piezoelectric thin film 4 made of $LiTaO_3$ is set to about 0.15λ. In more detail, FIGS. 11 to 18 depict respectively the relationships between the acoustic velocity and each of $\theta$ and $\psi$ of Euler angles (0°, $\theta$, $\psi$) in the U3-1, U2-1, U1-1, U2-2, U1-2, U3-2, U2-3 and U1-3 modes. Herein, "U3", "U2", and "U1" in U3-1, U2-1, U1-1, U2-2 and so on respectively indicate the U3 mode in which a main displacement component is U3, the U2 mode in which a main displacement component is U2, and the U1 mode in which a main displacement component is U1. Furthermore, "-1" in "U3-1" indicates a basic wave in the U3 mode, and "-2" in "U2-2" indicates a secondary mode in the U2 mode.

The elastic wave device of this preferred embodiment utilizes the secondary mode of the plate wave, which contains mainly the U1 component, i.e., the U1-2 mode. Accordingly, other modes than the U1-2 mode are modes becoming the spurious interference. Details of each of those modes will be described below.

Regions A1 to A12 in FIGS. 11 to 18 represent that the acoustic velocity falls within respective ranges listed in Table 1 given below.

TABLE 1

| | Acoustic Velocity V (Short-Circuited): Unit (m/sec) | | | | | | | |
|---|---|---|---|---|---|---|---|---|
| | FIG. 11 | FIG. 12 | FIG. 13 | FIG. 14 | FIG. 15 | FIG. 16 | FIG. 17 | FIG. 18 |
| A1 | 1475~1500 | 3850~3900 | 5980~6060 | 13260~13420 | 15250~15500 | 20750~21000 | 25520~25840 | 29000~29500 |
| A2 | 1450~1475 | 3800~3850 | 5900~5980 | 13100~13260 | 15000~15250 | 20500~20750 | 25200~25520 | 28500~29000 |
| A3 | 1425~1450 | 3750~3800 | 5820~5900 | 12940~13100 | 14750~15000 | 20250~20500 | 24880~25200 | 28000~28500 |
| A4 | 1400~1425 | 3700~3750 | 5740~5820 | 12780~12940 | 14500~14750 | 20000~20250 | 24560~24880 | 27500~28000 |
| A5 | 1375~1400 | 3650~3700 | 5660~5740 | 12620~12780 | 14250~14500 | 19750~20000 | 24240~24560 | 27000~27500 |
| A6 | 1350~1375 | 3600~3650 | 5580~5660 | 12460~12620 | 14000~14250 | 19500~19750 | 23920~24240 | 26500~27000 |
| A7 | 1325~1350 | 3550~3600 | 5500~5580 | 12300~12460 | 13750~14000 | 19250~19500 | 23600~23920 | 26000~26500 |
| A8 | 1300~1325 | 3500~3550 | 5420~5500 | 12140~12300 | 13500~13750 | 19000~19250 | 23280~23600 | 25500~26000 |
| A9 | 1275~1300 | 3450~3500 | 5340~5420 | 11980~12140 | 13250~13500 | 18750~19000 | 22960~23280 | 25000~25500 |
| A10 | 1250~1275 | 3400~3450 | 5260~5340 | 11820~11980 | 13000~13250 | 18500~18750 | 22640~22960 | 24500~25000 |
| A11 | 1225~1250 | 3350~3400 | 5180~5260 | 11660~11820 | 12750~13000 | 18250~18500 | 22320~22640 | 24000~24500 |
| A12 | 1200~1225 | 3300~3350 | 5100~5180 | 11500~11660 | 12500~12750 | 18000~18250 | 22000~22320 | 23500~24000 |

FIGS. 19 to 26 respectively depict the relationships between TCF and each of $\theta$ and $\psi$ of Euler angles (0°, $\theta$, $\psi$) in the U3-1, U2-1, U1-1, U2-2, U1-2, U3-2, U2-3 and U1-3 modes. Similarly, FIGS. 27 to 34 respectively depict the relationships between PFA and each of $\theta$ and $\psi$ of Euler angles (0°, $\theta$, $\psi$) in the U3-1, U2-1, U1-1, U2-2, U1-2, U3-2, U2-3 and U1-3 modes.

FIGS. 35 to 42 respectively depict the relationships between the electromechanical coupling coefficient $k^2$ and each of $\theta$ and $\psi$ of Euler angles (0°, $\theta$, $\psi$) in the U3-1, U2-1, U1-1, U2-2, U1-2, U3-2, U2-3 and U1-3 modes.

Regions B1 to B12 in FIGS. 19 to 26 represent that TCF falls within respective ranges listed in Table 2 given below.

TABLE 2

TCF: Unit (ppm/° C.)

Figure 19:
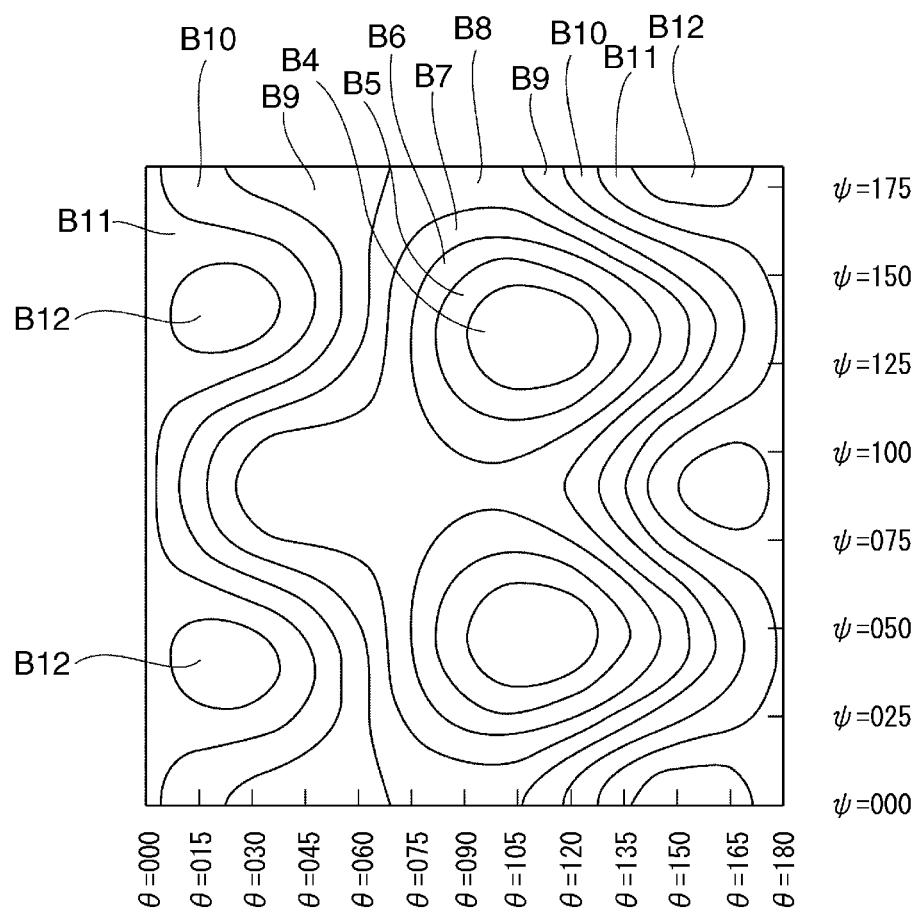
FIG. 19 is a plot depicting the relationship between TCF of the U3-1 mode and each of θ and ψ when LiTaO$_3$ having Euler angles (0°, θ, ψ) is used.
Figure 20:
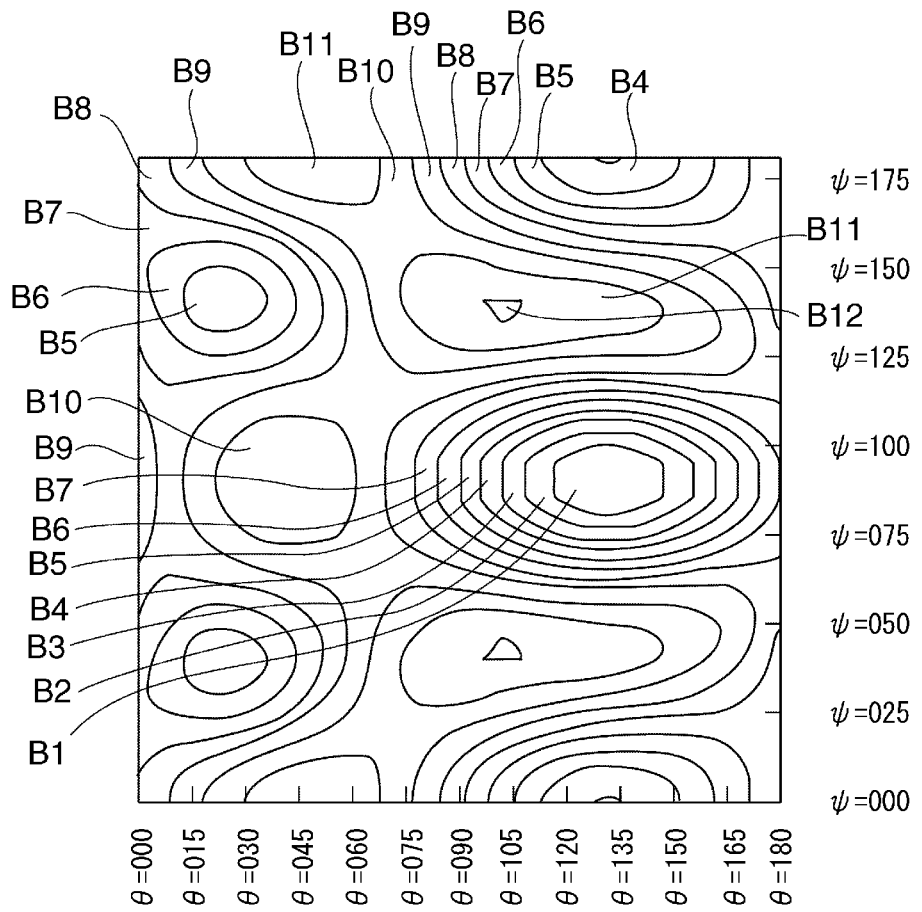
FIG. 20 is a plot depicting the relationship between TCF of the U2-1 mode and each of θ and ψ when LiTaO$_3$ having Euler angles (0°, θ, ψ) is used.
Figure 21:
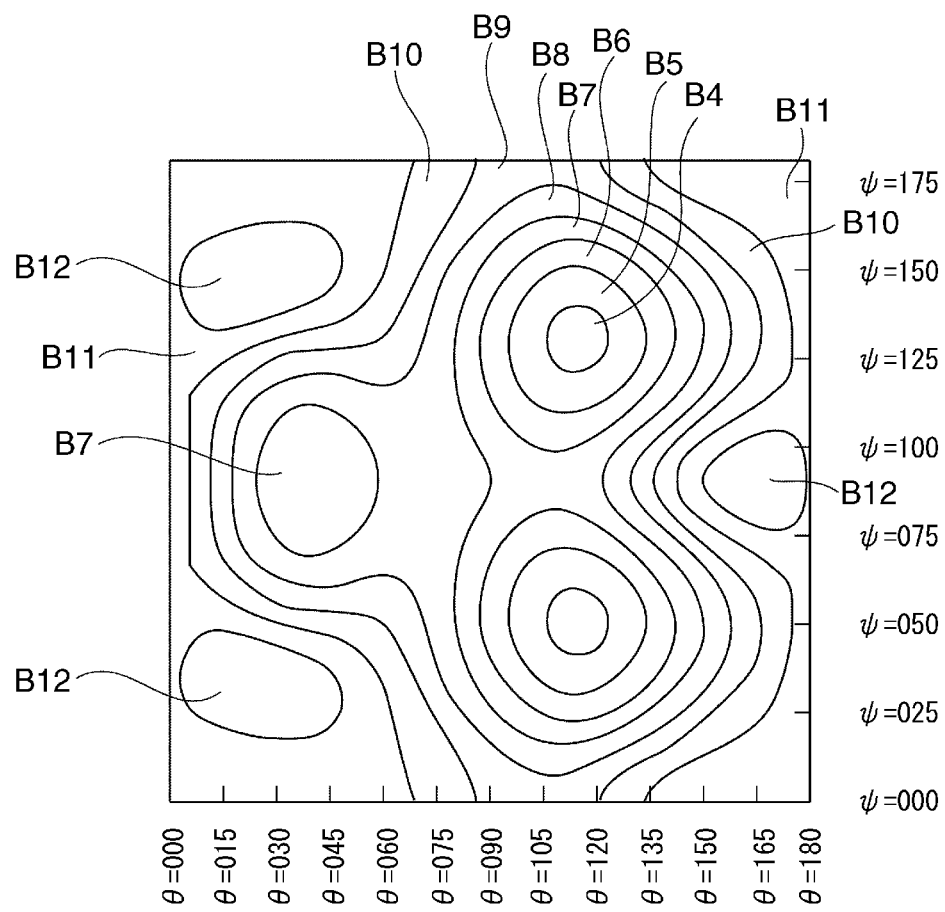
FIG. 21 is a plot depicting the relationship between TCF of the U1-1 mode and each of θ and ψ when LiTaO$_3$ having Euler angles (0°, θ, ψ) is used.
Figure 22:
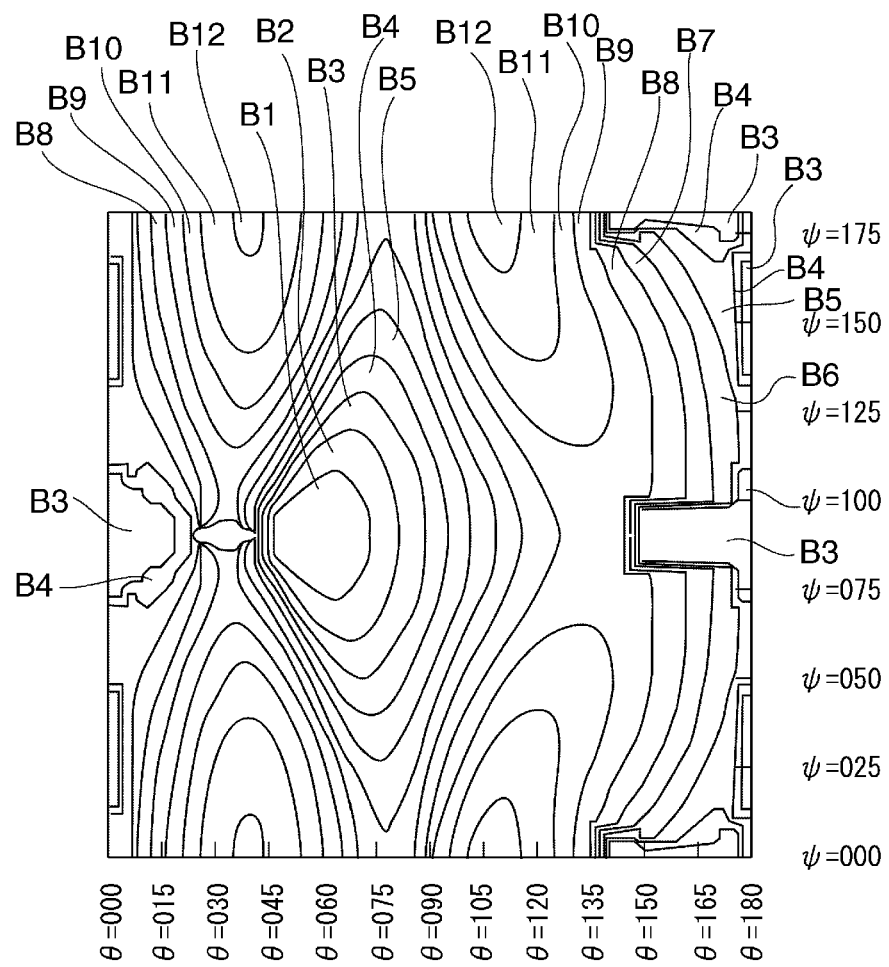
FIG. 22 is a plot depicting the relationship between TCF of the U2-2 mode and each of θ and ψ when LiTaO$_3$ having Euler angles (0°, θ, ψ) is used.
Figure 23:
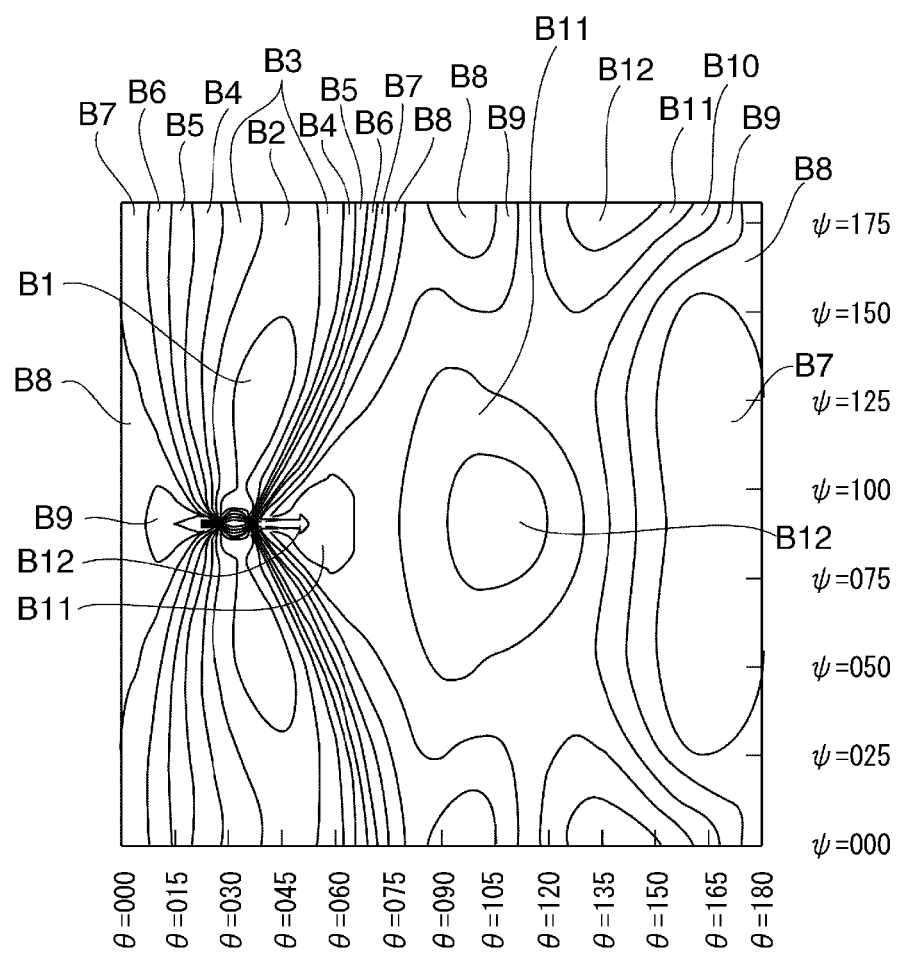
FIG. 23 is a plot depicting the relationship between TCF of the U1-2 mode and each of θ and ψ when LiTaO$_3$ having Euler angles (0°, θ, ψ) is used.
Figure 24:
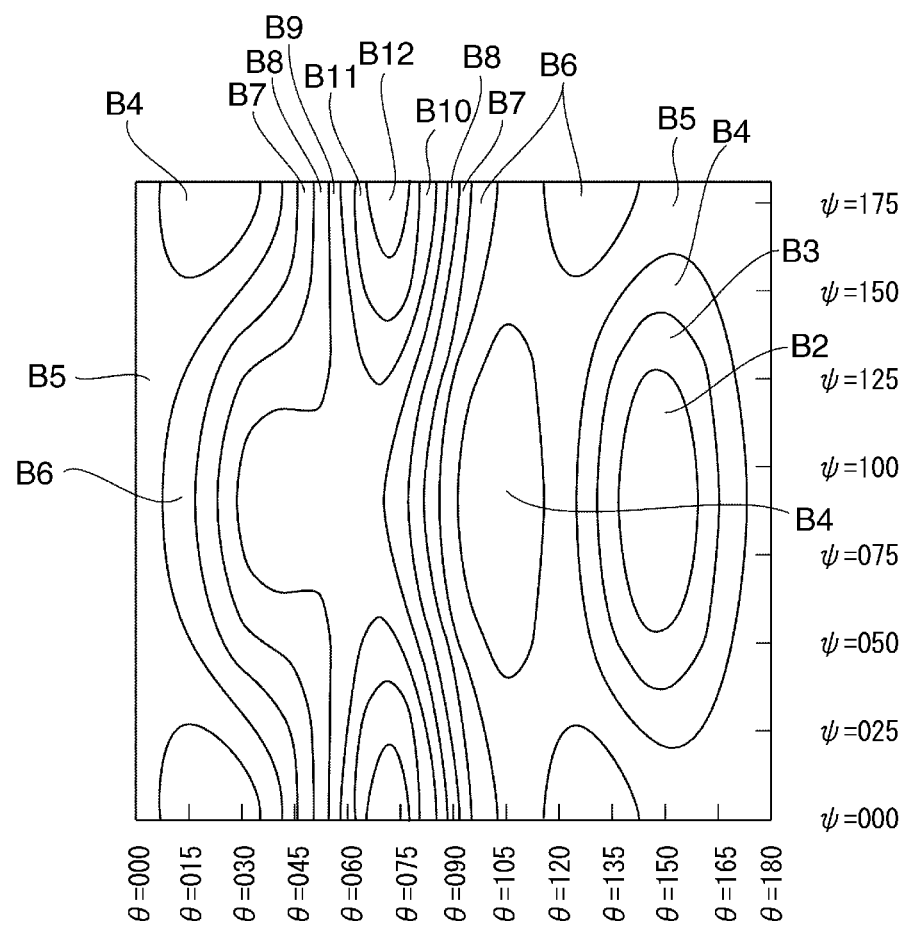
FIG. 24 is a plot depicting the relationship between TCF of the U3-2 mode and each of θ and ψ when LiTaO$_3$ having Euler angles (0°, θ, ψ) is used.
Figure 25:
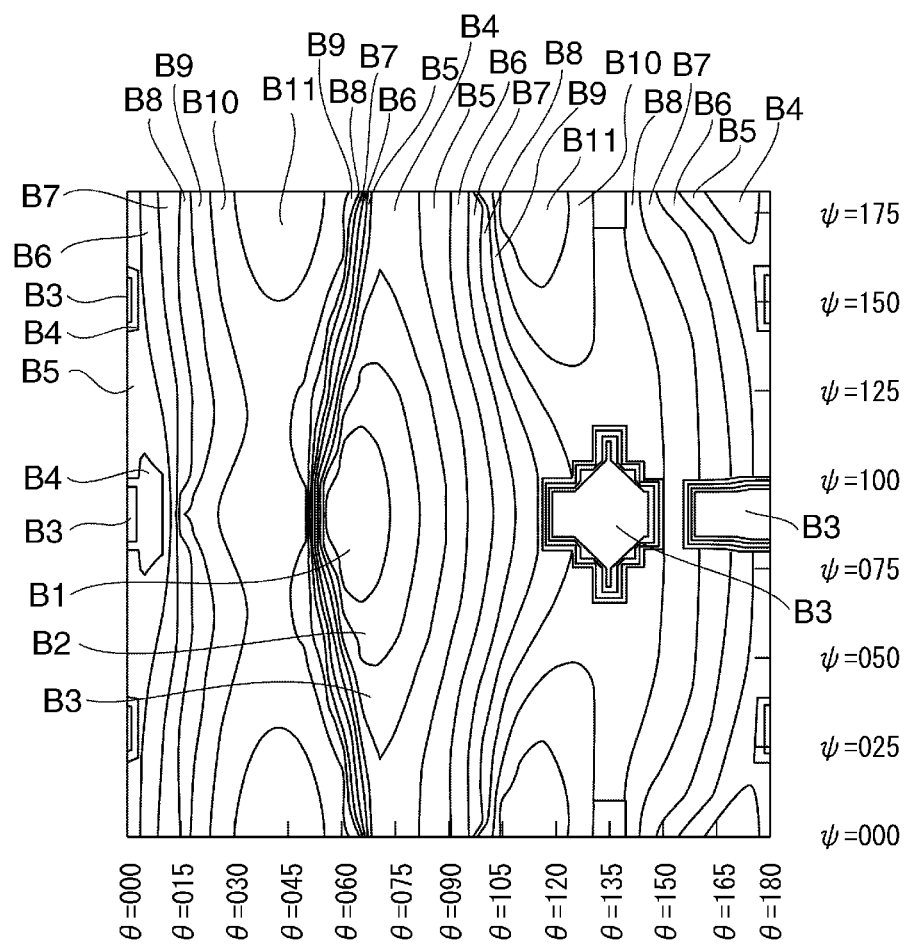
FIG. 25 is a plot depicting the relationship between TCF of the U2-3 mode and each of θ and ψ when LiTaO$_3$ having Euler angles (0°, θ, ψ) is used.
Figure 26:
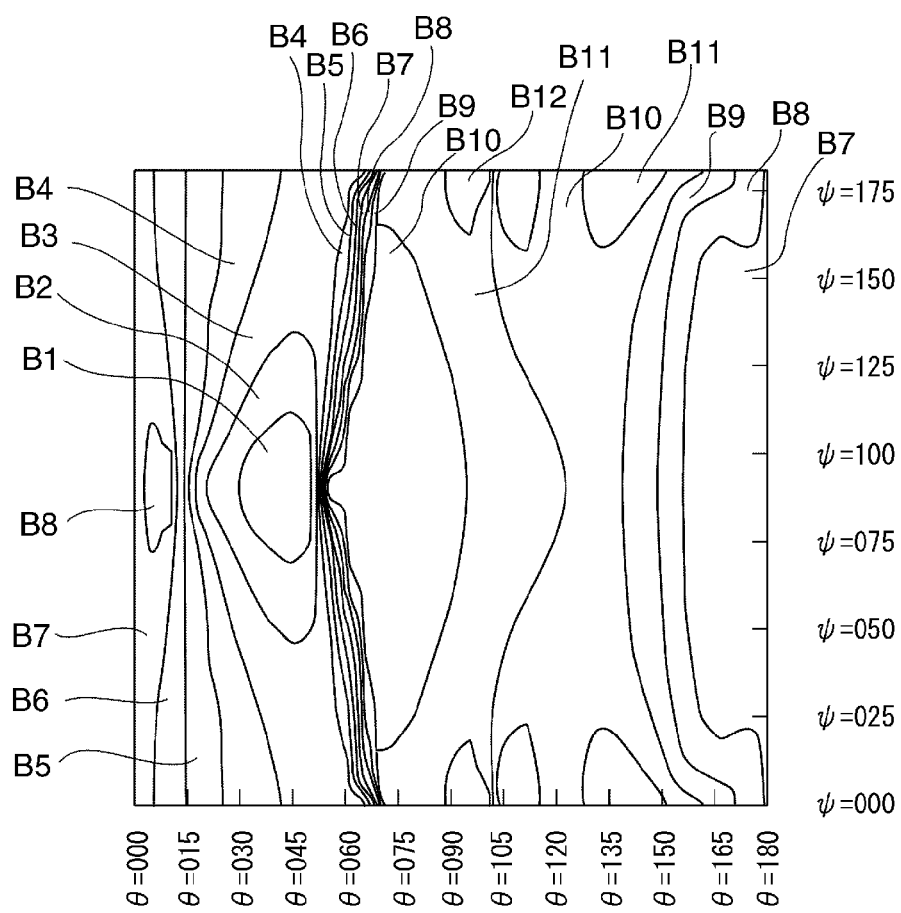
FIG. 26 is a plot depicting the relationship between TCF of the U1-3 mode and each of θ and ψ when LiTaO$_3$ having Euler angles (0°, θ, ψ) is used.

|  | FIG. 19 | FIG. 20 | FIG. 21 | FIG. 22 | FIG. 23 | FIG. 24 | FIG. 25 | FIG. 26 |
|---|---|---|---|---|---|---|---|---|
| B1 | −15~−10 | 13~21 | −6~0 | 9~17 | −10~−5 | −38~−36 | 11~20 | 12~20 |
| B2 | −20~−15 | 5~13 | −12~−6 | 1~9 | −15~−10 | −40~−38 | 2~11 | 4~12 |
| B3 | −25~−20 | −3~5 | −18~−12 | −7~1 | −20~−15 | −42~−40 | −7~2 | −4~4 |
| B4 | −30~−25 | −11~−3 | −24~−18 | −15~−7 | −25~−20 | −44~−42 | −16~−7 | −12~−4 |
| B5 | −35~−30 | −19~−11 | −30~−24 | −23~−15 | −30~−25 | −46~−44 | −25~−16 | −20~−12 |
| B6 | −40~−35 | −27~−19 | −36~−30 | −31~−23 | −35~−30 | −48~−46 | −34~−25 | −28~−20 |
| B7 | −45~−40 | −35~−27 | −42~−36 | −39~−31 | −40~−35 | −50~−48 | −43~−34 | −36~−28 |
| B8 | −50~−45 | −43~−35 | −48~−42 | −47~−39 | −45~−40 | −52~−50 | −52~−43 | −44~−36 |
| B9 | −55~−50 | −51~−43 | −54~−48 | −55~−47 | −50~−45 | −54~−52 | −61~−52 | −52~−44 |
| B10 | −60~−55 | −59~−51 | −60~−54 | −63~−55 | −55~−50 | −56~−54 | −70~−61 | −60~−52 |
| B11 | −65~−60 | −67~−59 | −66~−60 | −71~−63 | −60~−55 | −58~−56 | −79~−70 | −68~−60 |
| B12 | −70~−65 | −75~−67 | −72~−66 | −79~−71 | −65~−60 | −60~−58 | −88~−79 | −76~−68 |

Similarly, regions C1 to C12 in FIGS. 27 to 34 represent that a value of PFA falls within respective ranges listed in Table 3 given below.

TABLE 3

Power Flow Angle PFA: Unit (°)

Figure 27:
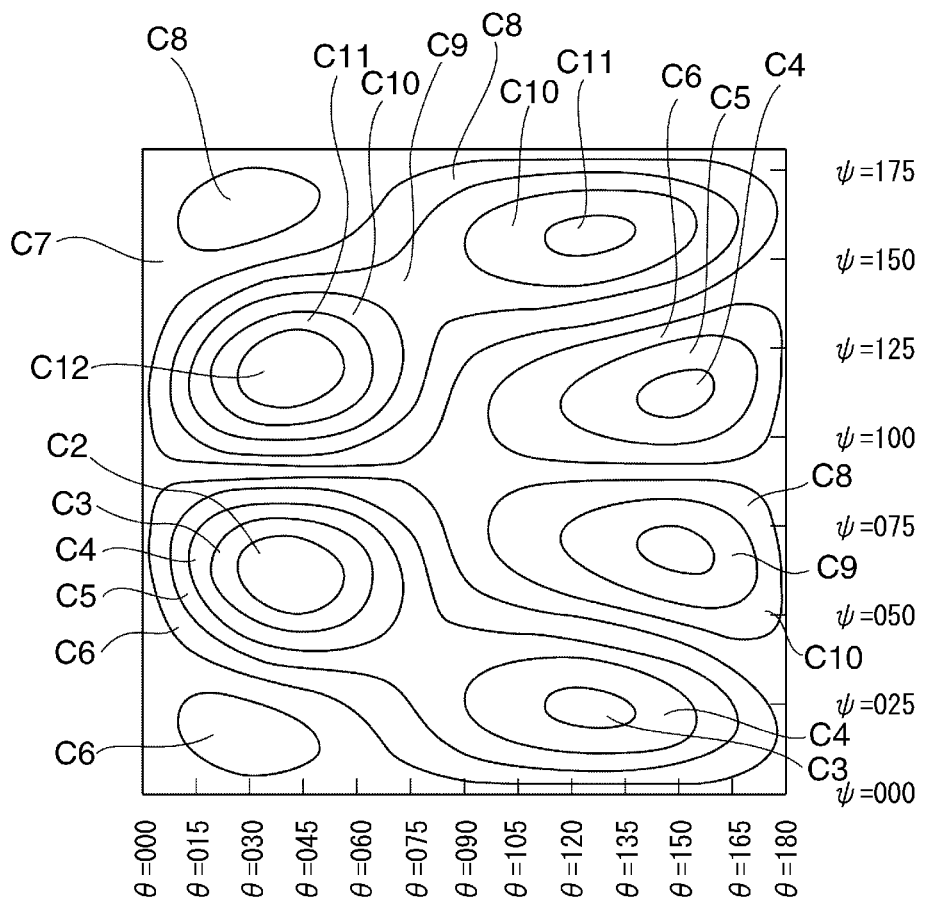
FIG. 27 is a plot depicting the relationship between the power flow angle PFA (°) of the U3-1 mode and each of θ and ψ when LiTaO$_3$ having Euler angles (0°, θ, ψ) is used.
Figure 28:
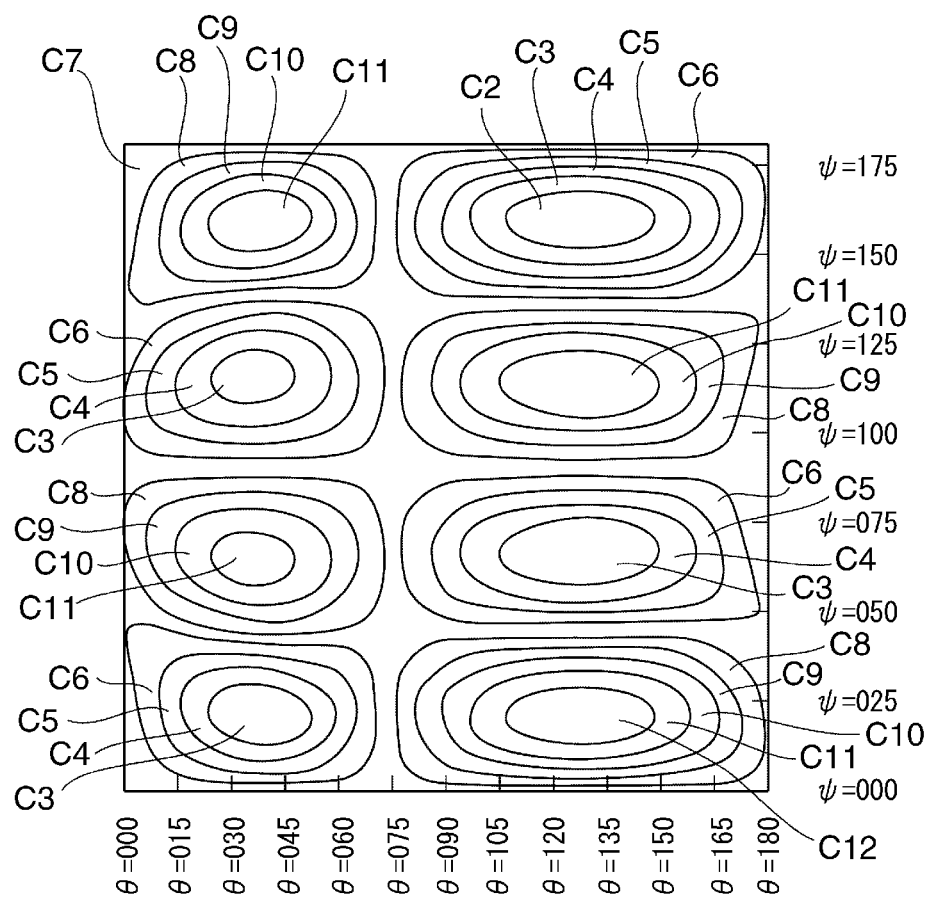
FIG. 28 is a plot depicting the relationship between the power flow angle PFA (°) of the U2-1 mode and each of θ and ψ when LiTaO$_3$ having Euler angles (0°, θ, ψ) is used.
Figure 29:
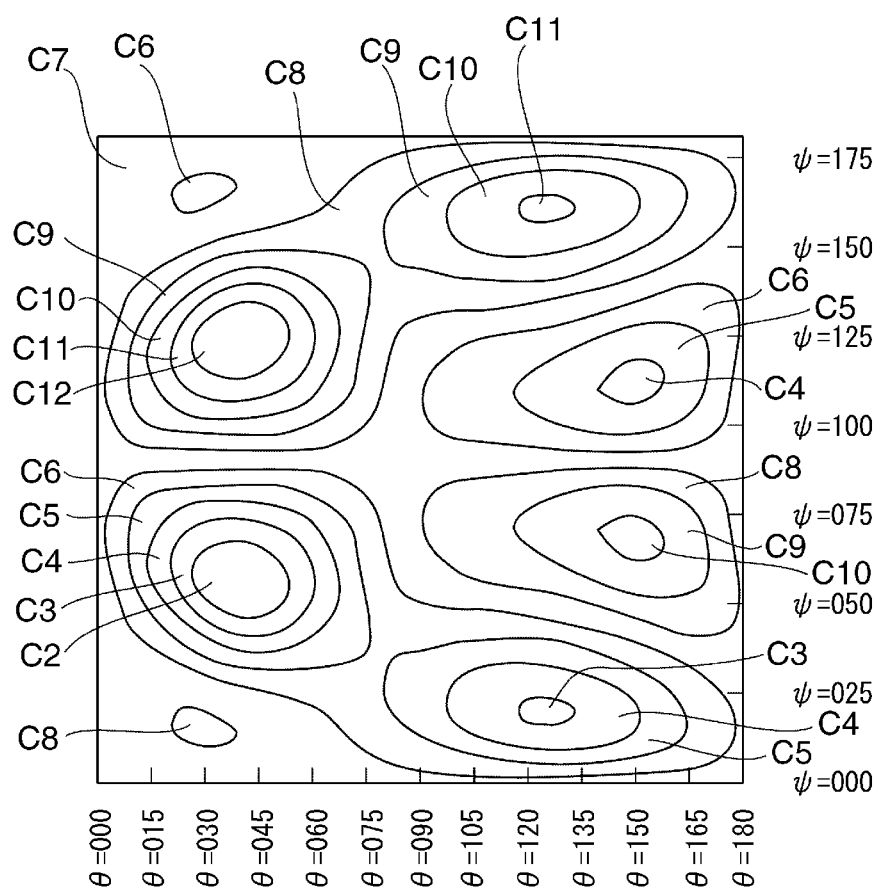
FIG. 29 is a plot depicting the relationship between the power flow angle PFA (°) of the U1-1 mode and each of θ and ψ when LiTaO$_3$ having Euler angles (0°, θ, ψ) is used.
Figure 30:
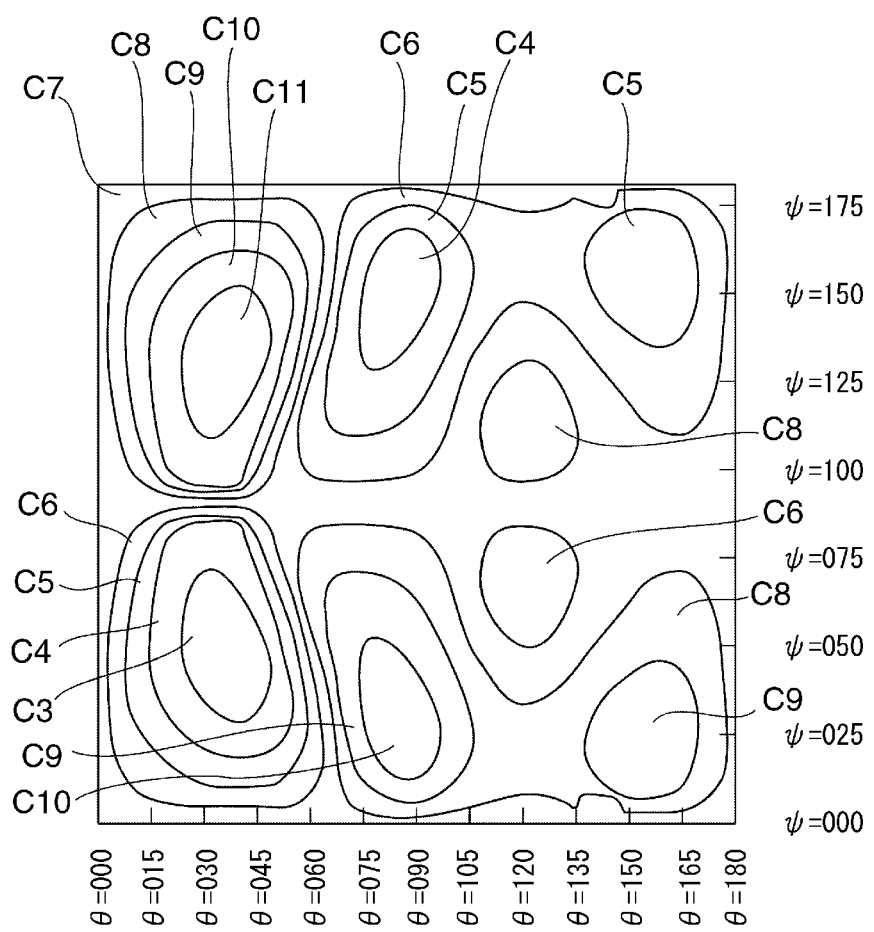
FIG. 30 is a plot depicting the relationship between the power flow angle PFA (°) of the U2-2 mode and each of θ and ψ when LiTaO$_3$ having Euler angles (0°, θ, ψ) is used.
Figure 31:
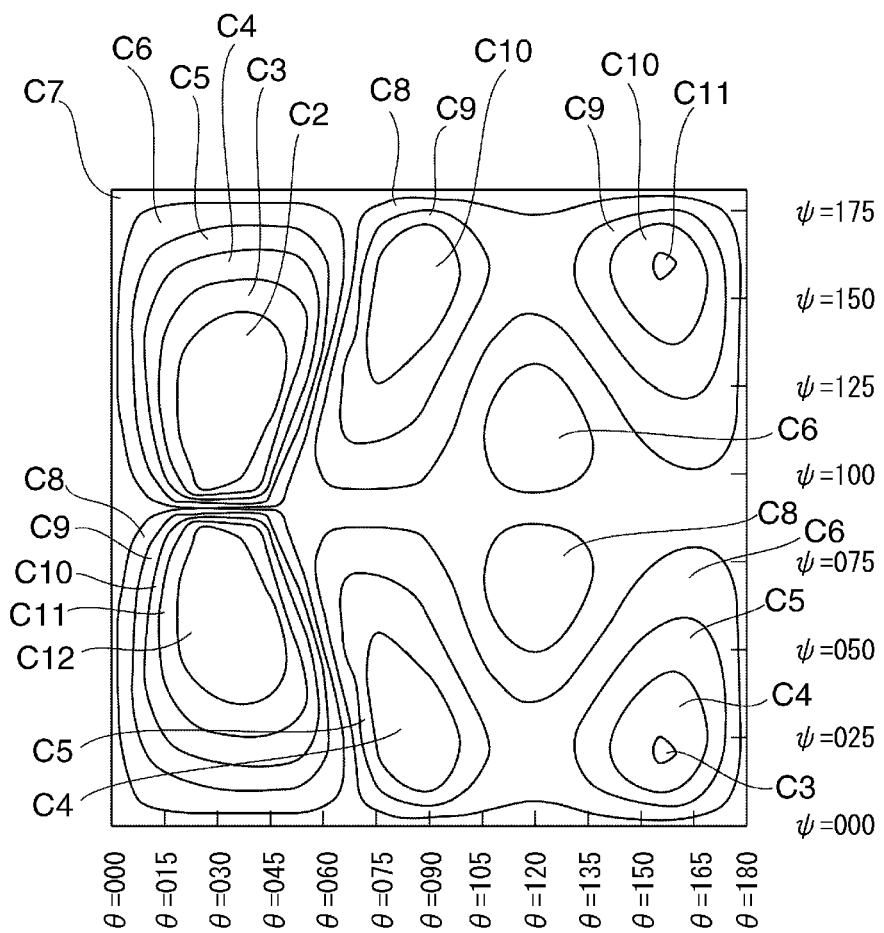
FIG. 31 is a plot depicting the relationship between the power flow angle PFA (°) of the U1-2 mode and each of θ and ψ when LiTaO$_3$ having Euler angles (0°, θ, ψ) is used.
Figure 32:
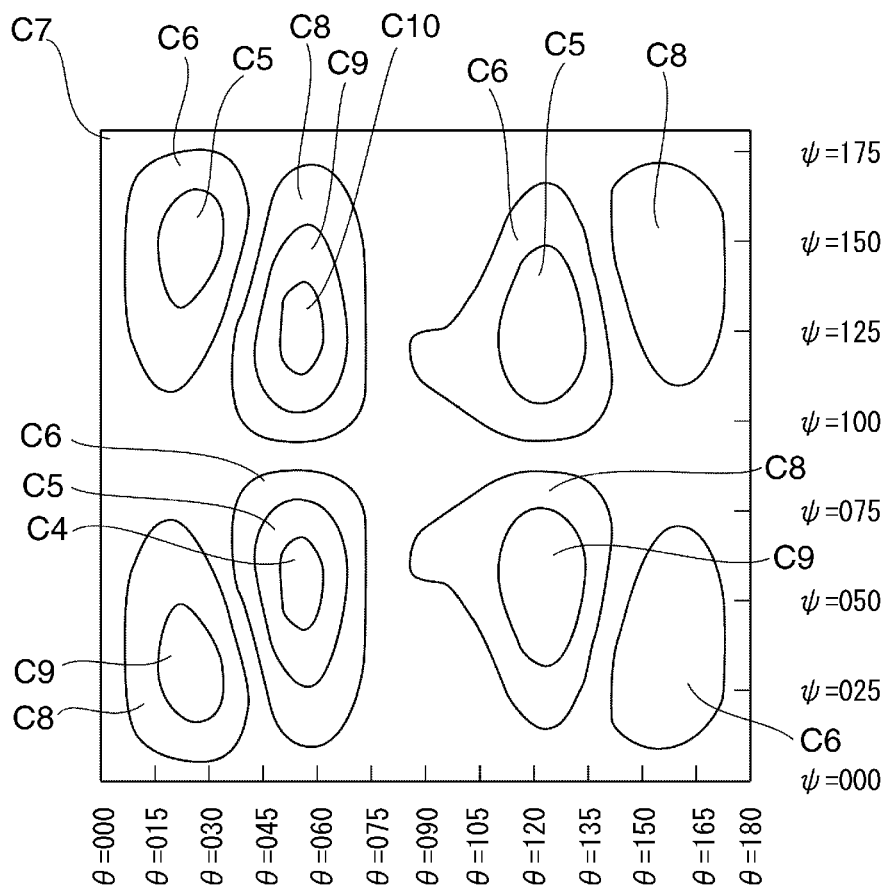
FIG. 32 is a plot depicting the relationship between the power flow angle PFA (°) of the U3-2 mode and each of θ and ψ when LiTaO$_3$ having Euler angles (0°, θ, ψ) is used.
Figure 33:
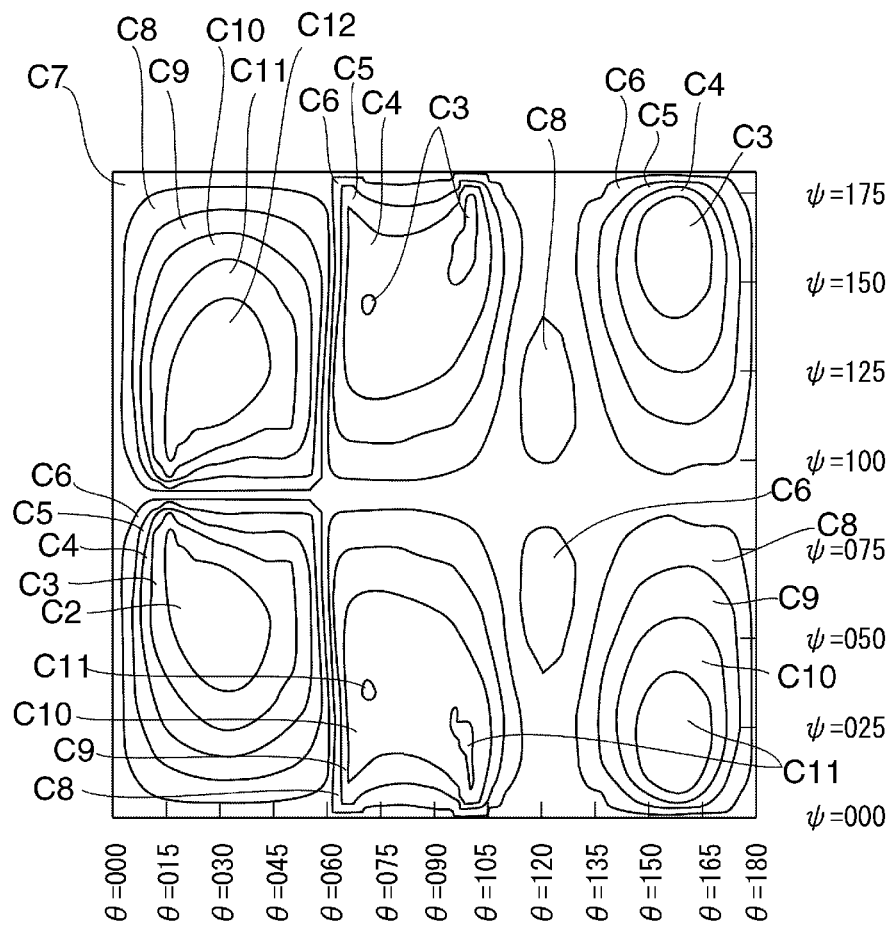
FIG. 33 is a plot depicting the relationship between the power flow angle PFA (°) of the U2-3 mode and each of θ and ψ when LiTaO$_3$ having Euler angles (0°, θ, ψ) is used.
Figure 34:
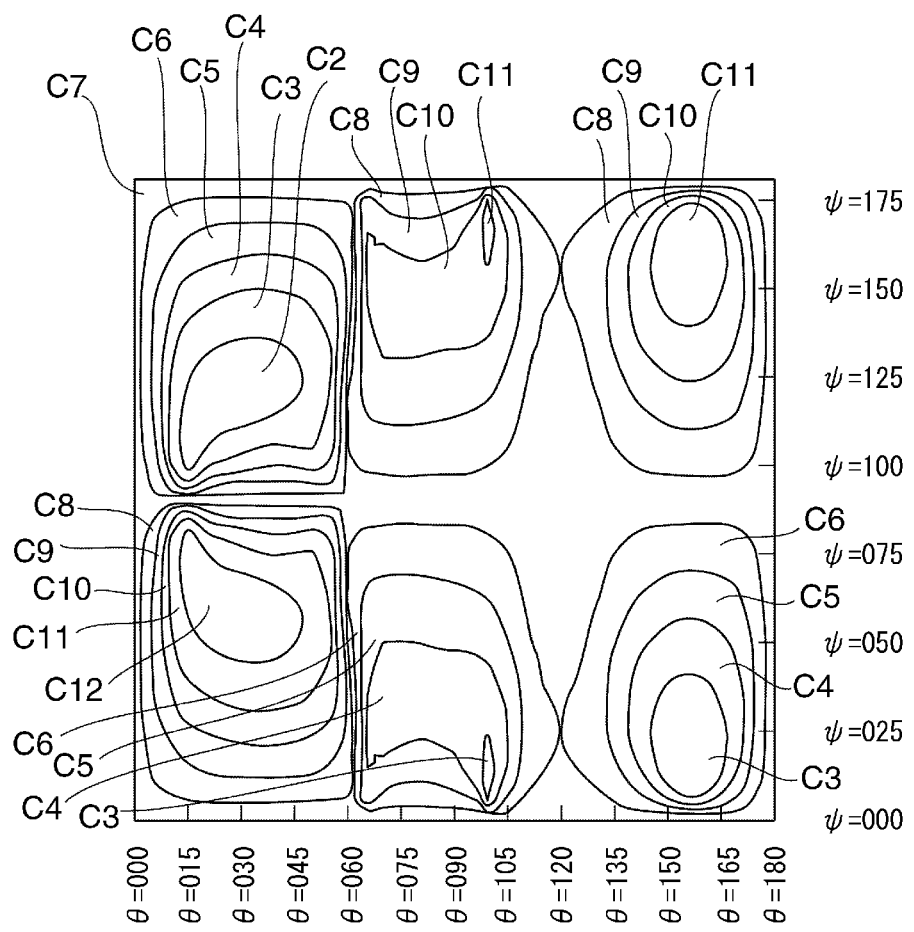
FIG. 34 is a plot depicting the relationship between the power flow angle PFA (°) of the U1-3 mode and each of θ and ψ when LiTaO$_3$ having Euler angles (0°, θ, ψ) is used.

|  | FIG. 27 | FIG. 28 | FIG. 29 | FIG. 30 | FIG. 31 | FIG. 32 | FIG. 33 | FIG. 34 |
|---|---|---|---|---|---|---|---|---|
| C1 | 6.30~7.70 | 13.05~15.95 | 9.45~11.55 | 5.40~6.60 | 3.60~4.40 | 0.81~0.99 | 2.70~3.30 | 2.52~3.08 |
| C2 | 4.90~6.30 | 10.15~13.05 | 7.35~9.45 | 4.20~5.40 | 2.80~3.60 | 0.63~0.81 | 2.10~2.70 | 1.96~2.52 |
| C3 | 3.50~4.90 | 7.25~10.15 | 5.25~7.35 | 3.00~4.20 | 2.00~2.80 | 0.45~0.63 | 1.50~2.10 | 1.40~1.96 |
| C4 | 2.10~3.50 | 4.35~7.25 | 3.15~5.25 | 1.80~3.00 | 1.20~2.00 | 0.27~0.45 | 0.90~1.50 | 0.84~1.40 |
| C5 | 0.70~2.10 | 1.45~4.35 | 1.05~3.15 | 0.60~1.80 | 0.40~1.20 | 0.09~0.27 | 0.30~0.90 | 0.28~0.84 |
| C6 | −0.70~0.70 | −1.45~1.45 | −1.05~1.05 | −0.60~0.60 | −0.40~0.40 | −0.09~0.09 | −0.30~0.30 | −0.28~0.28 |
| C7 | −2.10~−0.70 | −4.35~−1.45 | −3.15~−1.05 | −1.80~−0.60 | −1.20~−0.40 | −0.27~−0.09 | −0.90~−0.30 | −0.84~−0.28 |
| C8 | −3.50~−2.10 | −7.25~−4.35 | −5.25~−3.15 | −3.00~−1.80 | −2.00~−1.20 | −0.45~−0.27 | −1.50~−0.90 | −1.40~−0.84 |
| C9 | −4.90~−3.50 | −10.15~−7.25 | −7.35~−5.25 | −4.20~−3.00 | −2.80~−2.00 | −0.63~−0.45 | −2.10~−1.50 | −1.96~−1.40 |
| C10 | −6.30~−4.90 | −13.05~−10.15 | −9.45~−7.35 | −5.40~−4.20 | −3.60~−2.80 | −0.81~−0.63 | −2.70~−2.10 | −2.52~−1.96 |
| C11 | −7.70~−6.30 | −15.05~−13.05 | −11.55~−9.45 | −6.60~−5.40 | −4.40~−3.60 | −0.99~−0.81 | −3.30~−2.70 | −3.08~−2.52 |
| C12 | −9.10~−7.70 | −18.85~−15.95 | −13.65~−11.55 | −7.80~−6.60 | −5.20~−4.40 | −1.17~−0.99 | −3.90~−3.30 | −3.64~−3.08 |

Regions D1 to D12 in FIGS. 35 to 42 represent that the electromechanical coupling coefficient $k^2$ falls within respective ranges listed in Table 4 given below.

TABLE 4

Electromechanical Coupling Coefficient $k^2$: Unit (%)

Figure 35:
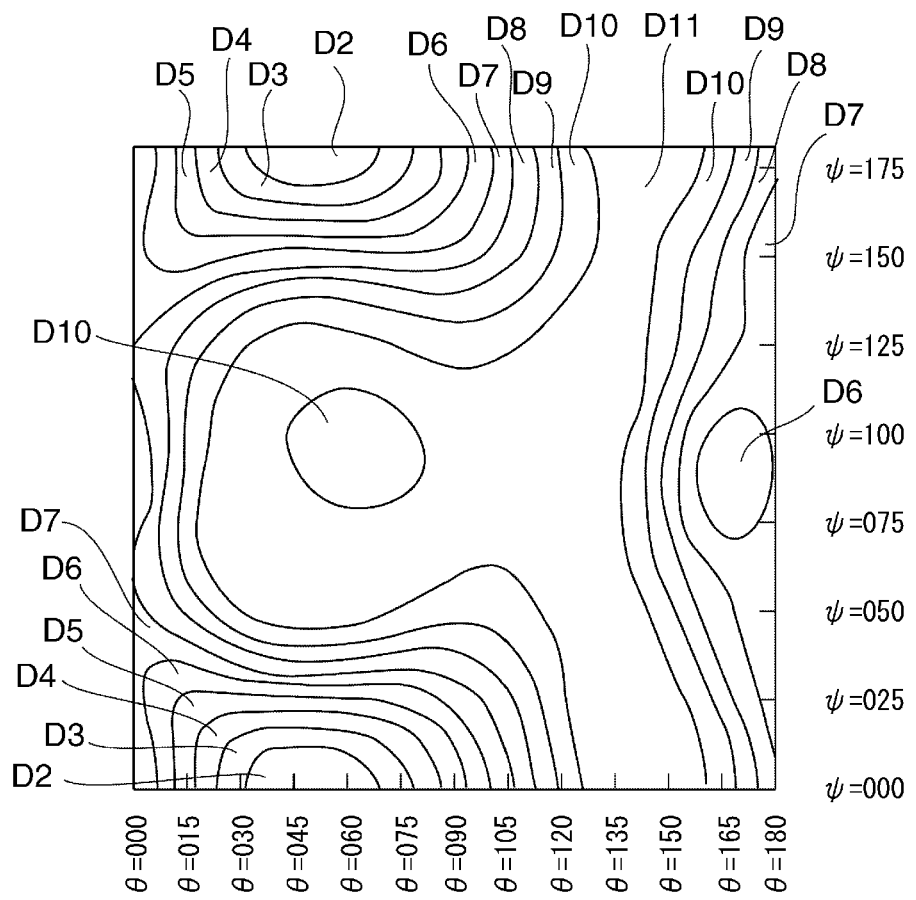
FIG. 35 is a plot depicting the relationship between the electromechanical coupling coefficient k$^2$ of the U3-1 mode and each of θ and ψ when LiTaO$_3$ having Euler angles (0°, θ, ψ) is used.
Figure 36:
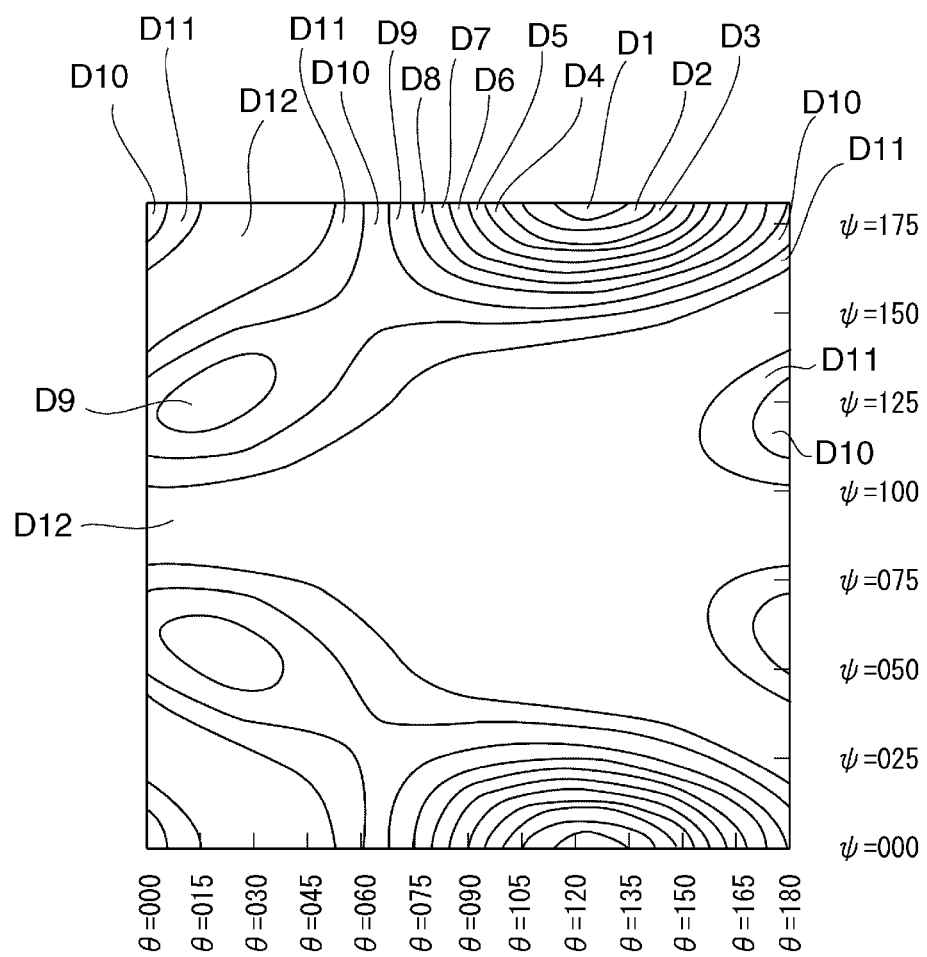
FIG. 36 is a plot depicting the relationship between the electromechanical coupling coefficient k$^2$ of the U2-1 mode and each of θ and ψ when LiTaO$_3$ having Euler angles (0°, θ, ψ) is used.
Figure 37:
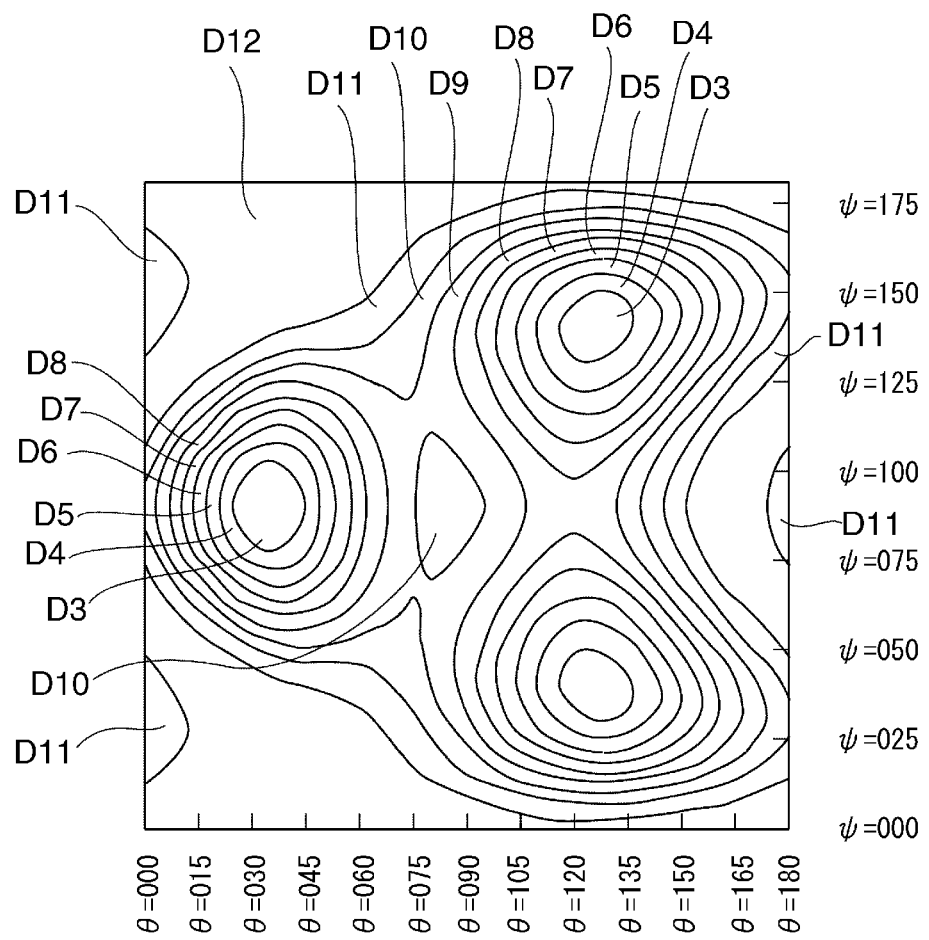
FIG. 37 is a plot depicting the relationship between the electromechanical coupling coefficient k$^2$ of the U1-1 mode and each of θ and ψ when LiTaO$_3$ having Euler angles (0°, θ, ψ) is used.
Figure 38:
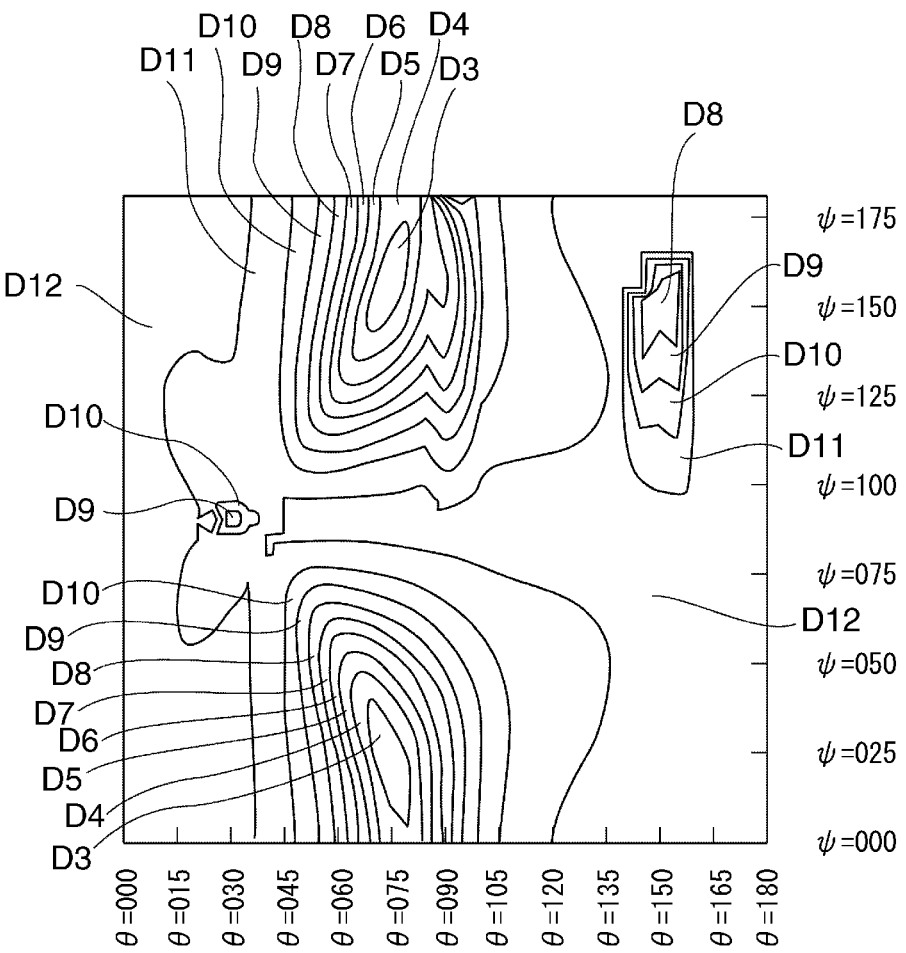
FIG. 38 is a plot depicting the relationship between the electromechanical coupling coefficient k$^2$ of the U2-2 mode and each of θ and ψ when LiTaO$_3$ having Euler angles (0°, θ, ψ) is used.
Figure 39:
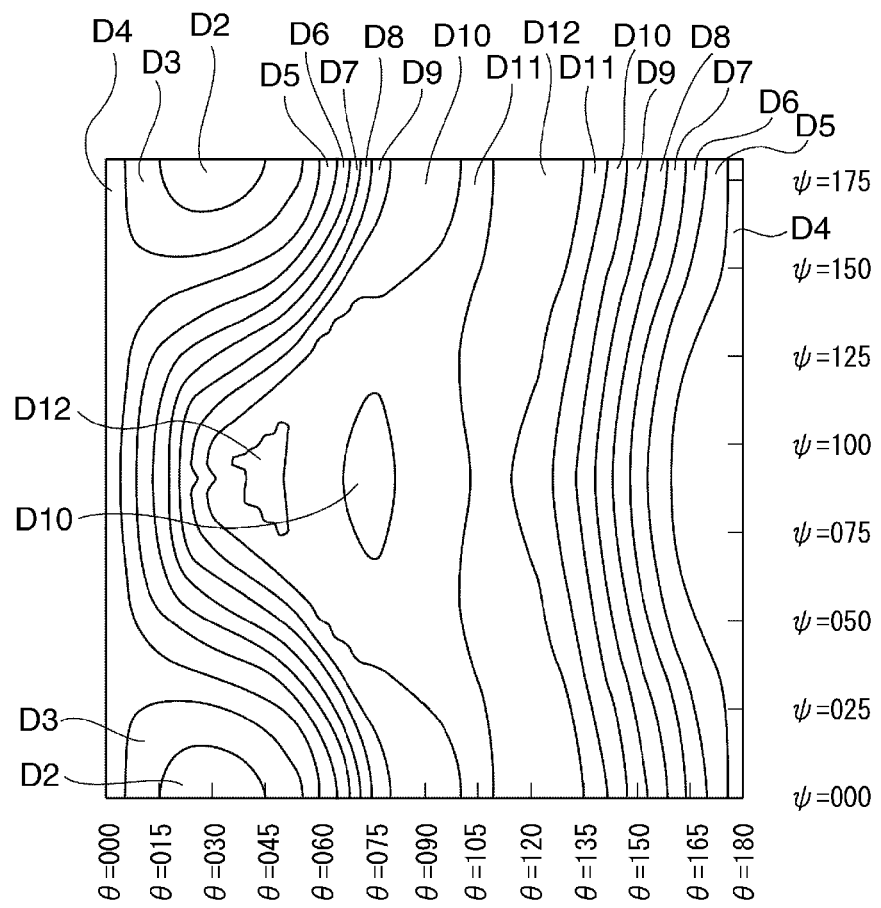
FIG. 39 is a plot depicting the relationship between the electromechanical coupling coefficient k$^2$ of the U1-2 mode and each of θ and ψ when LiTaO$_3$ having Euler angles (0°, θ, ψ) is used.
Figure 40:
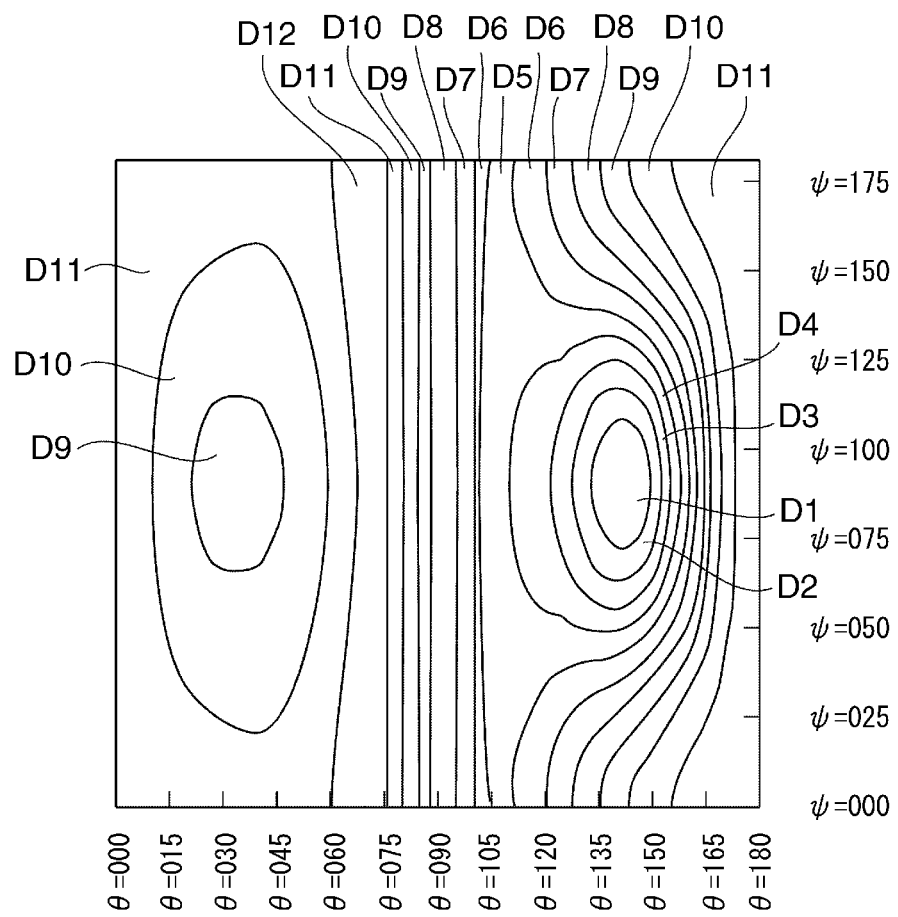
FIG. 40 is a plot depicting the relationship between the electromechanical coupling coefficient k$^2$ of the U3-2 mode and each of θ and ψ when LiTaO$_3$ having Euler angles (0°, θ, ψ) is used.
Figure 41:
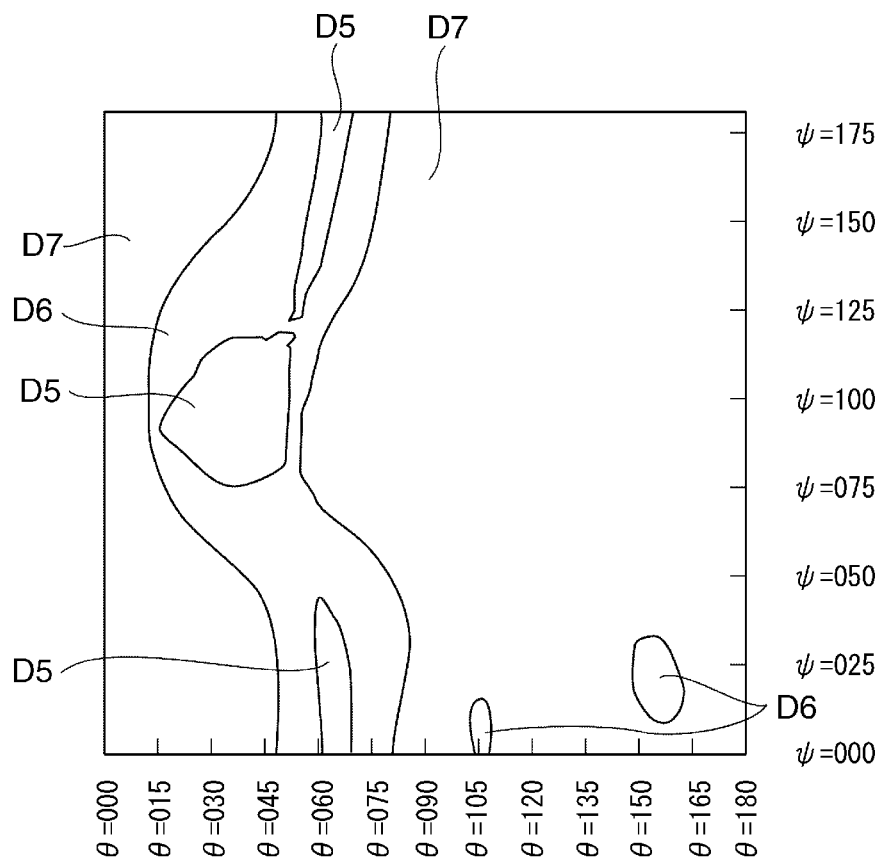
FIG. 41 is a plot depicting the relationship between the electromechanical coupling coefficient k$^2$ of the U2-3 mode and each of θ and ψ when LiTaO$_3$ having Euler angles (0°, θ, ψ) is used.
Figure 42:
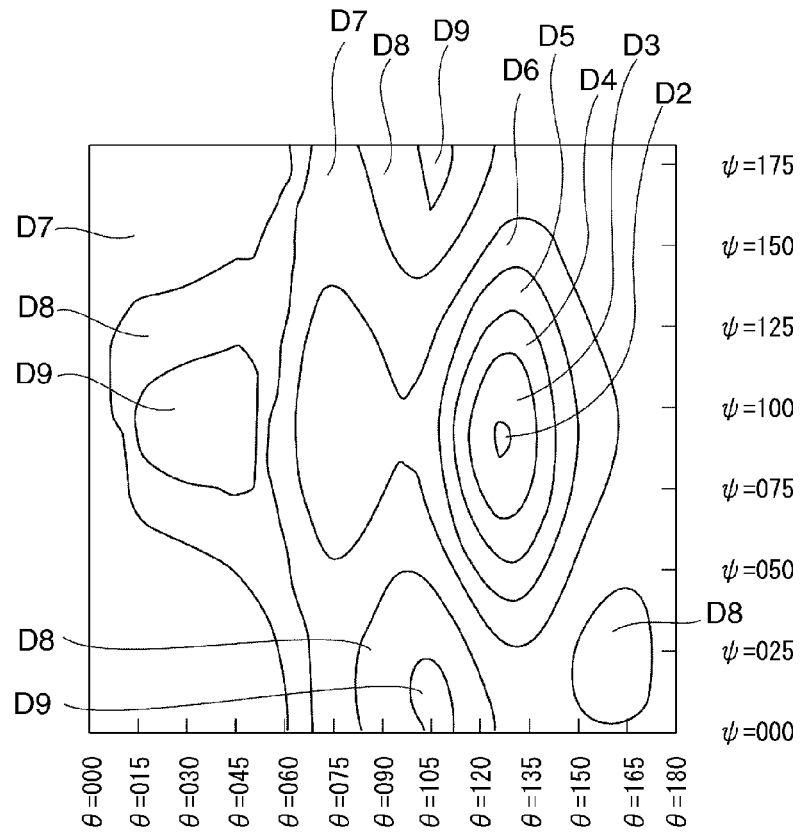
FIG. 42 is a plot depicting the relationship between the electromechanical coupling coefficient k$^2$ of the U1-3 mode and each of θ and ψ when LiTaO$_3$ having Euler angles (0°, θ, ψ) is used.

|  | FIG. 35 | FIG. 36 | FIG. 37 | FIG. 38 | FIG. 39 | FIG. 40 | FIG. 41 | FIG. 42 |
|---|---|---|---|---|---|---|---|---|
| D1 | 2.0~2.2 | 18.4~20.1 | 10.9~11.9 | 7.2~7.9 | 12.8~14.0 | 2.1~2.3 | 0.85~1.00 | 1.15~1.30 |
| D2 | 1.8~2.0 | 16.7~18.4 | 9.9~10.9 | 6.5~7.2 | 11.6~12.8 | 1.9~2.1 | 0.70~0.85 | 1.00~1.15 |
| D3 | 1.6~1.8 | 15.0~16.7 | 8.9~9.9 | 5.8~6.5 | 10.4~11.6 | 1.7~1.9 | 0.55~0.70 | 0.85~1.00 |
| D4 | 1.4~1.6 | 13.3~15.0 | 7.9~8.9 | 5.1~5.8 | 9.2~10.4 | 1.5~1.7 | 0.40~0.55 | 0.70~0.85 |
| D5 | 1.2~1.4 | 11.6~13.3 | 6.9~7.9 | 4.4~5.1 | 8.0~9.2 | 1.3~1.5 | 0.25~0.40 | 0.55~0.70 |
| D6 | 1.0~1.2 | 9.9~11.6 | 5.9~6.9 | 3.7~4.4 | 6.8~8.0 | 1.1~1.3 | 0.10~0.25 | 0.40~0.55 |
| D7 | 0.8~1.0 | 8.2~9.9 | 4.9~5.9 | 3.0~3.7 | 5.6~6.8 | 0.9~1.1 | 0.00~0.10 | 0.25~0.40 |
| D8 | 0.6~0.8 | 6.5~8.2 | 3.9~4.9 | 2.3~3.0 | 4.4~5.6 | 0.7~0.9 | ~ | 0.10~0.25 |
| D9 | 0.4~0.6 | 4.8~6.5 | 2.9~3.9 | 1.6~2.3 | 3.2~4.4 | 0.5~0.7 | ~ | 0.00~0.10 |
| D10 | 0.2~0.4 | 3.1~4.8 | 1.9~2.9 | 0.9~1.6 | 2.0~3.2 | 0.3~0.5 | ~ | ~ |
| D11 | 0.0~0.2 | 1.4~3.1 | 0.9~1.9 | 0.2~0.9 | 0.8~2.0 | 0.1~0.3 | ~ | ~ |
| D12 |  | 0.0~1.4 | 0.0~0.9 | 0.0~0.2 | 0.0~0.8 | 0.0~0.1 | ~ | ~ |

Figure 15:
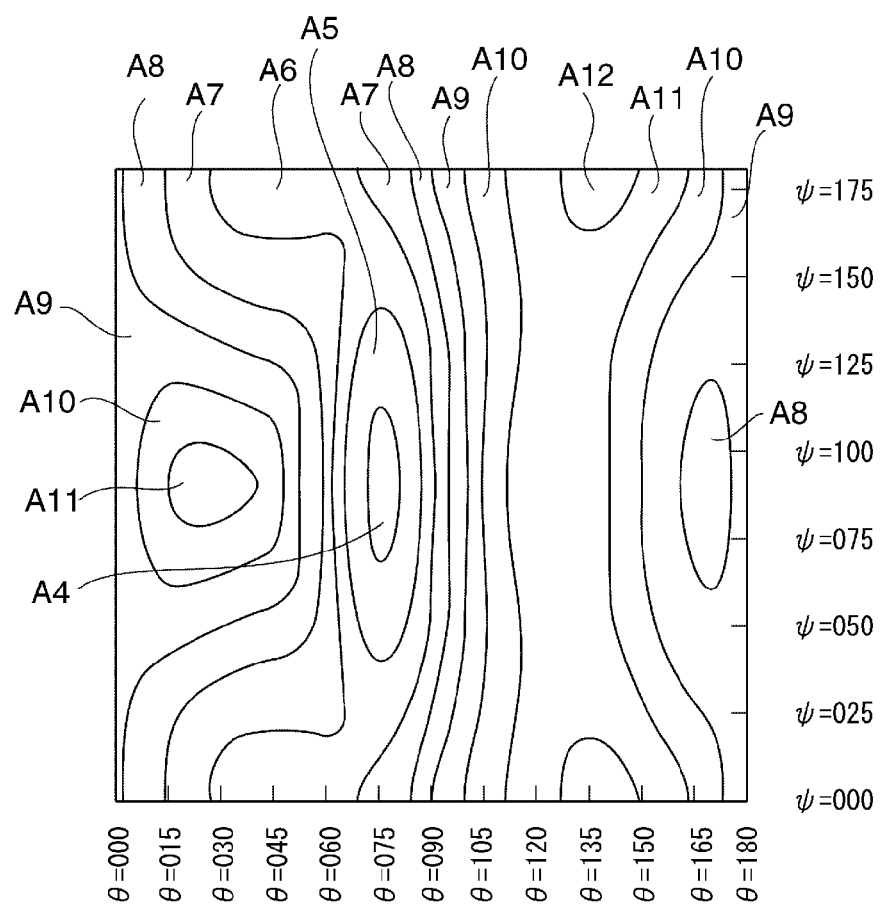
FIG. 15 is a plot depicting the relationship between the acoustic velocity of the U1-2 mode and each of θ and ψ when LiTaO$_3$ having Euler angles (0°, θ, ψ) is used.
Figure 16:
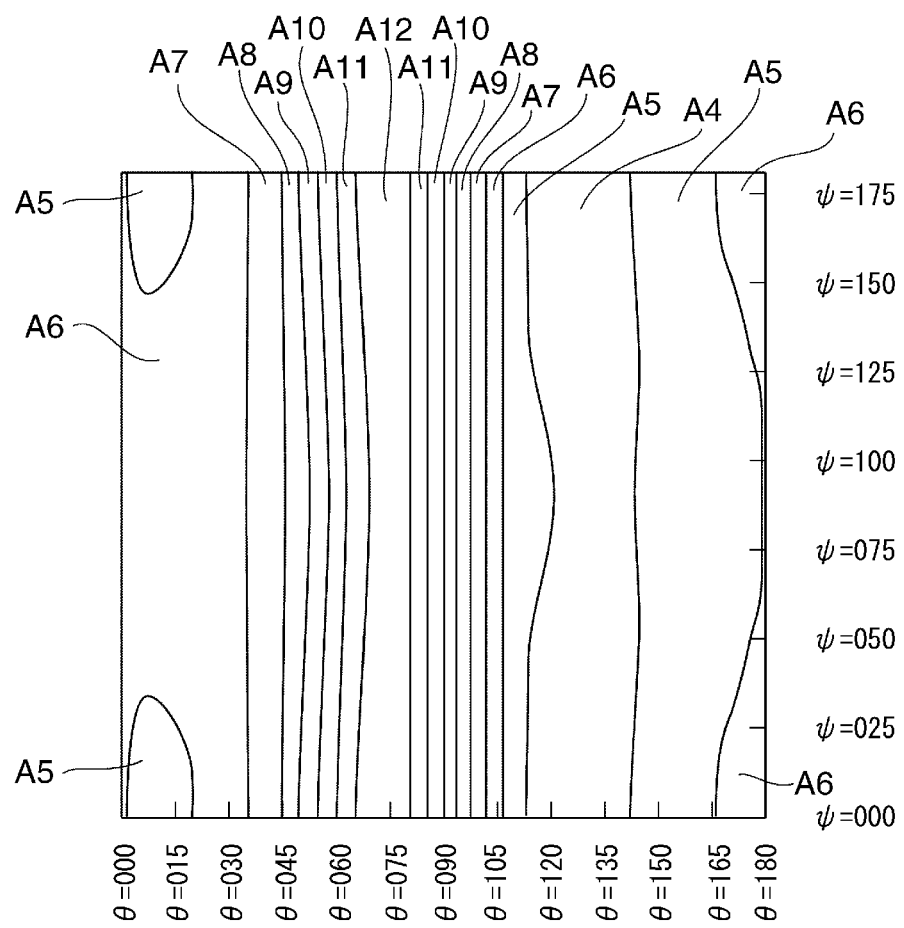
FIG. 16 is a plot depicting the relationship between the acoustic velocity of the U3-2 mode and each of θ and ψ when LiTaO$_3$ having Euler angles (0°, θ, ψ) is used.
Figure 17:
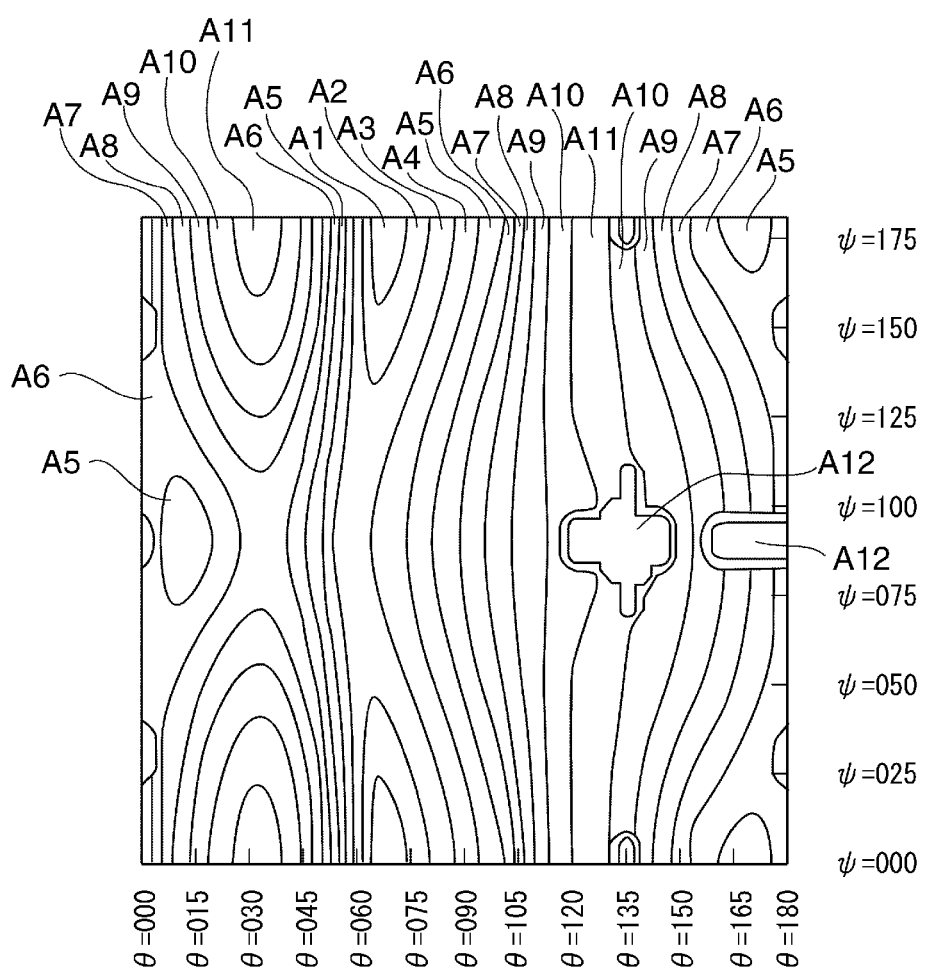
FIG. 17 is a plot depicting the relationship between the acoustic velocity of the U2-3 mode and each of θ and ψ when LiTaO$_3$ having Euler angles (0°, θ, ψ) is used.
Figure 18:
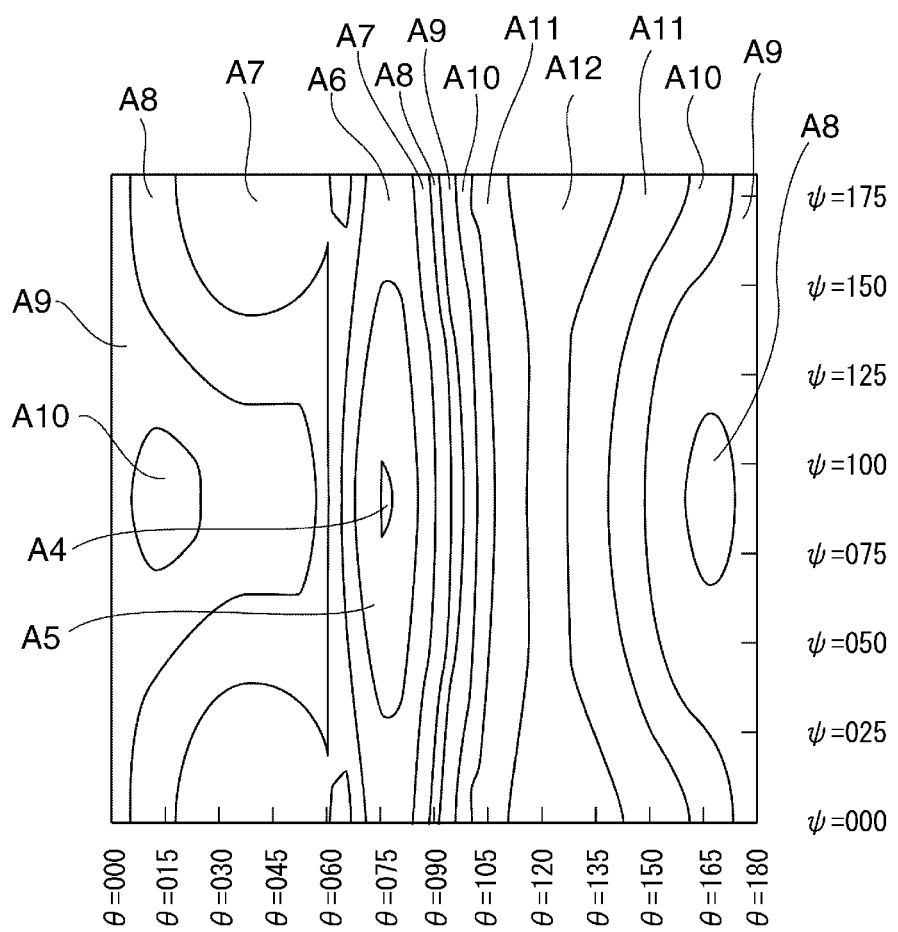
FIG. 18 is a plot depicting the relationship between the acoustic velocity of the U1-3 mode and each of θ and ψ when LiTaO$_3$ having Euler angles (0°, θ, ψ) is used.

First, as seen from FIG. 15, the acoustic velocity of the U1-2 mode, i.e., the secondary mode of the plate wave, which contains mainly the U1 component, is fast at a level as high as about 12750 m/sec or more over respective wide ranges of θ and ψ of Euler angles (0°, θ, ψ). Accordingly, it is understood that a higher acoustic velocity can be realized in comparison with the acoustic velocity of 3000 m/sec to 4000 m/sec described in Japanese Unexamined Patent Application Publication No. 2002-368576. This is attributable to the fact that the acoustic velocity of the U1-2 mode is high.

Furthermore, as seen from FIG. 31, when the U1-2 mode is utilized, the power flow angle PFA, i.e., an absolute value of the power flow angle PFA, can be reduced by properly selecting the Euler angles θ and ψ. More specifically, there are regions where the power flow angle can be held at about 2° or less by properly selecting θ and ψ of Euler angles (0°, θ, ψ). Moreover, as seen from FIGS. 35 to 42, the electromechanical coupling coefficient $k^2$ of each of the above-mentioned modes largely varies depending on θ and ψ of Euler angles (0°, θ, ψ). Since the U1-2 mode is utilized here, the other modes become the spurious interference. Accordingly, the electromechanical coupling coefficients $k^2$ of the other modes are desirably as small as possible.

Of the above-mentioned modes, the acoustic velocities of the U2-1, U1-1, U2-2, and U3-2 modes are close to that of the U1-2 mode, and those modes become the spurious interference causing a large influence. Therefore, the electromechanical coupling coefficients $k^2$ of those modes are required to be held small. On the other hand, the electromechanical coupling coefficients $k^2$ of the U2-3 and U1-3 modes are very small, and those modes cause no problem. The electromechanical coupling coefficient $k^2$ of the U3-1 mode is comparatively large. However, because the acoustic velocity of the U3-1 mode is slow, the U3-1 mode can be kept away from the U1-2 mode to be utilized by restricting the thickness of the piezoelectric thin film and the electromechanical coupling coefficient $k^2$ of the U3-1 mode become small. Such a point will be clarified from later description of propagation characteristics of the various modes depending on the thickness of $LiTaO_3$.

The region R1 in FIG. 4 is obtained by determining, based on FIGS. 31 and 35 to 42, each range where, when the U1-2 mode is utilized, the absolute value of the power flow angle PFA is about 2° or less and the electromechanical coupling coefficients $k^2$ of the other modes than the U1-2 mode are about 2% or less. In other words, FIG. 4 depicts the result of determining the above-mentioned range from FIGS. 31 and 35 to 42, and plotting the determined range. While FIGS. 31 and 35 to 42 depict the results obtained in the case of Euler angles (0°, θ, ψ), similar results are obtained when ϕ is in a range of about 0° to about 2.5°.

The results depicted in FIGS. 5 to 10 are also obtained in a similar manner to the result depicted in FIG. 4.

Thus, as seen from FIGS. 4 to 10, it is possible to hold the absolute value of the power flow angle PFA in the utilized U1-2 mode at about 2° or less and the electromechanical coupling coefficients $k^2$ of the other modes becoming the spurious interference at about 2% or less, by setting the Euler angles of $LiTaO_3$ to fall within the ranges represented by the regions R1 to R7 that are indicated by hatching in FIGS. 4 to 10. Furthermore, as seen from FIG. 39, the electromechanical coupling coefficient $k^2$ of the utilized mode can be sufficiently increased to about 5% or more. It is hence understood that spurious interference in resonance characteristics and filter characteristics can be reduced, and that a resonator and a filter each operating over a wider band can be provided. In addition, since a higher acoustic velocity is obtained, the elastic wave device 1 can be operated at a higher frequency.

The results depicted in FIGS. 4 to 10 are obtained under the following preconditions.

The piezoelectric thin film is preferably not mechanically constrained. Modes containing mainly respective displacement components are classified into a basic mode and higher-order modes. For each mode, (1) the acoustic velocity V, (2) the electromechanical coupling coefficient $k^2$, (3) the power flow angle PFA, and (4) the temperature coefficient of resonant frequency TCF are determined as follows.

(1) Acoustic velocity V: The acoustic velocity V is obtained as an acoustic velocity Vm in a short-circuited state where one surface of the piezoelectric thin film is electrically short-circuited and the remaining surface is electrically opened, and as an acoustic velocity Vf in an open state where both the surfaces of the piezoelectric thin film are electrically opened.

(2) Electromechanical coupling coefficient $k^2$ (%): This is obtained from $k^2 = 2 \times (Vf - Vm)/Vm$.

(3) Power flow angle PFA (°): $PFA = \tan^{-1}\{(Vm(\psi+0.5) - Vm(\psi-0.5))/Vm(\psi)\}$ The term "power flow angle" corresponds to an angle representing a difference between the direction of a phase speed of an elastic wave and the direction of a group velocity in which energy of the elastic wave propagates. When the power flow angle is large, the IDT electrode has to be arranged in a state inclined in match with the power flow angle. Accordingly, electrode design is complicated. In addition, a loss caused by an angle deviation is more apt to occur.

(4) Temperature coefficient of resonant frequency TCF (ppm/° C.): This is obtained from $TCF = (Vm(30° C.) - Vm(25° C.)/Vm(25° C.) - \alpha$. Here, Vm(30° C.) means Vm at 30° C., Vm(25° C.) means Vm at 25° C., and α means a coefficient of linear expansion of the piezoelectric film in the direction of an elastic-wave propagation angle.

Euler angles (ϕ, θ, ψ) of the $LiTaO_3$ used in the preferred embodiments of the present invention also involve Euler angles that are equivalent in terms of crystallography. According to The Journal of Acoustical Society of Japan (Vol. 36, No. 3, 1984, pp. 140-145), for example, because $LiTaO_3$ is a crystal belonging to the trigonal 3m-point group, the following formula holds.

$$F(\phi,\theta,\psi) = F(60°+\phi,-\theta,\psi) = F(60°-\phi,-\theta,180°-\psi) = F(\phi, 180°+\theta, 180°-\psi) = F(\phi,\theta,180°+\psi)$$

Here, F is an elastic wave characteristic, such as the acoustic velocity, the electromechanical coupling coefficient $k^2$, TCF, or PFA. When the propagation direction is reversed from the positive to negative direction or vice versa, the sign of PFA is changed, but its absolute value is the same. Accordingly, the absolute value of PFA is taken into consideration.

As an example of a preferred embodiment of the present invention, results obtained with a structure of the $LiTaO_3$ having Euler angles (0°, θ, 0°, in which the Euler angle θ is about 33°, will be described in more detail below with reference to FIGS. 43 to 45 and 58.

Figure 43:
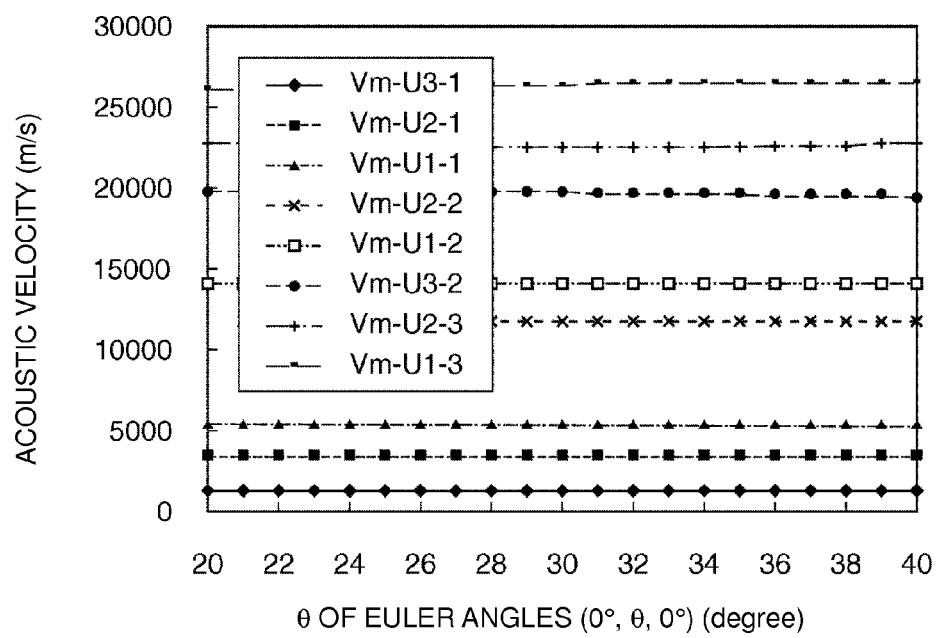
FIG. 43 is a graph depicting the relationship between the acoustic velocity for each of various modes of the plate wave and θ when θ in LiTaO$_3$ having Euler angles (0°, θ, 0° is about 30°.
Figure 44:
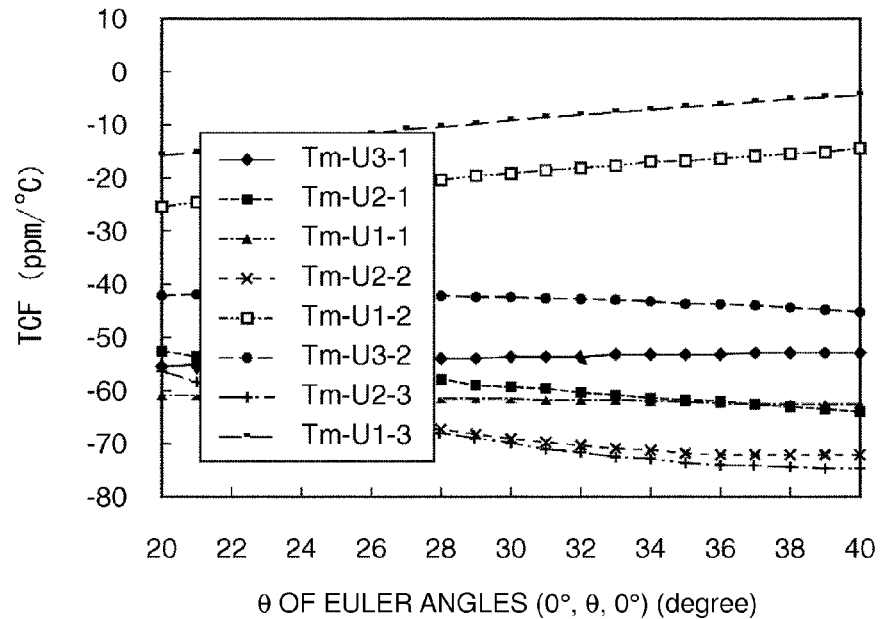
FIG. 44 is a graph depicting the relationship between TCF for each of various modes of the plate wave and θ when θ in LiTaO$_3$ having Euler angles (0°, θ, 0° is about 30°.
Figure 45:
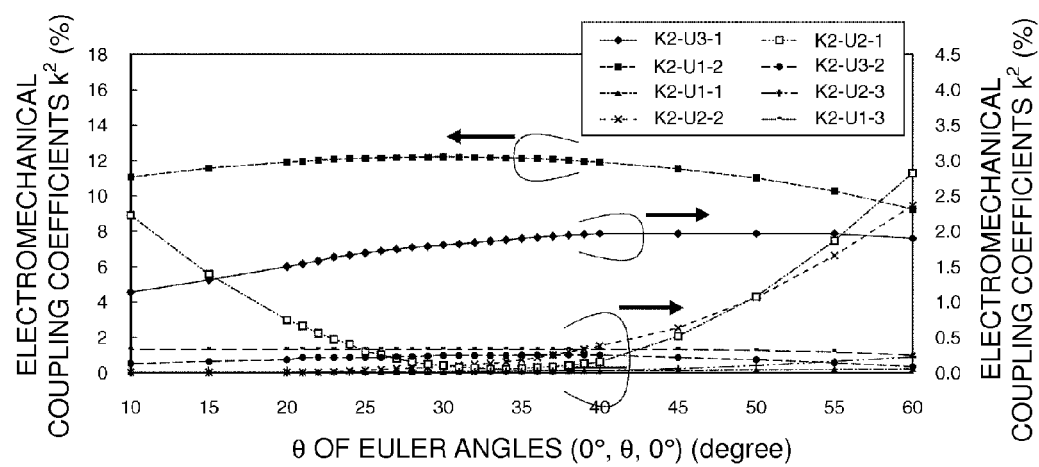
FIG. 45 is a graph depicting the relationship between the electromechanical coupling coefficient k$^2$ for each of various modes of the plate wave and θ when θ in LiTaO$_3$ having Euler angles (0°, θ, 0° is about 30°.

FIGS. 43 to 45 are graphs respectively depicting the relationships of the Euler angle θ with respect to the acoustic velocity V, TCF, and the electromechanical coupling coefficient $k^2$ when 8 of Euler angles (0°, θ, 0° is in a range of about 30°. As seen from FIG. 43, the acoustic velocity of the U1-2 mode is very high, i.e., about 14000 m/sec when the Euler angle θ is in a range of about 20° to about 40°, i.e., 30°±10°. Furthermore, as seen from FIG. 44, TCF is −25 ppm/° C. to −15 ppm/° C., namely its absolute value is about 25 or less, when the Euler angle θ is in a range of about 30°±10°, for example. Thus, the absolute value of TCF is comparatively small in such a range. Moreover, as seen from FIG. 45, the electromechanical coupling coefficient $k^2$ is very high, i.e., about 12% to about 12.5%, when the Euler angle θ is in a range of about 30°±10°, for example. In particular, it is seen that, at θ=33°, the acoustic velocity of the U1-2 mode is about 14070 m/sec, TCF is −17.9 ppm/° C., and the electromechanical coupling coefficient $k^2$ is as high as about 12.2%, for example.

On the other hand, it is seen that the electromechanical coupling coefficient $k^2$ of the U2-1 mode, for example, is 0. Thus, as seen from FIG. 45, the electromechanical coupling coefficients $k^2$ of the other modes are all low, i.e., equal to or less than about 2%. Additionally, the electromechanical coupling coefficient $k^2$ of the U3-1 mode is somewhat high, i.e., 1.9%, at θ=33°. However, such a value is equal to or less than about 2%, and the acoustic velocity of the U3-1 mode is slow. Accordingly, the U3-1 mode can be easily removed by a filter utilizing the difference in the acoustic velocity.

Figure 58:
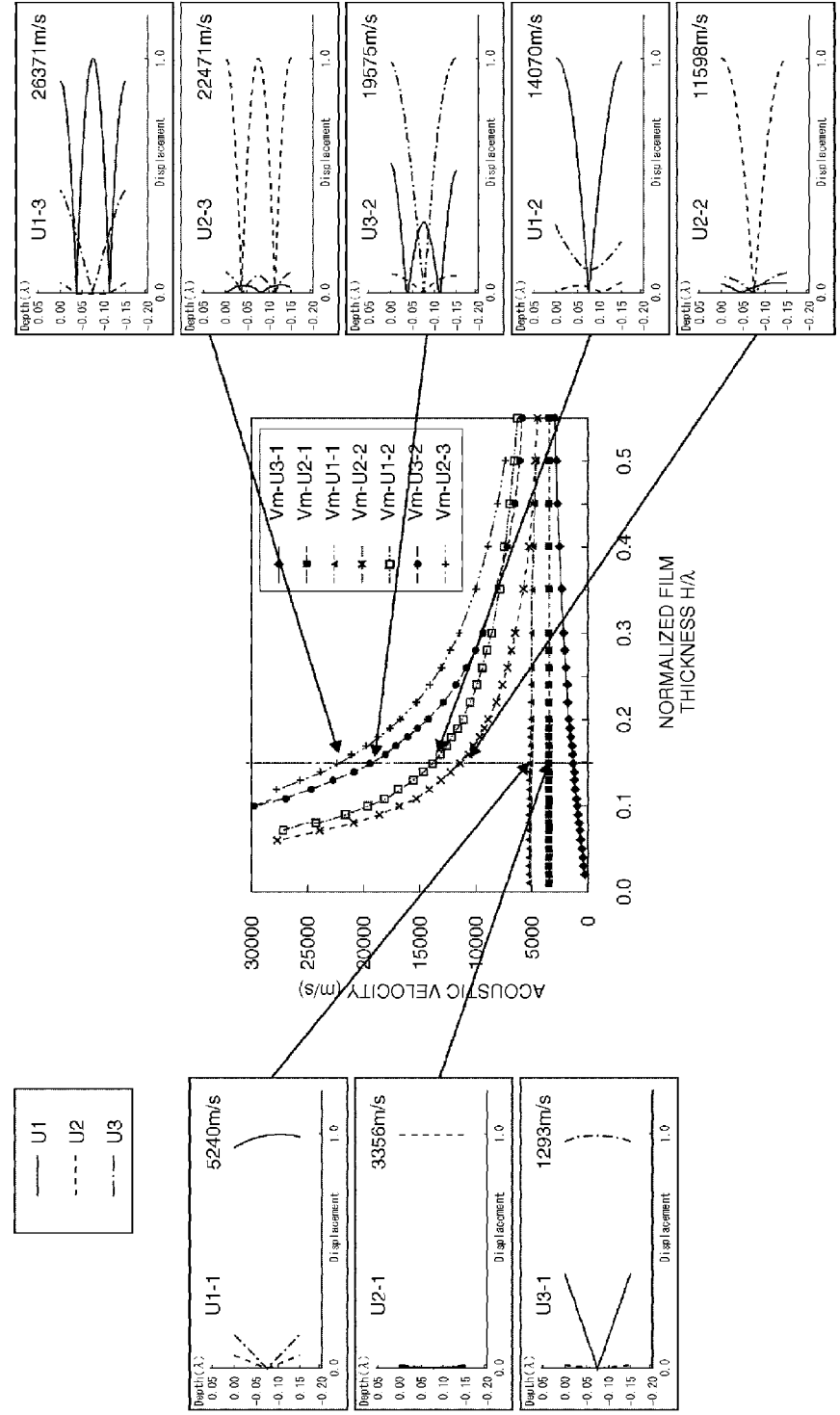
FIG. 58 graphically illustrates, in addition to the relationship between a normalized film thickness H/λ of the piezoelectric thin film, which is made of LiTaO$_3$ having Euler angles (0°, 33°, 0°), and the acoustic velocity, a displacement distribution in the direction of thickness for each of the various modes of the plate wave.

Taking LiTaO$_3$ having Euler angles (0°, 33°, 0°) as a representative example, the acoustic velocity for each of the various modes of the plate wave in the LiTaO$_3$ and an energy distribution in each mode will be described below with reference to FIG. 58. FIG. 58 depicts the relationship between a normalized film thickness H/λ of the LiTaO$_3$ and the acoustic velocity. FIG. 58 further illustrates, on both sides of a graph depicting the relationship between the acoustic velocity and the normalized film thickness, a displacement distribution in the direction of thickness in each mode. The displacement illustrated in FIG. 58 indicates an absolute value of the magnitude. A point where the displacement is zero represents a node and indicates that the direction of the displacement is different between both sides of the point in the direction of thickness. In the U1-2 mode used in preferred embodiments of the present invention, as described above, the acoustic velocity is high, i.e., about 14070 m/sec at Euler angles (0°, 33°, 0°). As seen from FIG. 58, when the U1-2 mode is used, the elastic wave contains mainly the U1 component, but it contains the U2 and U3 components as well. Furthermore, because the main U1 component has one node in the direction of thickness, it is seen that the U1-2 mode is a higher-order mode, i.e., a secondary mode. Additionally, the U1-2 mode corresponds to the mode A$_1$ described in Mizutani, as discussed above. As a reference, the U1-1 mode in FIG. 58 corresponds to the mode S$_0$ described in Mizutani, and the U3-1 mode corresponds to the mode A$_0$ described in Mizutani. In Mizutani, "S$_0$", "A$_0$" are expressed on an assumption that an order number of a basic wave is 0. In this Description, however, "U1-1", "U3-1", for example, are expressed on an assumption that the basic wave is a primary mode.

Furthermore, in Mizutani, the secondary mode is expressed using an order number 1 like "A$_1$". In this Description, however, the secondary mode is expressed by suffixing "-2" like "U1-2".

Figure 46:
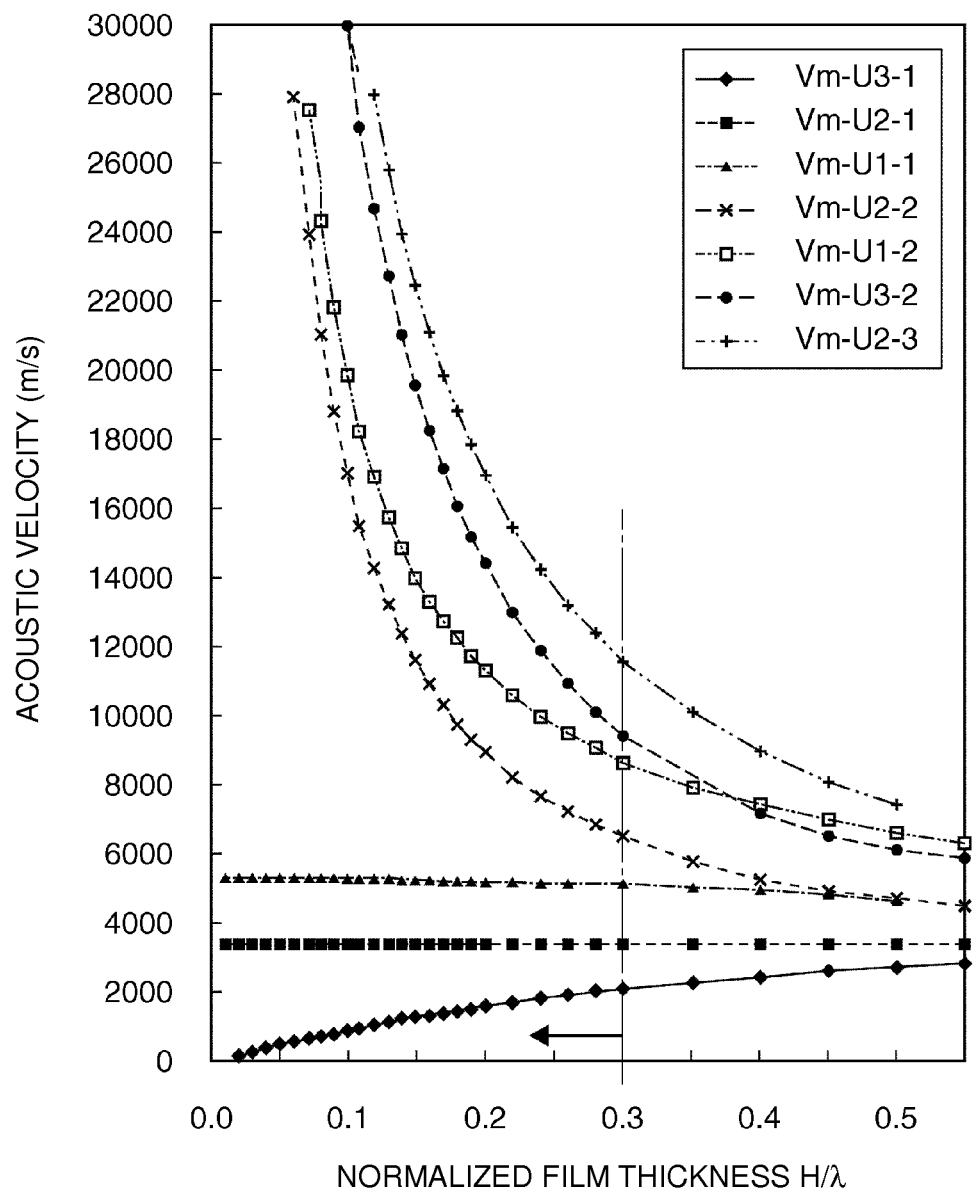
FIG. 46 is a graph depicting the relationship between a normalized film thickness H/λ of a piezoelectric thin film, which is made of LiTaO$_3$ having Euler angles (0°, 33°, 0°), and the acoustic velocity.
Figure 47:
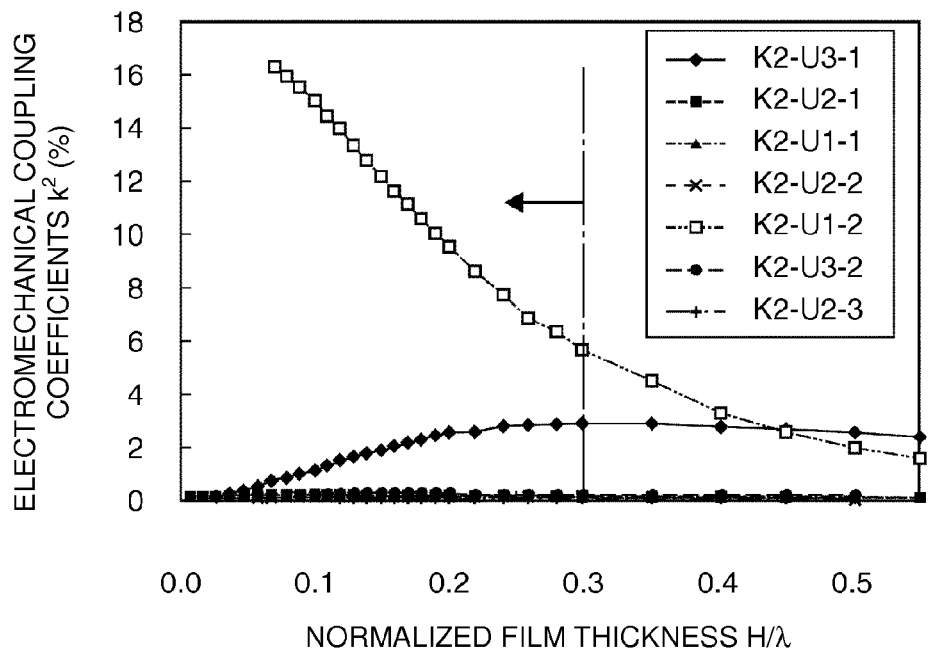
FIG. 47 is a graph depicting the relationship between a normalized film thickness H/λ of the piezoelectric thin film, which is made of LiTaO$_3$ having Euler angles (0°, 33°, 0°), and the electromechanical coupling coefficient k$^2$.
Figure 48:
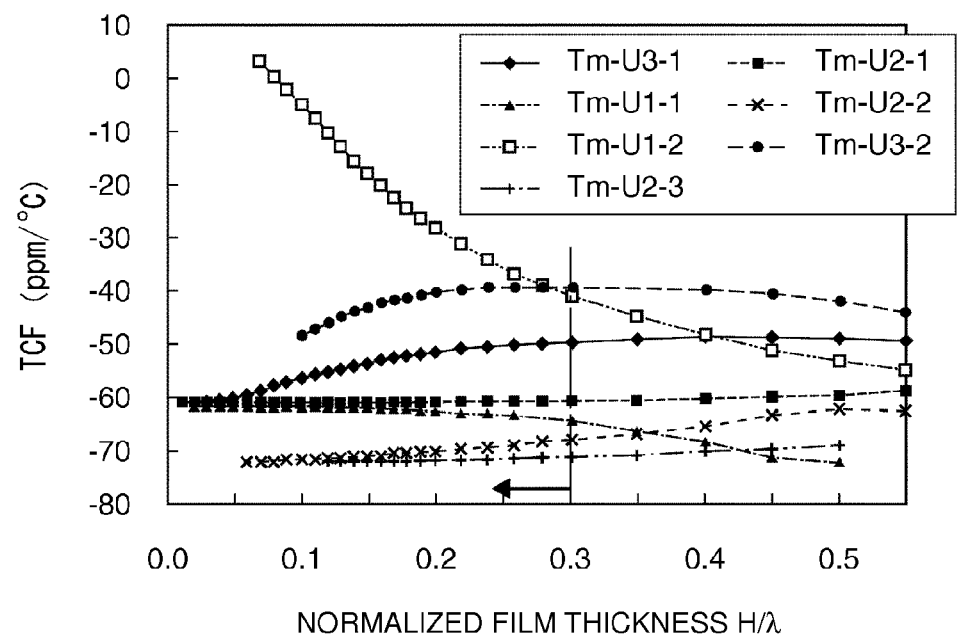
FIG. 48 is a graph depicting the relationship between a normalized film thickness H/λ of the piezoelectric thin film, which is made of LiTaO$_3$ having Euler angles (0°, 33°, 0°), and TCF.

For the case of LiTaO$_3$ having Euler angles (0°, 33°, 0°), FIGS. 46 to 48 respectively depict the relationships of a normalized film thickness H/λ of a LiTaO$_3$ film with respect to the acoustic velocity, the electromechanical coupling coefficient k$^2$, and TCF.

As seen from FIGS. 46 to 48, when the normalized film thickness of the LiTaO$_3$ film is set to be about 0.3 or less, the acoustic velocity and the electromechanical coupling coefficient k$^2$ of the utilized U1-2 mode can be increased to about 8400 m/sec or more and about 5.8% or more, respectively, and the absolute value of TCF can be held at about 42 ppm/° C. or less. Accordingly, it is desired that the normalized film thickness of the LiTaO$_3$ film is preferably set to be about 0.3 or less, for example.

Figure 49:
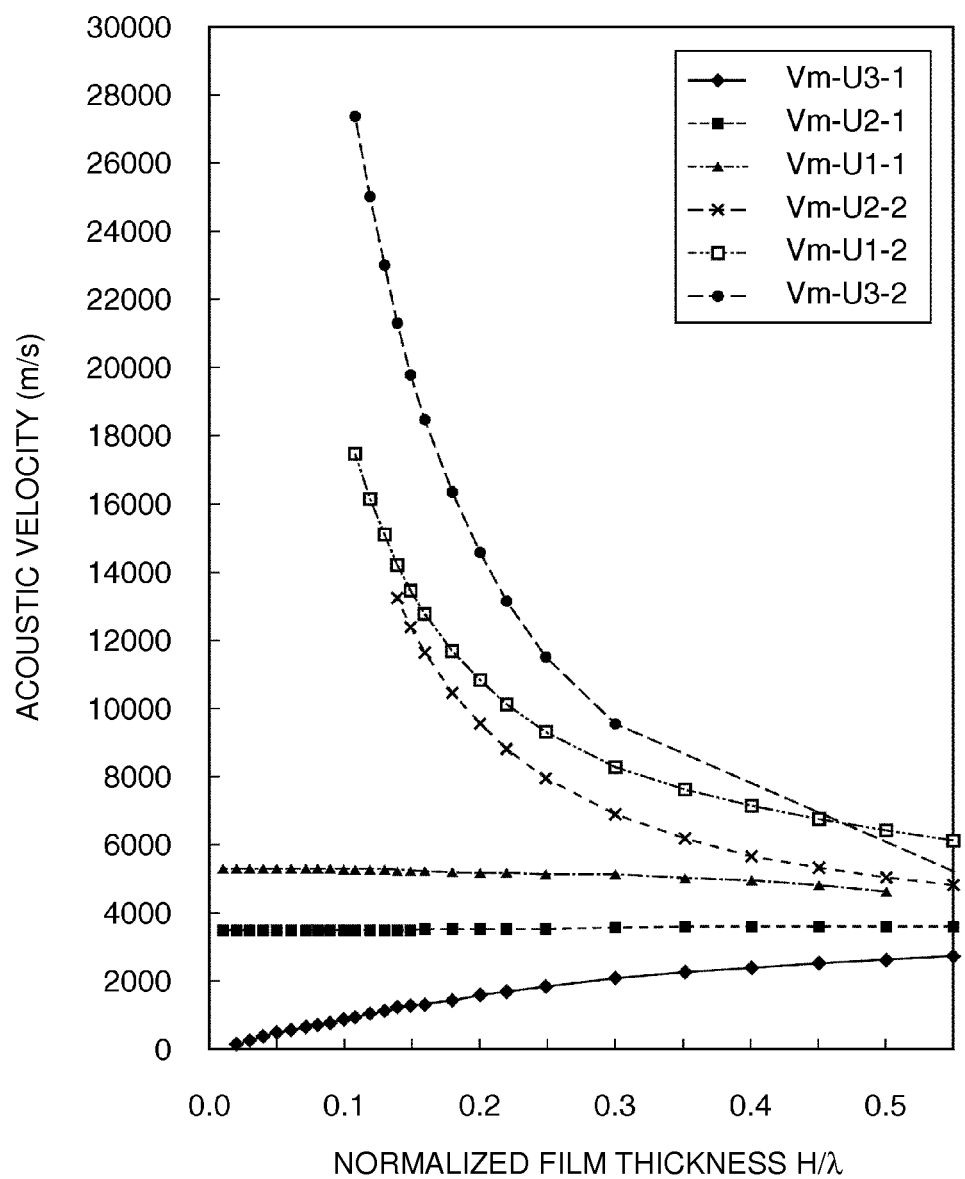
FIG. 49 is a graph depicting the relationship between a normalized film thickness H/λ of a piezoelectric thin film, which is made of LiTaO$_3$ having Euler angles (0°, 0°, 0°), and the acoustic velocity.
Figure 50:
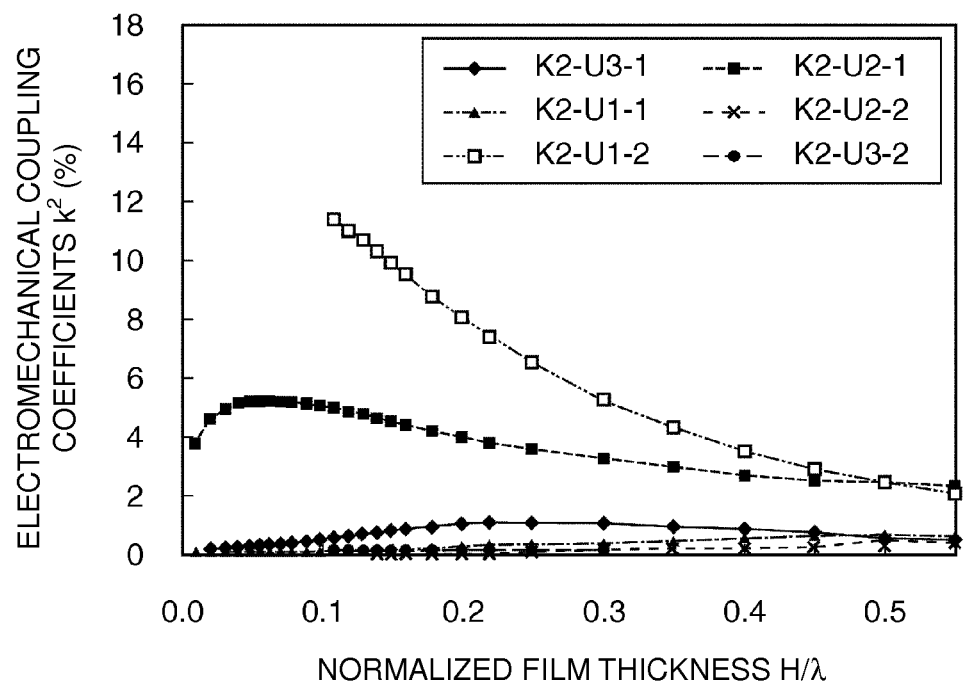
FIG. 50 is a graph depicting the relationship between a normalized film thickness H/λ of the piezoelectric thin film, which is made of LiTaO$_3$ having Euler angles (0°, 0°, 0°), and the electromechanical coupling coefficient k$^2$.
Figure 51:
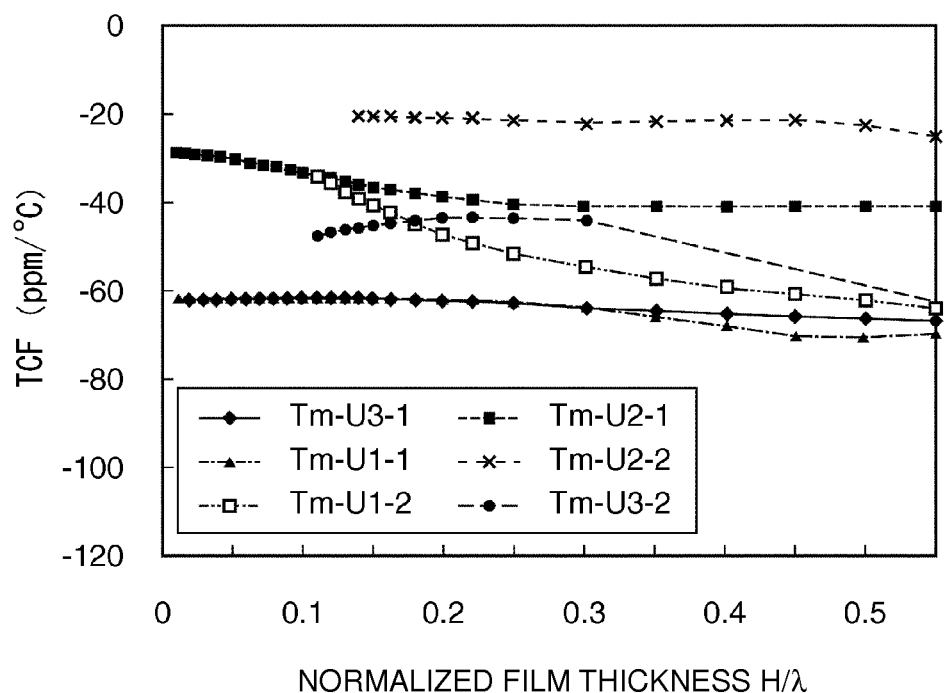
FIG. 51 is a graph depicting the relationship between a normalized film thickness H/λ of the piezoelectric thin film, which is made of LiTaO$_3$ having Euler angles (0°, 0°, 0°), and TCF.

As a comparative example, for the case using LiTaO$_3$ having Euler angles (0°, 0°, 0°), FIGS. 49 to 51 respectively depict the relationships of the normalized film thickness of a LiTaO$_3$ film with respect to the acoustic velocity, the electromechanical coupling coefficient k$^2$, and TCF.

As seen from FIG. 49, in the case of Euler angles (0°, 0°, 0°), the acoustic velocity of the utilized U1-2 mode is also high, i.e., about 8000 m/sec or more, when the normalized film thickness is in a range of about 0.3 or less. As seen from FIG. 50, however, in the case of Euler angles (0°, 0°, 0°), the electromechanical coupling coefficient k$^2$ of the U2-1 mode is increased to about 4% or more when the normalized film thickness is about 0.3 or less, particularly about 0.15 or less. Accordingly, the electromechanical coupling coefficient k$^2$ of the mode becoming the spurious interference cannot be held at about 2% or less in the case of Euler angles (0°, 0°, 0°).

Figure 52:
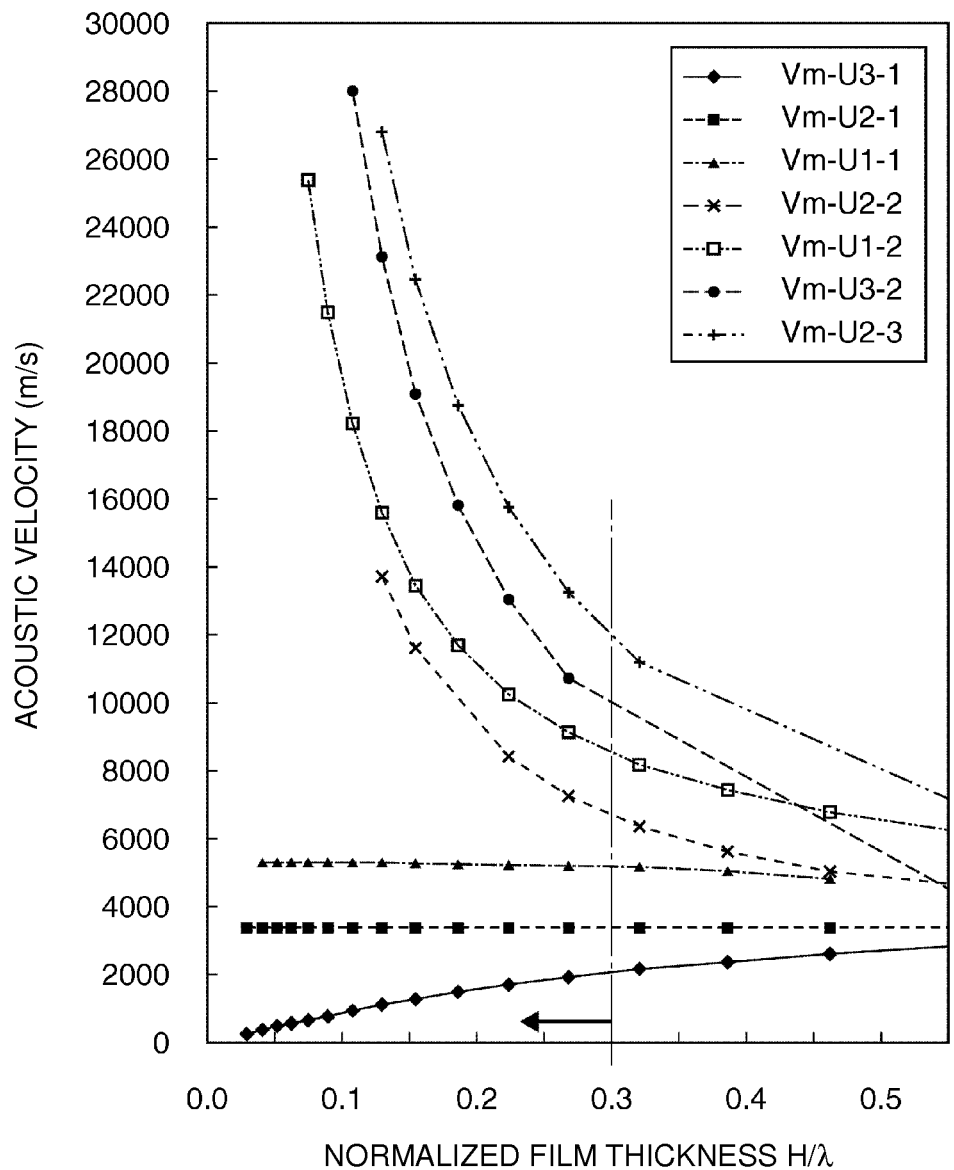
FIG. 52 is a graph depicting the relationship between a normalized film thickness H/λ of a piezoelectric thin film, which is made of LiTaO$_3$ having Euler angles (0°, 15°, 0°), and the acoustic velocity.
Figure 53:
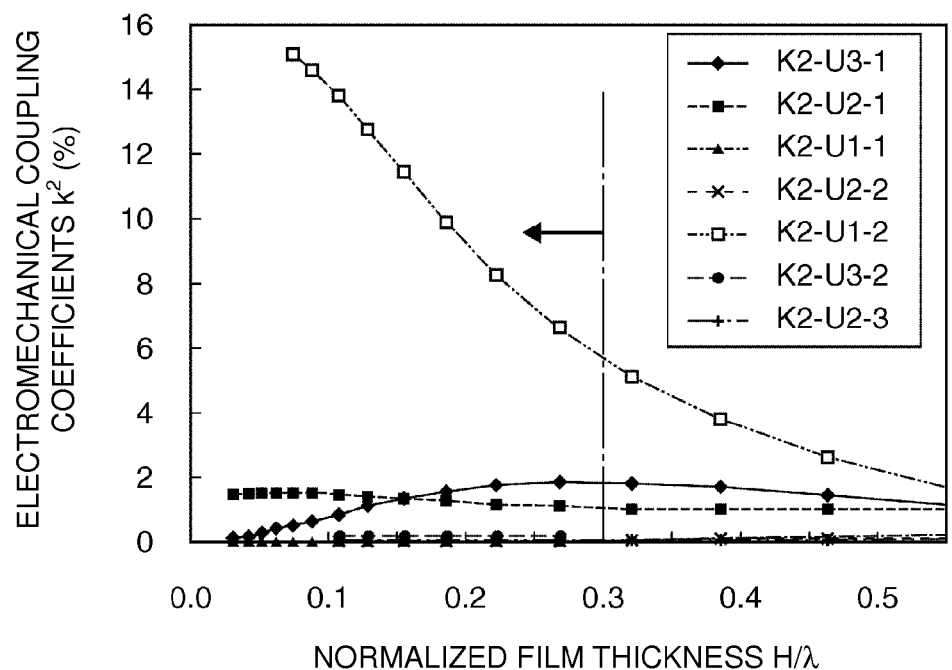
FIG. 53 is a graph depicting the relationship between a normalized film thickness H/λ of the piezoelectric thin film, which is made of LiTaO$_3$ having Euler angles (0°, 15°, 0°), and the electromechanical coupling coefficient k$^2$.
Figure 54:
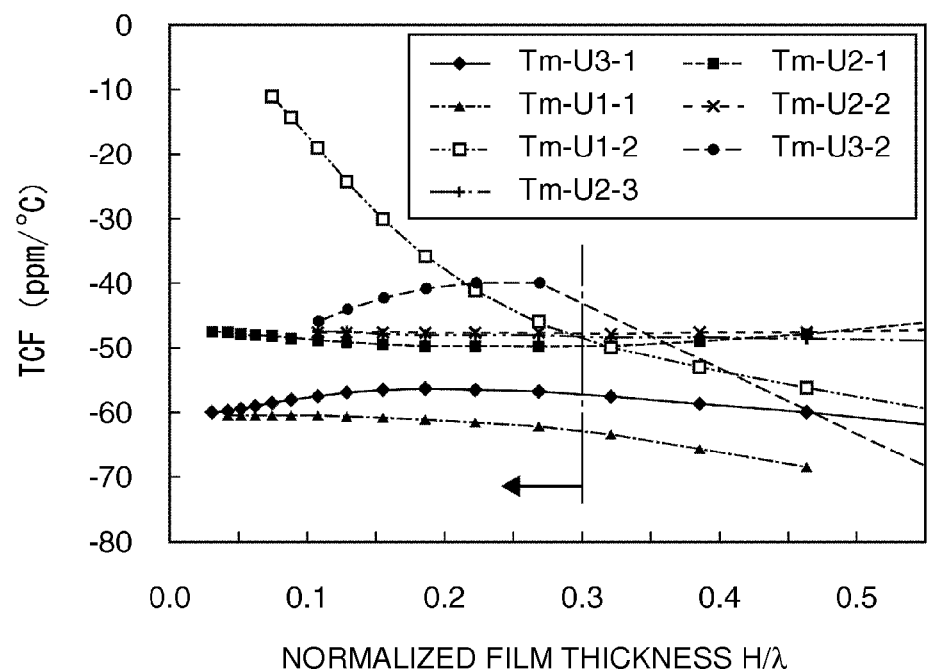
FIG. 54 is a graph depicting the relationship between a normalized film thickness H/λ of the piezoelectric thin film, which is made of LiTaO$_3$ having Euler angles (0°, 15°, 0°), and TCF.

For the case of LiTaO$_3$ having Euler angles (0°, 15°, 0°), FIGS. 52 to 54 respectively depict the relationships of the normalized film thickness of the LiTaO$_3$ with respect to the acoustic velocity, the electromechanical coupling coefficient k$^2$, and TCF for each of the various modes.

As seen from FIG. 52, when the normalized film thickness of the LiTaO$_3$ is in a range of about 0.3 or less, the acoustic velocity of the utilized U1-2 mode is high, i.e., about 8200 m/sec or more. Looking at the electromechanical coupling coefficient k$^2$, when the normalized film thickness of the LiTaO$_3$ is about 0.3 or less, the electromechanical coupling coefficient k$^2$ of the U1-2 mode is also high, i.e., about 5.8% or more, and the electromechanical coupling coefficients k$^2$ of the other modes becoming the spurious are small, i.e., about 2% or less. Looking at TCF, as seen from FIG. 54, when the normalized film thickness is about 0.3 or less, the absolute value of TCF of the U1-2 mode is small, i.e., about 52 ppm/° C. or less. Accordingly, in the case of Euler angles (0°, 15°, 0°), a high acoustic velocity can be obtained and an influence of the spurious can be suppressed as in the case of (0°, 33°, 0°) by setting the normalized film thickness of the LiTaO$_3$ film to be 0.3 or less. It is further understood that an elastic wave device having good temperature characteristics can be obtained.

Figure 55:
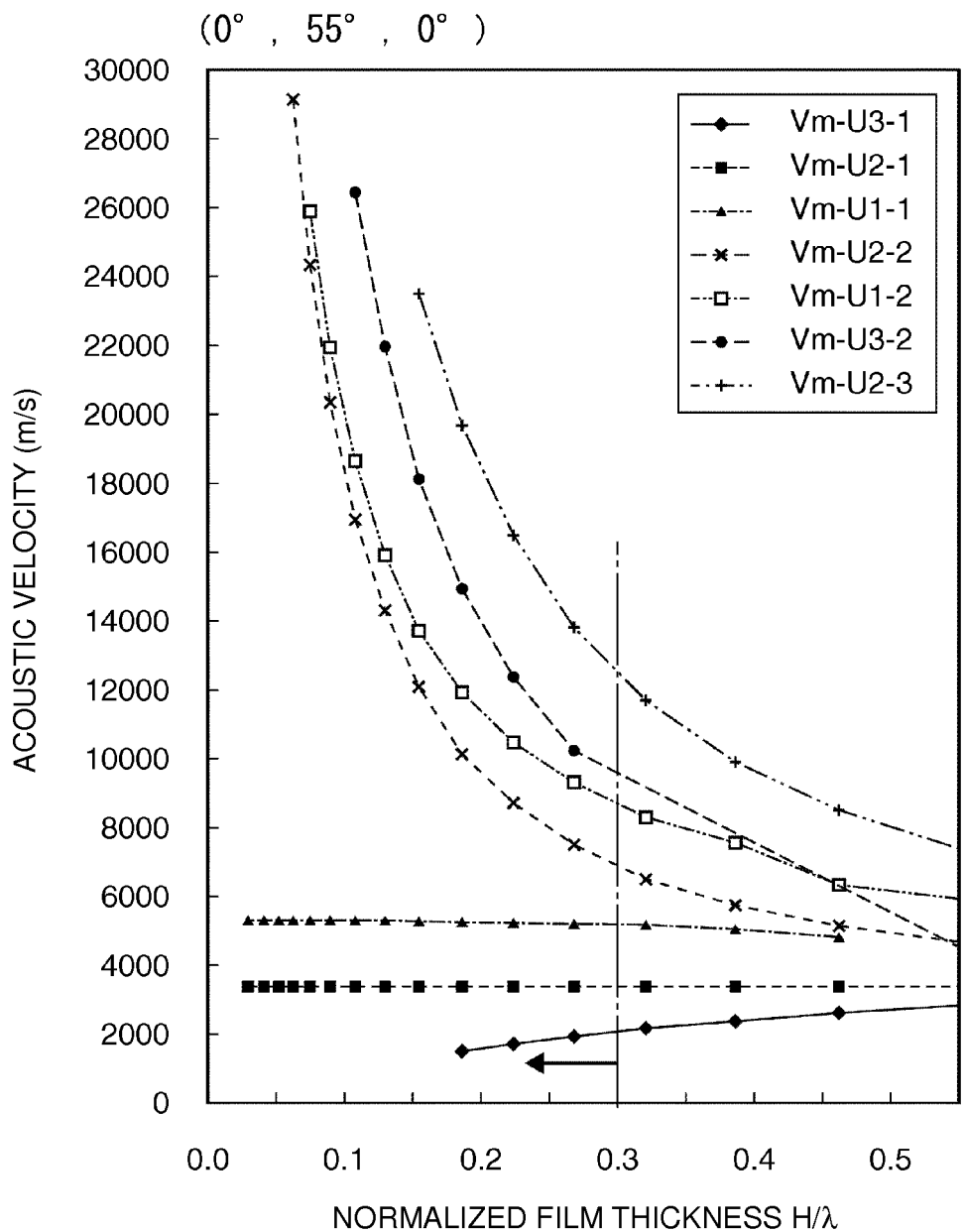
FIG. 55 is a graph depicting the relationship between a normalized film thickness H/λ of a piezoelectric thin film, which is made of LiTaO$_3$ having Euler angles (0°, 55°, 0°), and the acoustic velocity.
Figure 56:
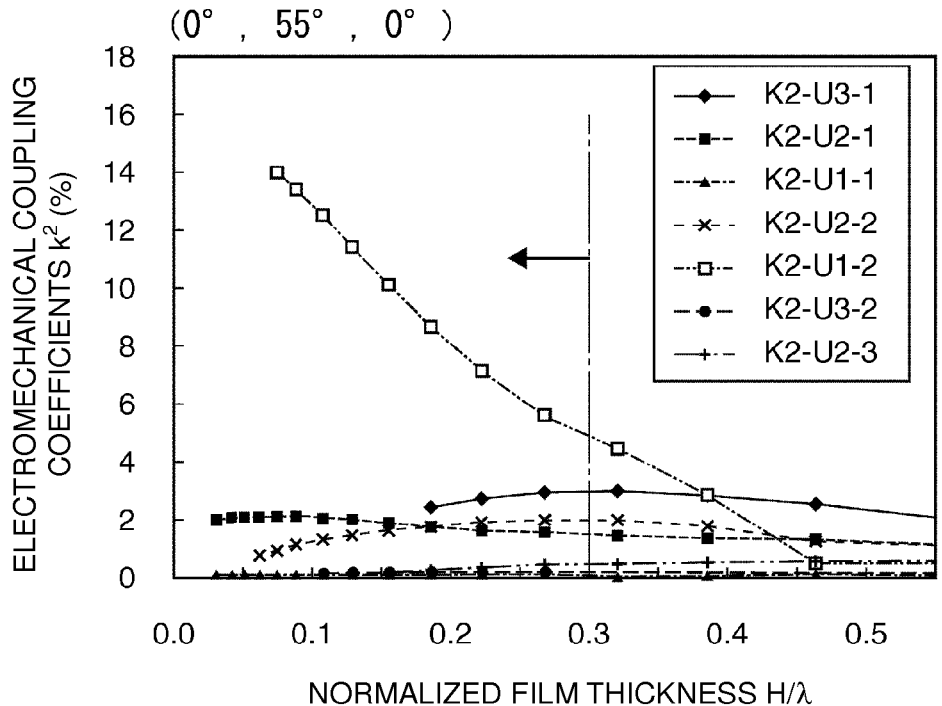
FIG. 56 is a graph depicting the relationship between a normalized film thickness H/λ of the piezoelectric thin film, which is made of LiTaO$_3$ having Euler angles (0°, 55°, 0°), and the electromechanical coupling coefficient k$^2$.
Figure 57:
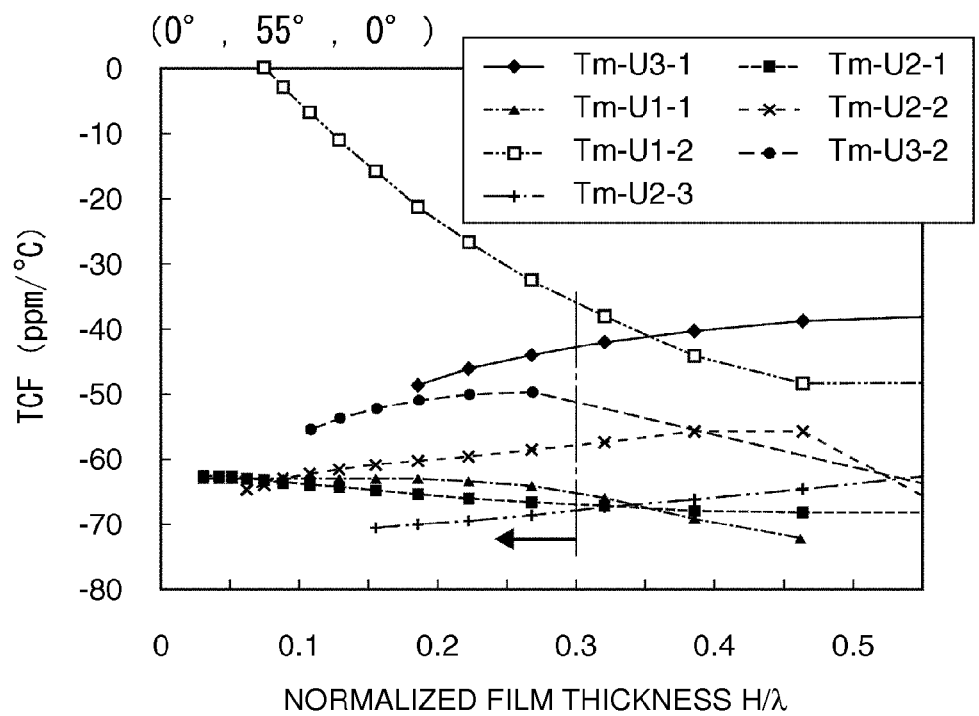
FIG. 57 is a graph depicting the relationship between a normalized film thickness H/λ of the piezoelectric thin film, which is made of LiTaO$_3$ having Euler angles (0°, 55°, 0°), and TCF.

For the case using LiTaO$_3$ having Euler angles (0°, 15°, 0°), FIGS. 55 to 57 respectively depict the relationships of the normalized film thickness of a LiTaO$_3$ film with respect to the acoustic velocity, the electromechanical coupling coefficient k$^2$, and TCF for each of the various modes.

As seen from FIGS. 55 to 57, in the case of Euler angles (0°, 55°, 0°), the acoustic velocity of the U1-2 mode can be increased to about 8500 m/sec or more, the electromechanical coupling coefficient k$^2$ can be increased to about 5% or more, and the absolute value of TCF can be held less than about 35 ppm/° C. by setting the normalized film thickness of the LiTaO$_3$ film to be about 0.3 or less. Moreover, as seen from FIG. 56, the electromechanical coupling coefficients k$^2$ of the other modes except for the U3-1 mode can be held at about 2% or less by setting the normalized film thickness to be about 0.3 or less. The U3-1 mode can be easily removed, as described above, by a filter utilizing the difference in the acoustic velocity.

Figure 59:
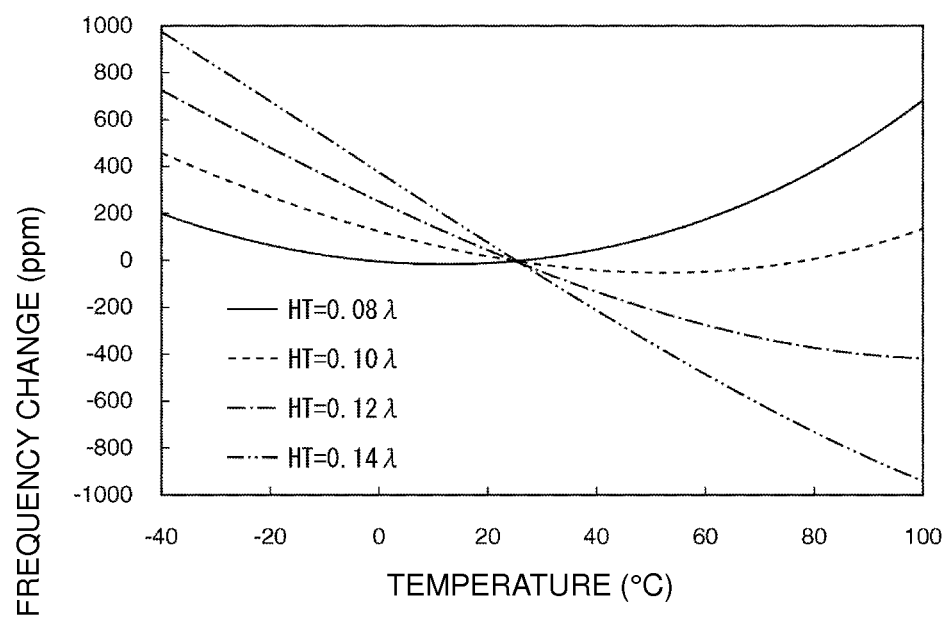
FIG. 59 is a graph depicting temperature characteristics of resonant frequency of LiTaO$_3$ having Euler angles (0°, 33°, 0°).

FIG. 59 is a graph depicting the relationship between the normalized film thickness and the temperature characteristics of resonant frequency TCF of LiTaO$_3$ having Euler angles (0°, 33°, 0°).

FIG. 59 depicts the results obtained when the normalized film thickness of the LiTaO$_3$ film is about 0.08, about 0.10, about 0.12, and about 0.14, for example. As seen from FIG. 59, when the normalized film thickness of the LiTaO$_3$ film is about 0.08 to about 0.10, a frequency change is small over a wide temperature range of about −40° C. to about +100° C. In such a range, an absolute value of the frequency change is about 1000 ppm or less. Accordingly, the absolute value of TCF can be held effectively small even in consideration of a secondary temperature coefficient. It is hence desired that, from the viewpoint of further improving the temperature characteristics, the thickness of LiTaO$_3$ is in a range of about 0.08 to about 0.10 in terms of the normalized film thickness (H/λ).

Figure 60:
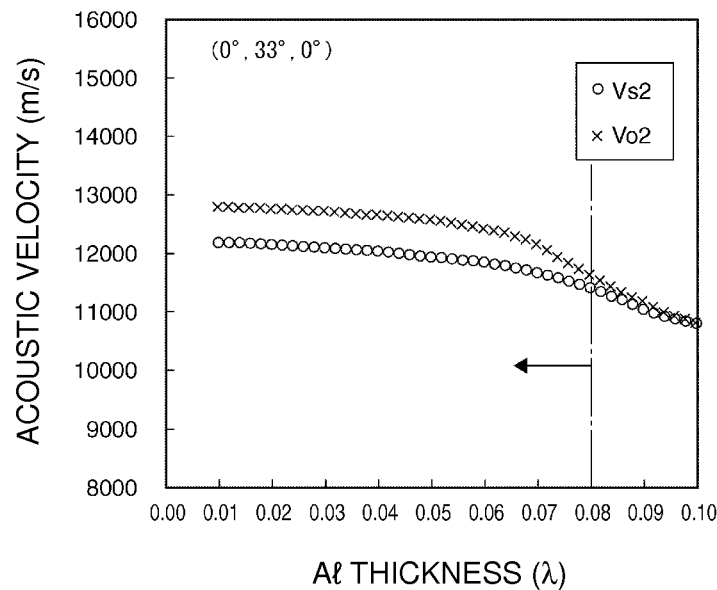
FIG. 60 is a graph depicting the relationship between an Al thickness and the acoustic velocity when an IDT electrode made of Al is provided on one surface of a piezoelectric thin film made of LiTaO$_3$ having Euler angles (0°, 33°, 0°).
Figure 61:
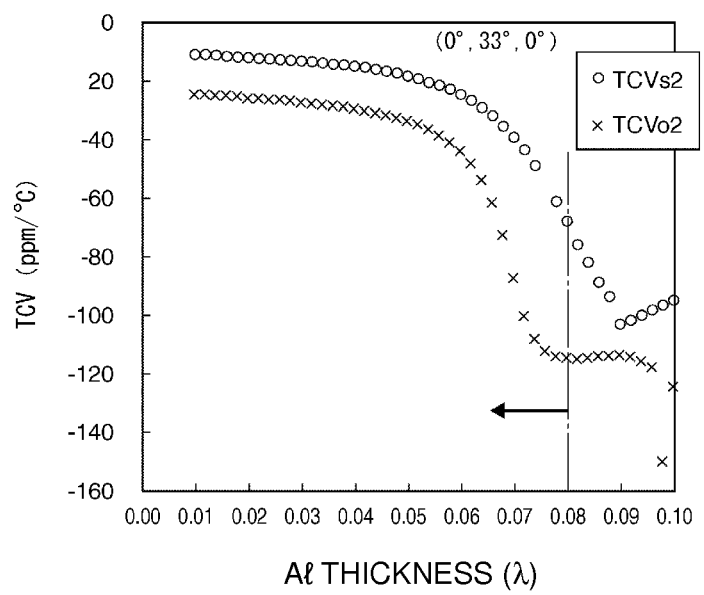
FIG. 61 is a graph depicting the relationship between an Al thickness and TCV when the IDT electrode made of Al is provided on one surface of the piezoelectric thin film made of LiTaO$_3$ having Euler angles (0°, 33°, 0°).
Figure 62:
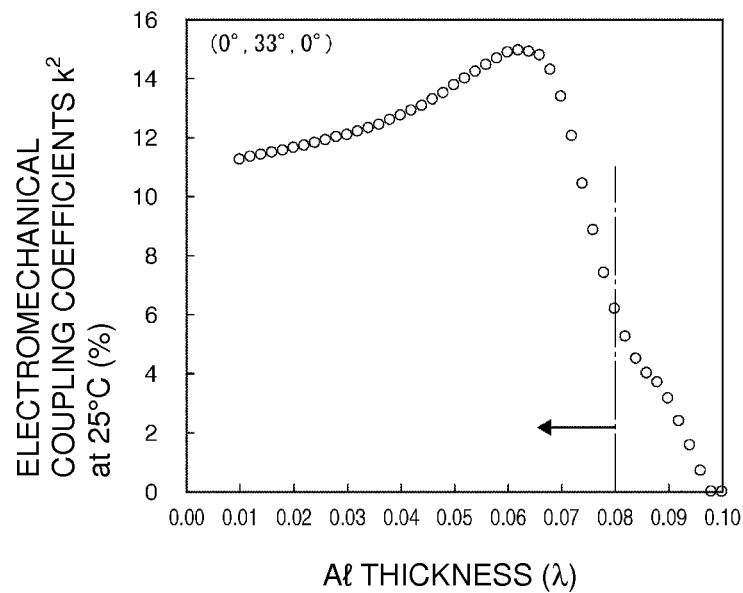
FIG. 62 is a graph depicting the relationship between an Al thickness and the electromechanical coupling coefficient k$^2$ when the IDT electrode made of Al is provided on one surface of the piezoelectric thin film made of LiTaO$_3$ having Euler angles (0°, 33°, 0°).

An influence of the thickness of an Al film was examined when Al was used as a metal defining the IDT electrode 5. As preconditions, LiTaO$_3$ having Euler angles (0°, 33°, 0°) was used and the normalized film thickness thereof was set to about 0.15. A Duty value of the IDT electrode was set to about 0.5. FIGS. 60 to 62 respectively depict the relationships of the thickness of the aluminum film in the above-mentioned structure with respect to the acoustic velocity, TCV: TCV=(V(30° C.)−V(25° C.)/V(25° C.)), and the electromechanical coupling coefficient $k^2$ at about 25° C. In FIGS. 60 and 61, $V_S2$ represents the acoustic velocity in the short-circuited state corresponding to a resonance point, and $V_O2$ represents the acoustic velocity in the open state corresponding to an anti-resonance point. Furthermore, in FIG. 61, $TCV_S2$ represents TCV in the short-circuited state corresponding to a resonance point, and $TCV_O2$ represents TCV in the open state corresponding to an anti-resonance point.

As seen from FIGS. 60 to 62, when the normalized film thickness of the aluminum film is set to be about 0.08 or less, the electromechanical coupling coefficient $k^2$ can be increased to about 6% or more, and $V_S2$ and $V_O2$ can be both increased to about 11400 m/sec or more. Moreover, absolute values of $TCV_S2$ and $TCV_O2$ can be held respectively at about 70 ppm/° C. or less and about 118 ppm/° C. or less.

Figure 63:
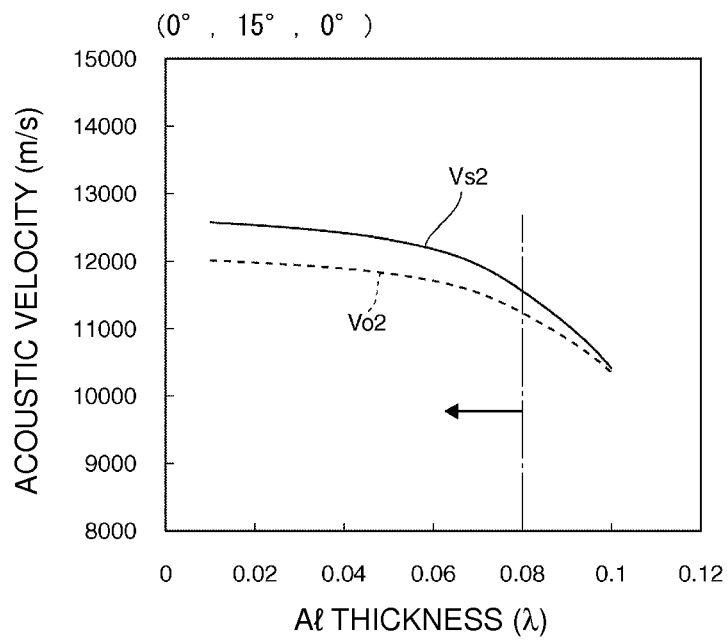
FIG. 63 is a graph depicting the relationship between an Al thickness and the acoustic velocity when the IDT electrode made of Al is provided on one surface of a piezoelectric thin film made of LiTaO$_3$ having Euler angles (0°, 15°, 0°).
Figure 64:
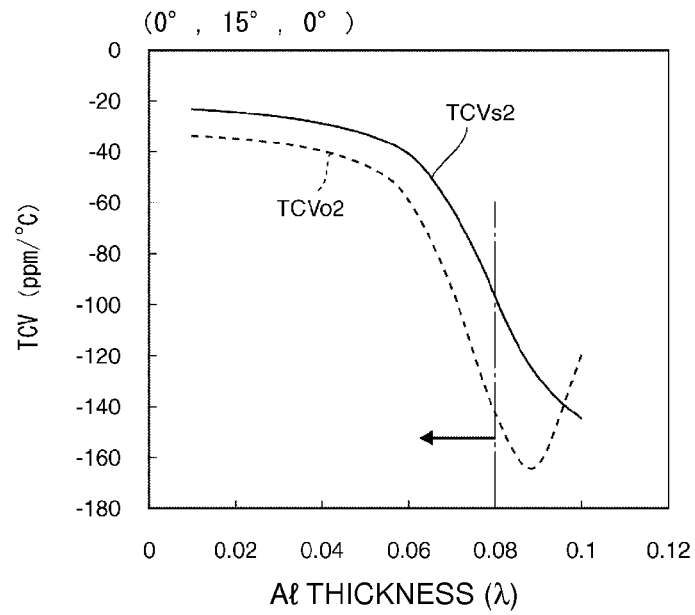
FIG. 64 is a graph depicting the relationship between an Al thickness and TCV when the IDT electrode made of Al is provided on one surface of the piezoelectric thin film made of LiTaO$_3$ having Euler angles (0°, 15°, 0°).
Figure 65:
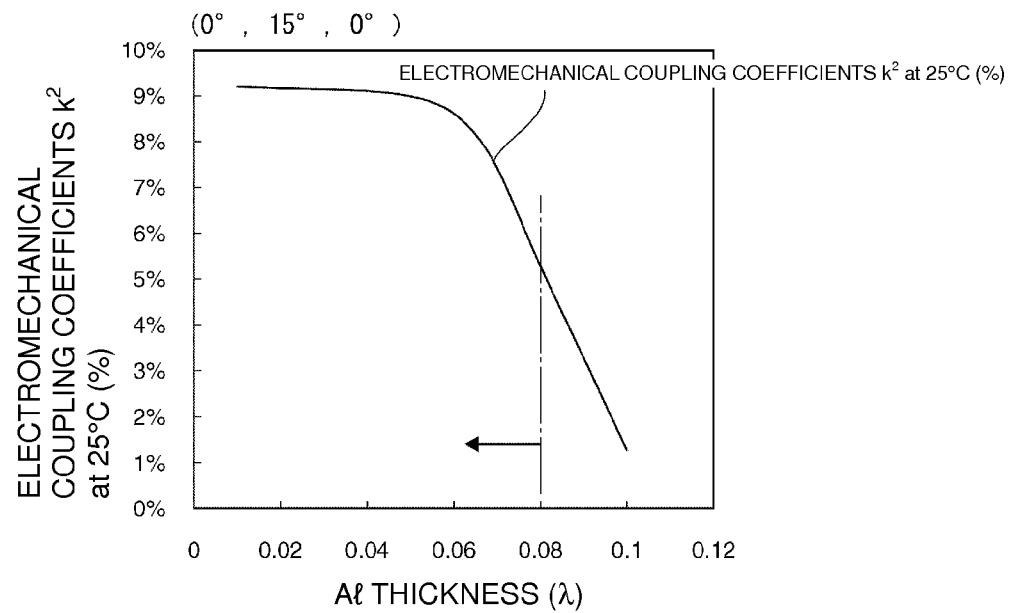
FIG. 65 is a graph depicting the relationship between an Al thickness and the electromechanical coupling coefficient k$^2$ when the IDT electrode made of Al is provided on one surface of the piezoelectric thin film made of LiTaO$_3$ having Euler angles (0°, 15°, 0°).
Figure 66:
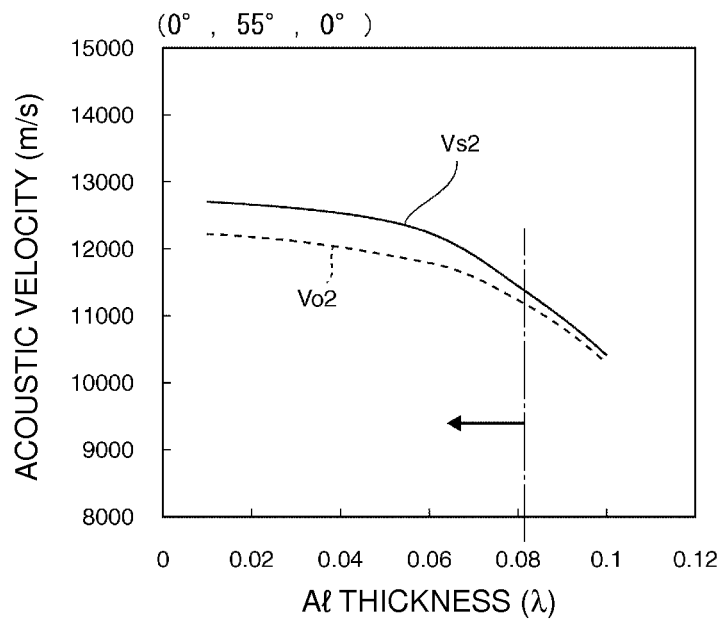
FIG. 66 is a graph depicting the relationship between an Al thickness and the acoustic velocity when the IDT electrode made of Al is provided on one surface of a piezoelectric thin film made of LiTaO$_3$ having Euler angles (0°, 55°, 0°).
Figure 67:
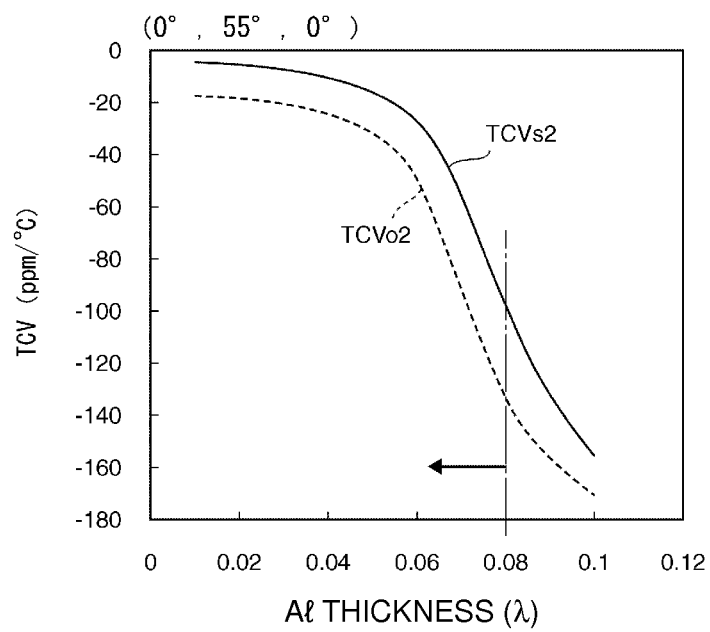
FIG. 67 is a graph depicting the relationship between an Al thickness and TCV when the IDT electrode made of Al is provided on one surface of the piezoelectric thin film made of LiTaO$_3$ having Euler angles (0°, 55°, 0°).
Figure 68:
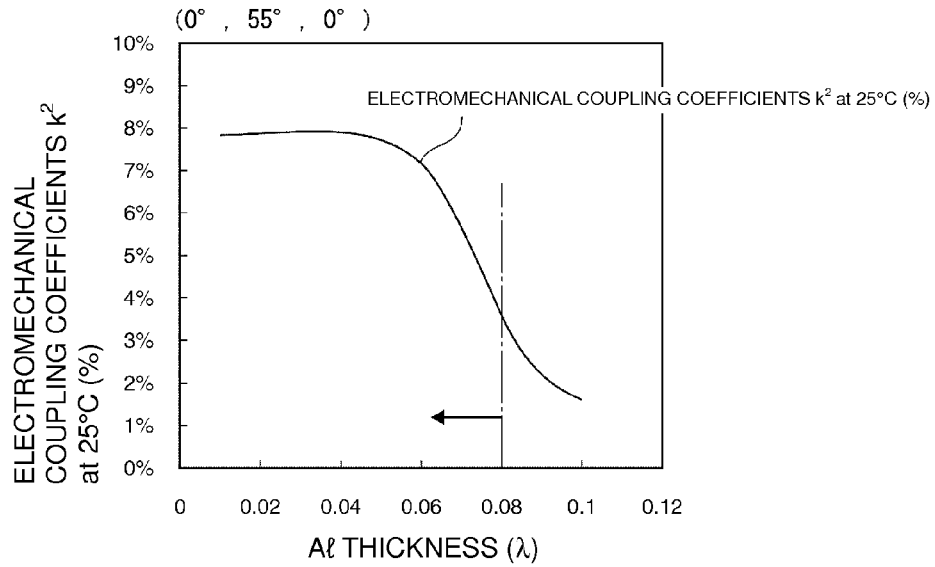
FIG. 68 is a graph depicting the relationship between an Al thickness and the electromechanical coupling coefficient k$^2$ when the IDT electrode made of Al is provided on one surface of the piezoelectric thin film made of LiTaO$_3$ having Euler angles (0°, 55°, 0°).

FIGS. 63 to 65 respectively depict the relationships of the film thickness of an Al film with respect to the acoustic velocity, TCV, and the electromechanical coupling coefficient $k^2$ at about 25° C., as in FIGS. 60 to 62, except for setting the Euler angles to (0°, 15°, 0°). FIGS. 66 to 68 depict the results obtained in a similar manner to those depicted in FIGS. 60 to 62 except for modifying the Euler angles to (0°, 55°, 0°).

As seen from FIGS. 63 to 65 and FIGS. 66 to 68, also in the cases of Euler angles (0°, 15°, 0°) and (0°, 55°, 0°, a high acoustic velocity can be obtained, the absolute values of $TCV_S2$ and $TCV_O2$ can be both held small, and the electromechanical coupling coefficient $k^2$ can be increased by setting the normalized film thickness of the Al film to be about 0.08 or less.

Thus, it is understood that, even when the Euler angles are modified, it is also desirable that the normalized film thickness of the Al film is about 0.08 or less.

In accordance with preferred embodiments of the present invention, the acoustic velocity, the electromechanical coupling coefficient $k^2$, and the power flow angle were determined for each of the various modes while a metal forming the IDT electrode 5 were variously changed with the thickness of a metal film set to about 0.02λ. The Euler angles of LiTaO₃ were set to (0°, 33°, 0°), and the film thickness thereof was set to about 0.15λ. The obtained results are listed in Table 5 given below.

Note that the power flow angle PFA is 0° in all the cases listed in Table 5. As seen from Table 5, when any of Al, Ti, Fe, Cu, Mo, Ag, Ta, Au, W and Pt is used, the electromechanical coupling coefficient $k^2$ of each of the U2-1, U1-2, U2-2, and U3-1 modes is low, i.e., about 2% or less. It is hence understood that an electrode material is not limited to particular one, and that the influence of the other modes becoming the spurious interference can be effectively suppressed and the absolute value of PFA can be held small regardless of whether to use any of the above-mentioned metals.

Figure 2:
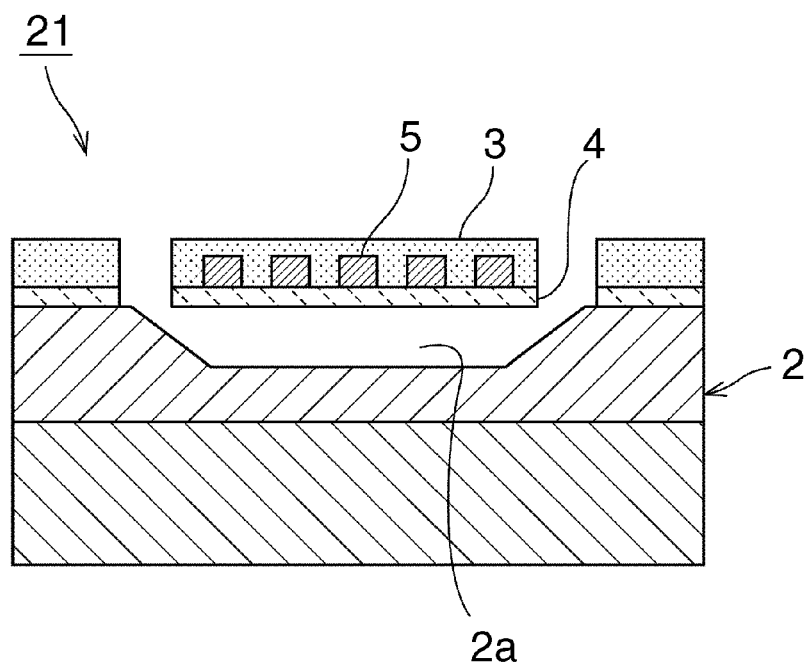
FIG. 2 is a schematic elevational cross-sectional view of a principal portion of an elastic wave device according to a second preferred embodiment of the present invention.

FIG. 2 is a schematic elevational cross-sectional view of a principal portion of an elastic wave device according to a second preferred embodiment of the present invention. FIG. 2 includes similar elements to the schematic cross-sectional view of FIG. 1A illustrating the first preferred embodiment of the present invention.

In an elastic wave device 21, a dielectric film 3 is defined on an upper surface of the piezoelectric thin film 4. Stated in another way, the dielectric film 3 is arranged so as to cover the IDT electrode 5. Thus, in the second preferred embodiment of the present invention, the dielectric film 3 may be defined on the upper surface of the piezoelectric thin film 4.

Figure 3A:
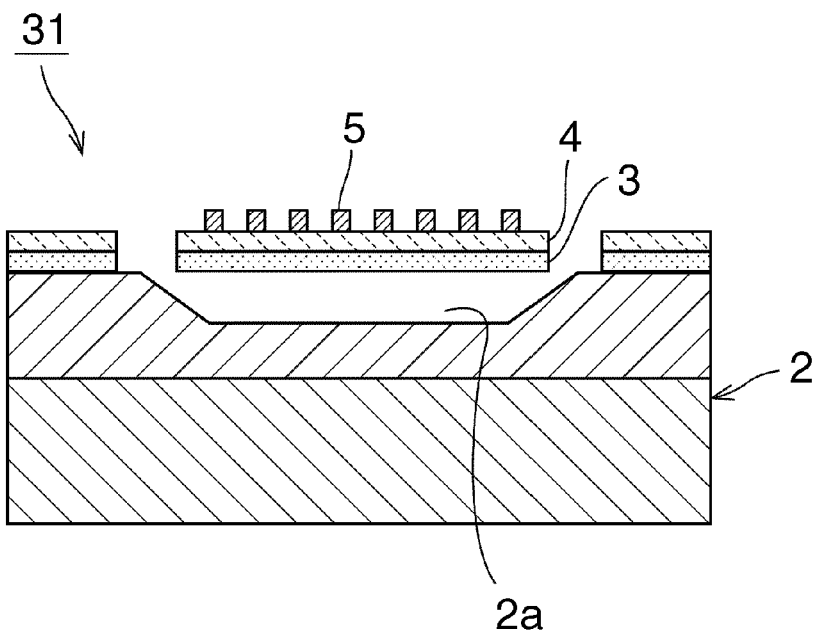
FIG. 3A is a schematic elevational cross-sectional view of a principal portion of an elastic wave device according to a third preferred embodiment of the present invention.
Figure 3B:
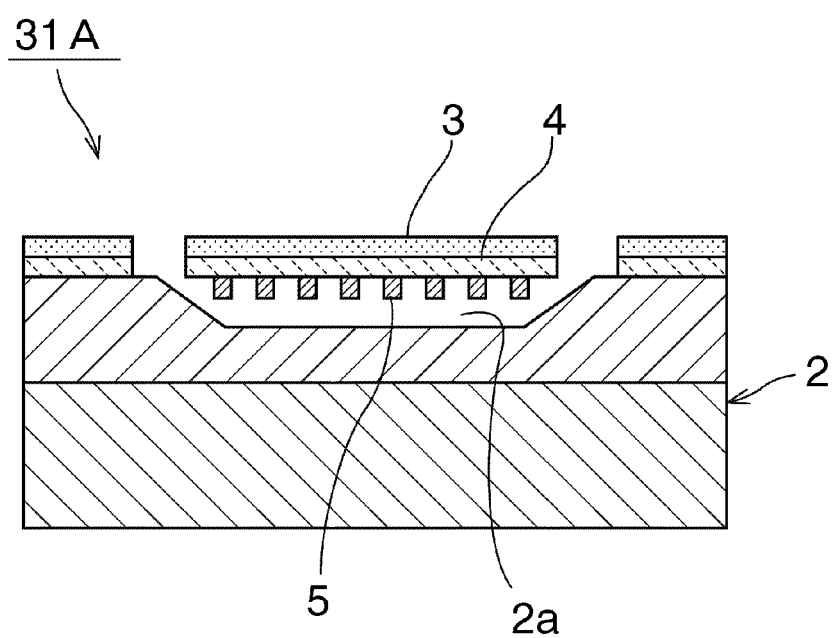
FIG. 3B is a schematic elevational cross-sectional view of a modification thereof.

FIGS. 3A and 3B are schematic elevational cross-sectional views of elastic wave devices according to a third preferred embodiment of the present invention and a modification thereof, respectively. Each of FIGS. 3A and 3B includes similar elements to the schematic cross-sectional view of FIG. 1A illustrating the first preferred embodiment.

In an elastic wave device 31 according to the third preferred embodiment, a dielectric film 3 is defined on the lower surface side of the piezoelectric thin film 4. Likewise, in an elastic wave device 31A, illustrated in FIG. 3B, according to the modification of the third preferred embodiment, the IDT electrode 5 may be defined on a lower surface of the piezoelectric thin film 4. Stated in another way, in the modification of the third preferred embodiment, the IDT electrode 5 is arranged to be positioned in the space defined by the recess 2a. Thus, the IDT electrode 5 may be defined on the lower surface of the piezoelectric thin film 4.

Furthermore, in FIG. 3B, the dielectric film 3 is laminated on the piezoelectric thin film 4.

While the dielectric film 3 is defined on one of the upper surface and the lower surface of the piezoelectric thin film 4 in the second and third preferred embodiments, the dielectric film 3 may be defined on both the upper and lower surfaces. It is to be noted that, in the preferred embodiments of the present invention, the dielectric film 3 is not essential

TABLE 5

|  |  | Metal | | | | | | | | | |
| --- | --- | --- | --- | --- | --- | --- | --- | --- | --- | --- | --- |
|  |  | Al | Ti | Fe | Cu | Mo | Ag | Ta | Au | W | Pt |
|  | Density [g/cm³] | 2.70 | 4.50 | 7.87 | 8.93 | 10.20 | 10.49 | 16.60 | 19.26 | 19.30 | 21.45 |
| k² [%] | U3-1 | 2.1 | 2.2 | 2.3 | 2.3 | 2.8 | 2.2 | 2.3 | 2.2 | 2.9 | 2.4 |
|  | U2-1 | 0.0 | 0.0 | 0.0 | 0.0 | 0.0 | 0.0 | 0.0 | 0.0 | 0.0 | 0.0 |
|  | U1-1 | 0.0 | 0.0 | 0.0 | 0.1 | 0.1 | 0.1 | 0.2 | 0.3 | 0.0 | 0.3 |
|  | U2-2 | 0.2 | 0.2 | 0.2 | 0.2 | 0.2 | 0.2 | 0.2 | 0.1 | 0.2 | 0.1 |
|  | U1-2 | 12.8 | 13.1 | 13.4 | 13.4 | 13.2 | 12.9 | 13.6 | 11.4 | 13.5 | 12.9 |
|  | U3-2 | 0.3 | 0.4 | 0.6 | 0.6 | 0.5 | 1.0 | 0.8 | 1.6 | 0.6 | 1.0 |
| Vm [m/s] | U3-1 | 1,364 | 1,395 | 1,379 | 1,369 | 1,534 | 1,301 | 1,300 | 1,218 | 1,453 | 1,281 |
|  | U2-1 | 3,345 | 3,338 | 3,259 | 3,238 | 3,337 | 3,210 | 3,144 | 2,931 | 3,240 | 2,964 |
|  | U1-1 | 5,244 | 5,240 | 5,139 | 5,098 | 5,399 | 4,952 | 4,818 | 4,604 | 5,113 | 4,689 |
|  | U2-2 | 11,075 | 10,760 | 10,202 | 10,045 | 10,000 | 9,711 | 9,226 | 8,658 | 9,136 | 8,745 |
|  | U1-2 | 13,492 | 13,136 | 12,456 | 12,258 | 12,394 | 11,771 | 11,211 | 10,410 | 11,250 | 10,650 |
|  | U3-2 | 18,550 | 17,947 | 17,003 | 16,705 | 16,562 | 16,177 | 15,276 | 14,637 | 15,033 | 14,622 | and it may be dispensed with. The dielectric film 3 can preferably be made of an appropriate dielectric material, such as, for example, silicon oxide, silicon nitride, or aluminum nitride.

In the structure including the dielectric film 3, frequency adjustment can be performed by grinding the dielectric film 3 with, e.g., ion milling. In such a case, the frequency adjustment can be facilitated. Accordingly, in the second preferred embodiment and the modification (FIG. 3B) of the third preferred embodiment in which the dielectric film 3 is exposed at the top surface, the frequency adjustment can be more easily performed.

In addition, an absolute value of the temperature coefficient of resonant frequency TCF can be reduced by laminating the dielectric film 3 on the piezoelectric thin film 4. That point will be described below with reference to FIG. 69.

Figure 69:
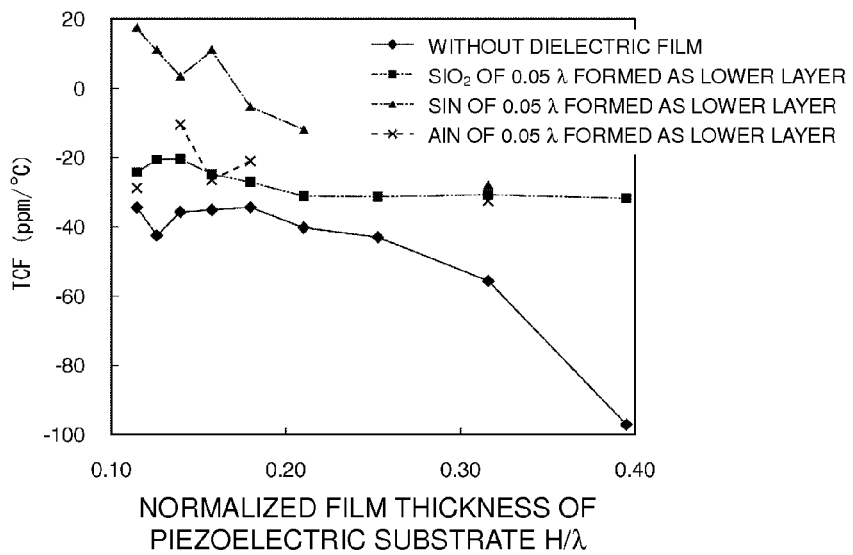
FIG. 69 is a graph depicting the relationship between a normalized film thickness of the piezoelectric thin film and a temperature coefficient of resonant frequency TCF in structures in which dielectric films made of various materials are optionally laminated on the piezoelectric thin film and in a structure in which any dielectric film is not laminated.

FIG. 69 is a graph depicting the relationship between a normalized film thickness of the piezoelectric thin film 4 and the temperature coefficient of resonant frequency TCF in each of various elastic wave devices constructed according to various preferred embodiments of the present invention.

The piezoelectric thin film 4 used here is a $LiTaO_3$ thin film having Euler angles (0°, 33°, 0°). The IDT electrode 5 is preferably provided by successively forming a Ti film with a thickness of 20 about nm and an Al film with a thickness of about 200 nm. A wavelength λ of a propagating elastic wave is about 3.5 μm. The dielectric film 3 has a film thickness of about 175 nm. The Ti film acts to make the Al film closely contacted with $LiTaO_3$.

The elastic wave devices were fabricated while the normalized film thickness of the piezoelectric thin film 4 made of $LiTaO_3$ was set to various values, and the temperature coefficient of resonant frequency TCF was measured for each of the elastic wave devices. Prepared samples were as follows.

EXAMPLE 1

An elastic wave device was constructed in a similar structure to that in the first preferred embodiment.

EXAMPLE 2

An elastic wave device was fabricated as in the third preferred embodiment, illustrated in FIG. 3A, except that it includes a $SiO_2$ film having a thickness of about 0.05λ as the dielectric film 3.

EXAMPLE 3

An elastic wave device was fabricated as in the third preferred embodiment, illustrated in FIG. 3A, except that it includes a SiN film having a thickness of about 0.05λ as the dielectric film 3.

EXAMPLE 4

An elastic wave device was fabricated as in the third preferred embodiment, illustrated in FIG. 3A, except that it includes an AlN film having a thickness of about 0.05λ as the dielectric film 3.

As seen from FIG. 69, when the normalized film thickness of the piezoelectric thin film 4 exceeds about 0.30, the absolute value of TCF is increased to about 60 ppm/° C. or more in EXAMPLE 1 in which the dielectric film 3 is not provided. In contrast, in EXAMPLES 2 to 4 in each of which the dielectric film 3 is provided, the absolute value of TCF can be itself reduced over a wide range of the film thickness of the piezoelectric thin film 4. It is also seen that, even when the film thickness of the piezoelectric thin film 4 is increased, the absolute value of TCF can be held small, i.e., at about 32 ppm/° C. or less.

The elastic wave device was fabricated in accordance with the second preferred embodiment illustrated in FIG. 2, and the temperature coefficient of resonant frequency TCF was measured. A $LiTaO_3$ thin film having Euler angles (0°, 33°, 0°) and a thickness of about 0.18λ was used as the piezoelectric thin film 4. The wavelength λ of the propagating elastic wave was about 3.5 μm. The IDT electrode 5 was obtained by successively forming a Ti film having a thickness of about 20 nm, a Pt film having a thickness of about 35 nm, and an Al film having a thickness of about 35 nm. Furthermore, the elastic wave device was fabricated in not only a structure where the dielectric film 3 was defined on the IDT, but also a structure where the dielectric film 3 was not defined on the IDT. In the structure where the dielectric film 3 was provided, the dielectric film 3 was made of $SiO_2$, and its film thickness was set to about 105 nm. TCF in the structure where the dielectric film 3 was not provided was about −8.6 [ppm/° C.], and TCF in the structure where the dielectric film 3 was provided was about −1.4 [ppm/° C.]. Thus, it is understood that the absolute value of TCF can be also reduced when the dielectric film 3 was provided on the IDT.

The primary temperature coefficient $(1/x)(\delta x/\delta T)$ of the elastic constant Cij of $LiTaO_3$ is a negative value. In contrast, the primary temperature coefficient of the elastic constant of $SiO_2$ is a positive value. Accordingly, as a result of laminating $SiO_2$, the positive and negative values of the primary temperature coefficient of the elastic constant cancel each other, whereby the absolute value of TCF can be reduced. In addition, the coefficient of linear expansion of a dielectric, such as $SiO_2$, SiN or AlN, was smaller than that of $LiTaO_3$. Moreover, the film thickness of the piezoelectric thin film 4 made of $LiTaO_3$ is very small. It is hence deemed that an actual coefficient of linear expansion in the propagation direction of the elastic wave is greatly affected by the coefficient of linear expansion of the dielectric film 3 and decreases. Thus, it is also deemed that, for the reason described above, the absolute value of TCF is further reduced when providing the dielectric film 3.

Additionally, the coefficient of linear expansion of $LiTaO_3$ is about 16 ppm/° C. The coefficient of linear expansion of $SiO_2$ is about 0.6 ppm/° C. The coefficient of linear expansion of SiN is about 3 ppm/° C. The coefficient of linear expansion of AlN is about 4 ppm/° C. to about 5 ppm/° C.

In the elastic wave device 31 of FIG. 3A, the dielectric film 3 is arranged on the lower surface of the piezoelectric thin film 4, and the IDT electrode 5 is arranged on the upper surface thereof. In such a structure, it is desired that the dielectric film 3 is preferably arranged to apply tensile stress to the piezoelectric thin film 4 made of $LiTaO_3$. This gives the piezoelectric thin film 4 with a convex shape on the upper surface side where the IDT electrode 5 is projected. Such a convex shape can reduce a risk that a portion of the piezoelectric thin film 4, which is positioned above the recess 2a and through which the plate wave propagates, may contact with the support layer 2a under the recess 2a or other portions, e.g., an adhesive layer. Accordingly, the plate wave stably propagates. If a laminated film defined by the dielectric film 3 and the piezoelectric thin film 4 is concave on the side including the IDT electrode 5, the portion through which the plate wave propagates may contact with a portion of the support layer 2 under the recess 2a or the adhesive layer (not illustrated). Also, there is a risk that the portion through which the plate wave propagates and which is in a state floating in the air may contact with the support layer 2 due to an electrostatic force.

The term "tensile stress" corresponds to stress caused by the dielectric film 3 which acts on an interface between the piezoelectric thin film 4 made of $LiTaO_3$ and the dielectric film 3 to compress the piezoelectric thin film 4 made of $LiTaO_3$.

In particular, when the dielectric film 3 is made of AlN, the stress acting on $LiTaO_3$ from the dielectric film 3 can be easily adjusted over a wide range from compressive stress to tensile stress by controlling pressure applied during the film formation. Therefore, an AlN film is preferably used as the dielectric film 3.

$LiTaO_3$ has pyroelectricity because it is a ferroelectric substance. Accordingly, there is a risk that pyroelectric charges may occur on the surface of the piezoelectric thin film 4 upon change in temperature or pressure. Hence the piezoelectric thin film 4 is desirably provided with a certain level of conductivity such that the IDT electrode 5 is not destroyed by the pyroelectric charges. When insulation resistance R between the paired IDT electrode is about 1 MΩ or less, the pyroelectric charges on the piezoelectric thin film 4 are effectively neutralized such that destruction of the IDT electrode 5 can be significantly reduced or prevented.

On the other hand, if the insulation resistance of the IDT electrode is smaller than about 50 times terminal impedance of an electric circuit to which the elastic wave device 1 is connected, vibration energy is more apt to leak through the piezoelectric thin film 4 made of $LiTaO_3$. Accordingly, the insulation resistance is preferably equal to or larger than about 50 times the terminal impedance.

Furthermore, the thickness of the piezoelectric thin film 4 made of $LiTaO_3$ is not limited to particular one. However, if the thickness of the piezoelectric thin film 4 is about 50 nm or less, the strength of a hollow structure is weakened, thus causing a problem in reliability in practical use. Accordingly, the thickness of the piezoelectric thin film 4 made of $LiTaO_3$ is preferably about 50 nm or more, for example. An upper limit of the thickness of the piezoelectric thin film 4 is preferably about 0.3λ or less in order to sufficiently increase the acoustic velocity of the secondary mode of the plate wave, which contains the U1 component as a main component of displacement.

Figure 71:
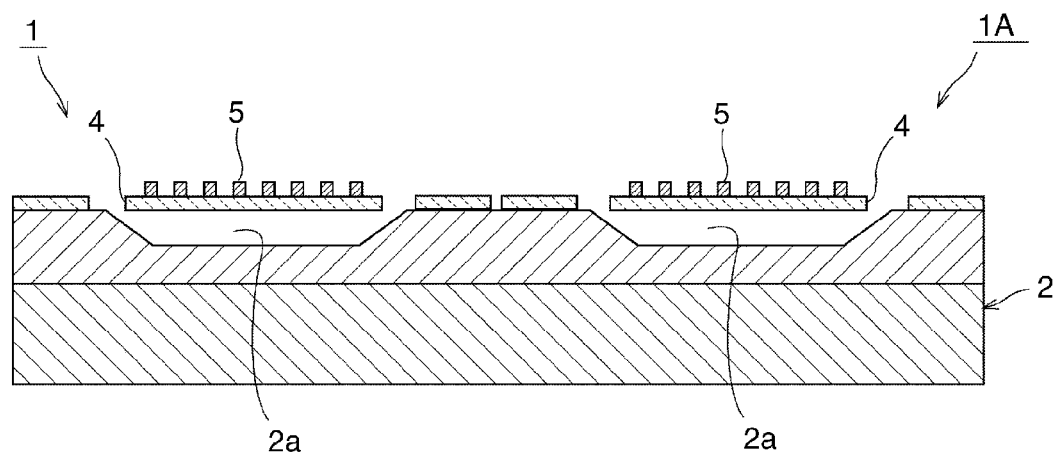

In the elastic wave device 1 of the first preferred embodiment, one elastic wave resonator is preferably provided such that the piezoelectric thin film 4 and the IDT electrode 5 are disposed above the recess 2a, and that reflectors are disposed on the right and left sides of the IDT electrode 5. In preferred embodiments of the present invention, a plurality of elastic wave devices 1 and 1A may be combined with each other as illustrated in FIG. 71. In particular, it is preferable to arrange a plurality of recesses 2a in the support layer 2 and to define an elastic wave element, e.g., an elastic wave resonator, at a position where each of the recesses 2a is arranged, as in the preferred embodiment. In such a case, piezoelectric thin films 4 having the same cut angle are desirably used as the piezoelectric thin films 4 in the plural elastic wave devices. This enables a manufacturing process to be simplified.

The plural elastic wave elements may be provided as a plurality of elastic wave resonators as in the preferred embodiment. Alternatively, one filter may be defined by combining a plurality of elastic wave elements, e.g., resonator type filters. Moreover, a duplexer, etc. may be defined by combining the above-described elastic wave element with one or more other elements.

A ladder filter and a lattice filter are examples of the above-mentioned filter that is defined by combining a plurality of elastic resonators.

A propagation azimuth ψ in the elastic wave device 1, illustrated in FIG. 71, may be set different from a propagation azimuth ψ in the elastic wave device 1A. Because the plate wave is a non-leakage propagation mode, it preferably does not attenuate even when both the propagation azimuths ψ are set different from each other. Accordingly, Q of the elastic wave resonator does not deteriorate.

When three or more elastic wave elements are combined with each other, the propagation azimuth in at least one of those elastic wave elements may be different from the propagation azimuth in at least one of the remaining elastic wave devices.

In addition, the electromechanical coupling coefficient $k^2$ can be made different by including plural piezoelectric thin films 4 having the same cut angle and changing the propagation azimuth ψ among the piezoelectric thin films 4.

Thus, when providing a plurality of elastic wave elements, the electromechanical coupling coefficient $k^2$ can be easily set to an optimum value in each of the elastic wave elements. As a result, the degree of freedom in design of a filter, etc. can be greatly increased.

A non-limiting example of a manufacturing method of the elastic wave device according to a preferred embodiment of the present invention will be described below with reference to FIGS. 70A-70I.

FIGS. 70A to 70I are each schematic elevational cross-sectional views illustrating one example of a manufacturing method for another elastic wave device according to the first preferred embodiment.

Figure 70:
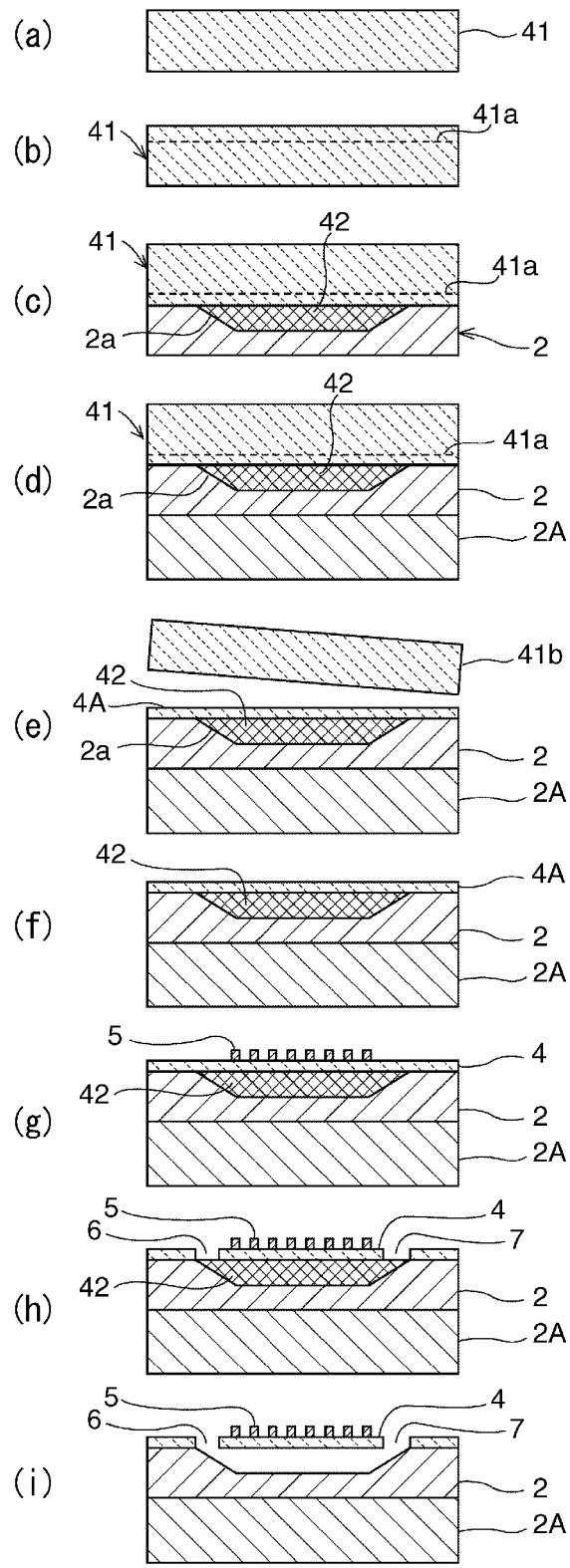
FIGS. 70A to 70I are each a schematic cross-sectional view explaining a manufacturing method for the elastic wave device according to a preferred embodiment of the present invention.

As illustrated in FIG. 70A, a $LiTaO_3$ wafer 41 is prepared. $H^+$ ions accelerated at about 100 keV were then injected at a concentration of about $8 \times 10^{16}$ at/cm$^2$ to an upper surface of the $LiTaO_3$ wafer 41. With the injection of the hydrogen ions, the hydrogen ion concentration is distributed in the direction of thickness of the $LiTaO_3$ wafer 41. A portion having the highest hydrogen ion concentration is denoted as a hydrogen ion high-concentration injected portion 41a by a dotted line. The hydrogen ion high-concentration injected portion 41a is formed at a certain depth from the upper surface of the $LiTaO_3$ wafer 41. The depth of the hydrogen ion high-concentration injected portion 41a is set to a position slightly deeper than that corresponding to the thickness of the piezoelectric thin film 4 that is to be finally formed.

As described later, the $LiTaO_3$ wafer 41 is separated at the hydrogen ion high-concentration injected portion 41a into a piezoelectric thin film 4A and a remaining $LiTaO_3$ wafer portion 41b by heating. At least a portion of the $LiTaO_3$ wafer 41 spanning from the hydrogen ion high-concentration injected portion 41a to the wafer surface into which the hydrogen ions have been injected is used as the piezoelectric thin film. By performing an experiment of such a separation in advance, therefore, the depth of the hydrogen ion high-concentration injected portion 41a can be controlled depending on the thickness of the piezoelectric thin film 4 that is to be finally formed. As an alternative, the position of the hydrogen ion high-concentration injected portion 41a may be confirmed by measuring the hydrogen ion concentration inside the $LiTaO_3$ wafer 41 after the injection of the hydrogen ions.

The depth of the hydrogen ion high-concentration injected portion 41a is preferably set to a position slightly deeper than that corresponding to the thickness of the piezoelectric thin film 4 that is to be finally formed. From that point of view, in the present preferred embodiment, the depth of the hydrogen ion high-concentration injected portion 41a is set, as mentioned above, to a value slightly larger than that of the thickness of the piezoelectric thin film 4. In such a case, a machining step of reducing the thickness of the LiTaO$_3$ wafer from the side including the hydrogen ion high-concentration injected portion 41a is preferably carried out after a piezoelectricity restoring step. As a result, the piezoelectric thin film 4 having good and uniform piezoelectricity can be obtained.

Next, as illustrated in FIG. 70C, a Cu film is formed as a sacrificial layer 42 in a thickness of about 2 μm by vapor deposition on the surface of the LiTaO$_3$ wafer on the side including the piezoelectric thin film 4A. The sacrificial layer 42 can be formed using an appropriate material that can be made to disappear by etching, for example. After forming the sacrificial layer 42, SiO$_2$ is formed as the support layer 2 in a thickness of about 5 μm preferably by sputtering, for example.

Next, as illustrated in FIG. 70D, a LiTaO$_3$ wafer having the same Euler angles as those of the piezoelectric thin film is joined as a support wafer 2A to a lower surface of the support layer 2. The support wafer 2A is not limited to the LiTaO$_3$ wafer, and it may alternatively be, e.g., a dielectric ceramic wafer or a high-resistance Si wafer. Alternatively, the support wafer 2A may not be formed at all. Thereafter, as illustrated in FIG. 70E, the piezoelectric thin film 4A and the remaining portion 41b of the LiTaO$_3$ wafer 41 are separated from each other under heating at about 500° C. with the hydrogen ion high-concentration injected portion 41a being a boundary. The heating facilitates the separation at the hydrogen ion high-concentration injected portion 41a. Such a technique is disclosed in, e.g., Japanese Unexamined Patent Application Publication No. 2010-109949. With the above-described separation, as illustrated in FIG. 70F, the piezoelectric thin film 4A being thin and having desired Euler angles can be sliced from the wafer and can be formed in a uniform thickness on the support layer 2.

Thereafter, a surface of the separated piezoelectric thin film 4A is polished by about 0.1 μm and further heated to restore piezoelectricity. As a result, the final piezoelectric thin film 4 is obtained. Then, as illustrated in FIG. 70G, an IDT electrode 5 is defined on the piezoelectric thin film 4. Moreover, as illustrated in FIG. 70H, the piezoelectric thin film 4A is patterned to form openings 6 and 7 where the sacrificial layer 42 is partly exposed. Then, as illustrated in FIG. 70I, the sacrificial layer 42 is caused to disappear by etching through the openings. In such a manner, an elastic wave device similar to that according to the first preferred embodiment can be obtained. Furthermore, an elastic wave device similar to that according to the third preferred embodiment, illustrated in FIG. 3A, in which the dielectric film is disposed on the lower surface of the piezoelectric film, can be obtained by, for example, in the above-described manufacturing method, forming the dielectric film 3 on the surface of the piezoelectric thin film 4A after the ion injection, forming a sacrificial layer, and then performing a similar process to that described above.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a support layer including a through-hole or a recess opened at an upper surface thereof;
   a piezoelectric thin film arranged on the support layer to extend above the recess or the through-hole of the support layer; and
   an IDT electrode provided on at least one of upper and lower surfaces of the piezoelectric thin film in a region of the piezoelectric thin film that extends above the recess or the through-hole; wherein
   an elastic wave propagating in the piezoelectric thin film is a secondary mode of a plate wave that contains a U1 component as a main component of displacement;
   a propagation velocity of the secondary mode of the plate wave is about 7000 meters per second or more;
   the piezoelectric thin film is made of LiTaO$_3$; and
   Euler angles (φ, θ, ψ) of the LiTaO$_3$ fall within any of ranges represented by regions R1 to R7 surrounded by solid lines in FIGS. 4 to 10.

2. The elastic wave device according to claim 1, wherein the IDT electrode is made of Al or an alloy containing Al as a main component;
   a film thickness of the IDT electrode is H; and
   H≤about 0.08λ, where λ is a wavelength of the secondary mode of the plate wave, which contains mainly the U1 component.

3. The elastic wave device according to claim 1, further comprising a dielectric film laminated on at least one of the upper and lower surfaces of the piezoelectric thin film, wherein a coefficient of linear expansion of the dielectric film is smaller than a coefficient of linear expansion of LiTaO$_3$.

4. The elastic wave device according to claim 3, wherein the dielectric film is made of silicon oxide.

5. The elastic wave device according to claim 3, wherein the IDT electrode is provided on the upper surface of the piezoelectric thin film, the dielectric film is provided on the lower surface of the piezoelectric thin film, and the dielectric film is made of a dielectric material arranged to apply stress in a tensile direction to the piezoelectric thin film.

6. The elastic wave device according to claim 1, wherein electrical resistance between a pair of the IDT electrodes is equal to or more than about 50 times a terminal impedance of an electric circuit to which the elastic wave device is connected, and equal to or less than about 1 MΩ.

7. The elastic wave device according to claim 1, wherein a thickness of the piezoelectric thin film is in a range of equal to or more than about 50 nm and equal to or less than about 0.3λ, where λ a wavelength of the secondary mode of the plate wave, which contains mainly the U1 component.

8. An elastic wave device including a plurality of elastic wave devices according to claim 1.

9. The elastic wave device according to claim 8, wherein each of the plurality of elastic wave devices further comprises a dielectric film laminated on at least one of the upper and lower surfaces of the piezoelectric thin film, a coefficient of linear expansion of the dielectric film is smaller than a coefficient of linear expansion of LiTaO$_3$.

10. A manufacturing method for the elastic wave device according to claim 1, the method comprising the steps of:
    injecting ions into a LiTaO$_3$ substrate from a surface thereof, thus forming an ion-injected portion on one surface side of the LiTaO$_3$ substrate;
    forming a sacrificial layer in a portion of the surface of the LiTaO$_3$ substrate on the ion-injected side;

forming, as a support layer, an insulator to cover the surface of the LiTaO$_3$ substrate on the ion-injected side and the sacrificial layer;

separating the LiTaO$_3$ substrate at the ion-injected portion by heating, thus forming a structure of a piezoelectric thin film separated from the LiTaO$_3$ substrate;

causing the sacrificial layer to disappear, thus forming a recess in the support layer at a position under the piezoelectric thin film; and forming an IDT electrode on at least one of upper and lower surfaces of the piezoelectric thin film.

11. An elastic wave device comprising:
a support layer including a through-hole or a recess opened at an upper surface thereof;
a piezoelectric thin film arranged on the support layer to extend above the recess or the through-hole of the support layer; and
an IDT electrode provided on at least one of upper and lower surfaces of the piezoelectric thin film in a region of the piezoelectric thin film that extends above the recess or the through-hole; wherein
a secondary mode of a plate wave, which contains a U1 component as a main component of displacement, is utilized, the piezoelectric thin film is made of LiTaO$_3$, and Euler angles (φ, θ, ψ) of the LiTaO$_3$ fall within specific ranges, where φ is in a range of about 0° to about 30° and θ is in a range of about 0° to about 55° or a range of about 140° to about 180°;
when θ is in a range of about 0° to about 55°, ψ is in a range of about 180° to about 110°, a range of about 100° to about 50°, or a range of about 40° to about 0°;
when θ is in a range of about 140° to about 180°, ψ is in a range of about 180° to about 20° or a range of about 10° to about 0°; and
a propagation velocity of the secondary mode of the plate wave is about 7000 meters per second or more.

12. The elastic wave device according to claim 11, wherein
φ is in a range of about 0° to about 2.5° and θ is in a range of about 0° to about 55° or a range of about 150° to about 180°;
when θ is in a range of about 0° to about 55°, ψ is in a range of about 180° to about 140°, a range of about 100° to about 80°, or a range of about 40° to about 0°; and
when θ is in a range of about 150° to about 180°, ψ is in a range of about 160° to about 65° or a range of about 50° to about 20°.

13. The elastic wave device according to claim 11, wherein φ is in a range of about 2.5° to about 7.5° and θ is in a range of about 0° to about 55° or a range of about 150° to about 180°;
when θ is in a range of about 0° to about 55°, ψ is in a range of about 180° to about 135°, a range of about 95° to about 75°, or a range of about 35° to about 0°; and
when θ is in a range of about 150° to about 180°, ψ is in a range of about 165° to about 70° or a range of about 50° to about 25°.

14. The elastic wave device according to claim 11, wherein

φ is in a range of about 7.5° to about 12.5° and θ is in a range of about 0° to about 50° or a range of about 150° to about 180°;
when θ is in a range of about 0° to about 50°, ψ is in a range of about 180° to about 130°, a range of about 90° to about 70°, or a range of about 30° to about 0°; and
when θ is in a range of about 150° to about 180°, ψ is in a range of about 170° to about 80° or a range of about 55° to about 30°.

15. The elastic wave device according to claim 11, wherein φ is in a range of about 12.5° to about 17.5° and θ is in a range of about 0° to about 50° or a range of about 150° to about 180°;
when θ is in a range of about 0° to about 50°, ψ is in a range of about 180° to about 125°, a range of about 85° to about 65°, or a range of about 25° to about 0°; and
when θ is in a range of about 150° to about 180°, ψ is in a range of about 175° to about 85°, or a range of about 60° to about 35°.

16. The elastic wave device according to claim 11, wherein
φ is in a range of about 17.5° to about 22.5° and θ is in a range of about 0° to about 50° or a range of about 145° to about 180°;
when θ is in a range of about 0° to about 50°, ψ is in a range of about 180° to about 120°, a range of about 80° to about 60°, or a range of about 20° to about 0°; and
when θ is in a range of about 150° to about 180°, if Is in a range of about 180° to about 95°, a range of about 60° to about 40°, or about 0°.

17. The elastic wave device according to claim 11, wherein
φ is in a range of about 22.5° to about 27.5° and θ is in a range of about 0° to about 45° or a range of about 145° to about 180°;
when θ is in a range of about 0° to about 45°, ψ is in a range of about 180° to about 115°, a range of about 75° to about 55°, or a range of about 15° to about 0°; and
when θ is in a range of about 145° to about 180°, ψ is in a range of about 180° to about 105°, a range of about 65° to about 45°, or a range of about 5° to about 0°.

18. The elastic wave device according to claim 11, wherein
φ is in a range of about 27.5° to about 30° and θ is in a range of about 0° to about 40° or a range of about 140° to about 180°;
when θ is in a range of about 0° to about 40°, ψ is in a range of about 175° to about 110°, a range of about 70° to about 50°, or a range of about 10° to about 5°; and
when θ is in a range of about 140° to about 180°, ψ is in a range of about 175° to about 110°, a range of about 70° to about 50°, or a range of about 10° to about 5°.

19. The elastic wave device according to claim 17, wherein the IDT electrode of each of the plurality of elastic wave devices is provided on the upper surface of the piezoelectric thin film, the dielectric film is provided on the lower surface of the piezoelectric thin film, and the dielectric film is made of a dielectric material arranged to apply stress in a tensile direction to the piezoelectric thin film.

* * * * *